(12) United States Patent
Kono et al.

(10) Patent No.: US 6,247,889 B1
(45) Date of Patent: Jun. 19, 2001

(54) MULTIPLE-SHAFT POWER TRANSMISSION APPARATUS AND WAFER TRANSPORT ARM LINK

(75) Inventors: Hiroko Kono; Hiromi Kumagai, both of Tokyo (JP)

(73) Assignee: BKS Lab. Ltd., Tokyo (JP)

( * ) Notice: Subject to any disclaimer, the term of this patent is extended or adjusted under 35 U.S.C. 154(b) by 0 days.

(21) Appl. No.: 09/325,552

(22) Filed: Jun. 4, 1999

(30) Foreign Application Priority Data

Jul. 31, 1998 (JP) .................................................. 10-217135
May 18, 1999 (JP) .................................................. 11-136960

(51) Int. Cl.[7] .................................................. B25J 18/04
(52) U.S. Cl. ..................................... 414/744.5; 414/744.7
(58) Field of Search ........................ 414/744.1, 744.2, 414/744.3, 744.5, 744.6, 744.7, 744.4

(56) References Cited

U.S. PATENT DOCUMENTS

| | | | |
|---|---|---|---|
| 5,397,212 | * | 3/1995 | Watanabe et al. ................. 414/744.6 |
| 5,583,408 | * | 12/1996 | Lowrance ........................... 414/744.2 |
| 5,759,006 | * | 6/1998 | Miyamoto et al. ............... 414/937 X |
| 5,813,823 | * | 9/1998 | Hofmeister ........................ 414/744.5 |
| 5,899,658 | * | 5/1999 | Hofmeister ........................ 414/744.5 |

FOREIGN PATENT DOCUMENTS

| | | |
|---|---|---|
| 60-116960 | 6/1985 | (JP) . |
| 61-69365 | 4/1986 | (JP) . |
| 3-136779 | 6/1991 | (JP) . |
| 4-152078 | 5/1992 | (JP) . |
| 4-279043 | 10/1992 | (JP) . |
| 10-000581 | 1/1995 | (JP) . |
| 7-504128 | 5/1995 | (JP) . |
| 7-507010 | 8/1995 | (JP) . |
| 7-245333 | 9/1995 | (JP) . |
| 8-506771 | 7/1996 | (JP) . |
| 9-213512 | 8/1997 | (JP) . |

* cited by examiner

Primary Examiner—Gregory A. Morse
(74) Attorney, Agent, or Firm—Connolly Bove Lodge & Hutz LLP

(57) ABSTRACT

The apparatus comprising a partition, a plurality of inner magnetic rings, and a plurality of outer magnetic rings is disclosed. The outer magnetic rings are magnetically coupled to the inner magnetic rings via the partition. The inner magnetic rings comprises a plurality of magnets disposed around a first yoke member. The outer magnetic rings comprise a plurality of magnets disposed around a second yoke member. One or both of the first and second yoke members can be disassembled.

3 Claims, 23 Drawing Sheets

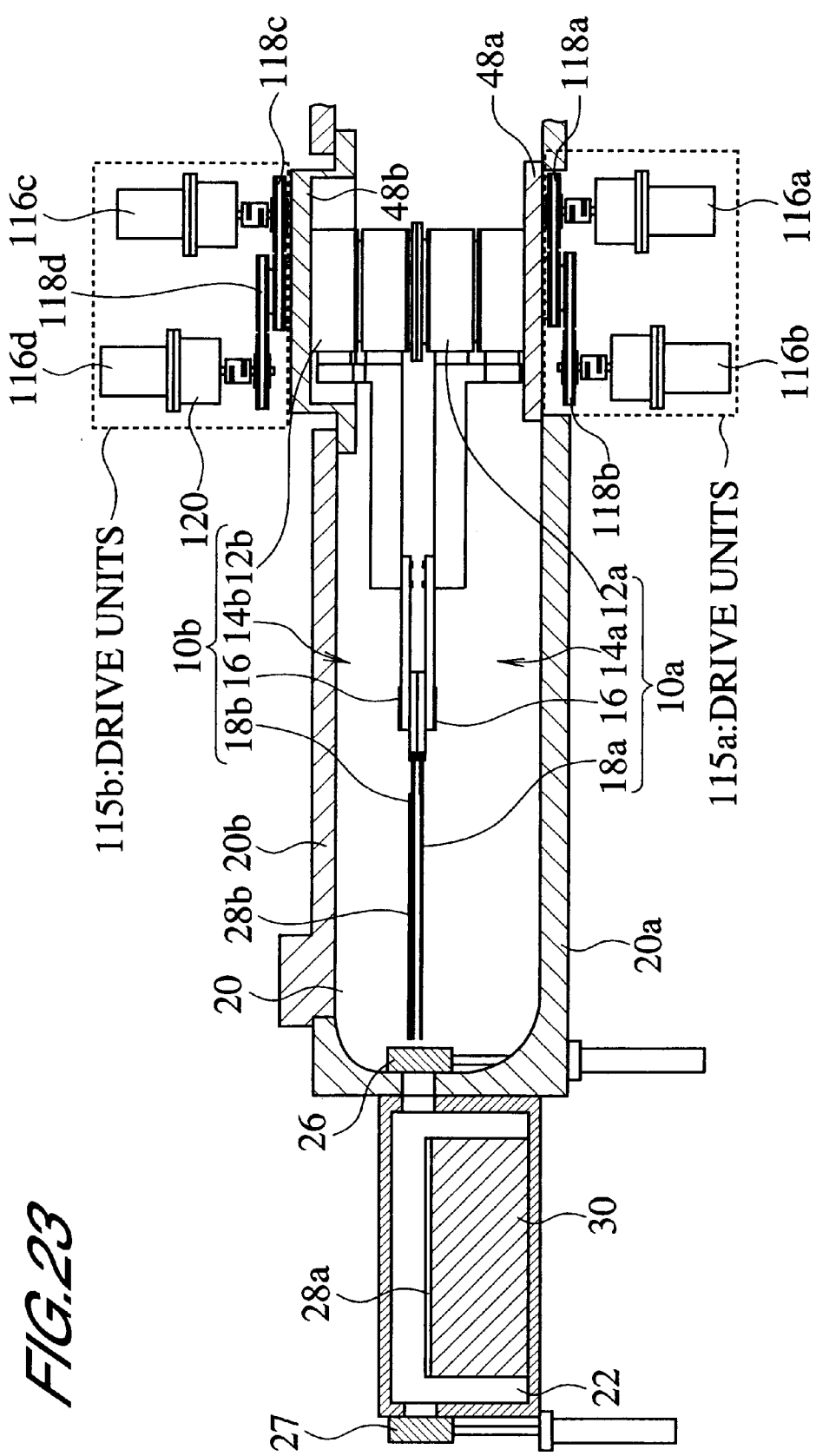

MULTIPLE-SHAFT POWER TRANSMISSION APPARATUS AND WAFER TRANSPORT ARM LINK

BACKGROUND OF THE INVENTION

1. Field of the Invention

The present invention relates to a multiple-shaft power transmission apparatus and a wafer transport arm link used in a processing apparatus for the manufacture of integrated circuits.

2. Description of Related Art

A wafer transport arm link is used to transport a wafer or other object to be processed between a process chamber and a transport chamber in a vacuum, a reduced pressure atmosphere, the air, or a corrosive gas.

The frogleg type of robot arm disclosed in Publication 1 (Japanese Unexamined Patent Publication No. 4-152078) was used at the initial stage of this technology. Also, a magnetic fluid has become the most common choice for a vacuum sealed shaft. Wafer transport arm links of this type are disclosed, for example, in Publication 2 (Japanese Unexamined Patent Publication No. 4-279043), Publication 3 (PC (WO) 7-504128), and Publication 4 (Japanese Unexamined Patent Publication No. 10-581).

Also, Publication 5 (PC (WO) 7-507010) discloses an example of a parallel link type of arm link that is different from the frogleg type. This link has a higher rigidity because it consists of four shafts and four arms.

One problem with the above-mentioned configuration lies in the constitution whereby the vacuum sealing force is generated from the viscous force and frictional force of a so-called magnetic fluid induced by magnetic force. With this constitution, a frictional force or viscous force proportional to the shaft rotation speed is generated as resistance during the operation of the robot arm. The drive force must therefore be large enough to overcome this resistance. Also, high-precision rotating shafts with a coaxial construction and polyaxial construction are required for the robot arm to perform rotational movement and extension and retraction movement. Thus, these rotating shafts are inevitably large, heavy, and complicated.

Furthermore, with a vacuum sealed shaft that makes use of a magnetic fluid, there is the danger that bubbles inside the magnetic fluid will expand and burst as the arm chamber is exhausted from atmospheric pressure to a vacuum, causing the magnetic fluid to scatter as microparticles and foul the vacuum chamber. This does not only lead to lower production yield for integrated circuits due to particle generation; because this magnetic fluid has a high iron content, it also causes heavy metal contamination of the integrated circuit.

As an alternative to this method, Publication 6 (Japanese Unexamined Patent Publication No. 3-136779) discloses an example of an arm shaft that makes use of a magnetic coupler disposed via a partition. The problems with the above-mentioned magnetic fluid type are solved with this approach, but because a powerful magnet is required to strengthen the coupling of the magnetic coupler, the robot ends up being large and heavy. When an arm shaft such as this is accelerated or decelerated, the movement of the arm is accompanied by vibration. This vibration is one of the factors that lead to dust generation during processing, shifting of the installation position, decreased throughput, and so on. Publication 6 discloses a constitution whereby vibration is prevented by generating an induced current at the partition. However, rather than trying to suppress the vibration of the arm, it would probably be more effective to design an arm that did not vibrate in the first place.

Publication 7 (Japanese Unexamined Patent Publication No. 7-245333) discloses a way to strengthen magnetic coupling. Publication 7 proposes that the magnetic binding force be increased by moving the permanent magnets that constitute the magnetic coupler as close together as possible. With this constitution, however, imparting the required positional precision to the arm link results in excessive stress being concentrated in the arm shafts. Also, since large-diameter wafers will be introduced in the near future as a means for lowering production costs, the arm transport distance will be even greater. This means that higher rigidity will be required of arm shafts.

In addition, arm shaft structures that utilize magnetic couplers are also disclosed in Publication 8 (Japanese Unexamined Patent Publication No. 61-69365) and Publication 9 (Japanese Unexamined Patent Publication No. 60-116960). Nevertheless, the above-mentioned problems are not solved by the structures disclosed in these publications.

Meanwhile, increasing the drive speed of a robot arm and thereby reducing the time it takes for wafer transport is important in terms of lowering unit production costs. However, the higher the drive speed is, the more particles are generated, the reason for which is discussed below.

The primary cause of this lies in the attitude control mechanism of the wafer tray. In the past, an attitude control mechanism that made use of a belt or a pulley was provided at the distal end of the arm link in order to keep the transport direction of the wafer tray the same as the extension and retraction direction of the arm. When this attitude control mechanism is provided, the number of arm shafts has to be increased from four to five. This increase in the number of arm shafts makes the arm more prone to vibration.

Also, a belt or pulley cannot transmit power without friction. Particles tend to be generated in a vacuum or a reduced pressure environment, and these particles are generated in large quantity every time the belt or pulley is operated. Various measures have been taken in the past to prevent this generation of dust, but these all result in a more complicated arm structure and decrease the rigidity of the arm.

Furthermore, as part of an effort to improve the productivity of semiconductor integration elements, there has been a need in recent years for two independently moving arm links to be used closer together in order to achieve an increase in the number of wafers processed per unit of time (throughput). When two robots are thus used close together, however, there is a new problem in that the particles generated from each arm adhere to the wafers of the other arm.

As a result of recent advances in the integration of semiconductor integrated circuits, the smallest line width of a circuit pattern is now approaching 0.15 micron. Accordingly, the diameter and number of particles generated in the manufacture and processing of integrated circuits now need to be reduced to class 20 or less, which is approximately one-fifth or less of the smallest line width. This increasing miniaturization is demanding that an extremely clean environment, in the broad sense, is required throughout the processing procedure. In terms of reduced pressure processing, this means that not only is the above-mentioned reduction in dust generation required, but a higher vacuum density and a lower out-gas environment must also be achieved.

Also, there is an increasing need for the diameter of wafers to be increased as part of the ongoing effort to reduce costs in the manufacturing process, as mentioned above. Accordingly, load-lock chambers, arm chambers, and various processing chambers will become larger, and the transport range of the robot arm will also become larger. Meanwhile, there is also a need to raise the error precision of the wafer placement position in order to increase the effective number of semiconductor elements that can be achieved with a single wafer. Therefore, an extremely high level of rigidity must be ensured for the arm shafts of a robot.

As described above, particles can greatly affect the production yield of integrated circuits in a semiconductor integrated circuit production process. Consequently, the reduction of particles is an important goal. Meanwhile, a robot arm capable of higher throughput is an equally important goal from the standpoint of making a massproduction plant more economical.

SUMMARY OF THE INVENTION

In view of this, an object of the present invention is to provide a multiple-shaft power transmission apparatus and wafer transport arm link which generate few particles, result in little out gas, are very airtight, have high positional precision, have a simple construction that affords easy maintenance, and allow a high throughput to be attained.

In order to achieve this object, the multiple-shaft power transmission apparatus of the present invention has the following unique constitution. Specifically, the multiple-shaft power transmission apparatus of the present invention comprises a partition that delineates a space with a different environment from an atmospheric environment, a plurality of inner magnetic rings disposed within the atmospheric environment, and a plurality of outer magnetic rings disposed within the space delineated by the partition and magnetically coupled to the inner magnetic rings via the partition. Also, with the present invention, the inner magnetic rings comprise a plurality of magnets disposed around the outer peripheral edge of a ring-shaped first yoke member such that the adjacent pole faces are mutually different. Also, with the present invention, the outer magnetic rings comprise a plurality of magnets disposed around the inner peripheral edge of a ring-shaped second yoke member such that the adjacent pole faces are mutually different. Furthermore, with the present invention, the outer magnetic rings are supported via bearings on the partition so as to be rotatable in relation to the partition. Furthermore, with the present invention, one or both of the first and second yoke members can be disassembled so that the magnets that make up the various magnetic rings are allotted to a plurality of groups.

Thus, all of the rotating shafts that make up the multiple-shaft power transmission apparatus of the present invention are incorporated into a partition machined to high precision. Therefore, the outer magnetic rings are supported using the partition as a fixed shaft so that they are rotatable in a state of being mutually parallel to high precision.

In general, obtaining a high-precision arm link requires that the rigidity of the arm shaft (the base shaft of the arm link) be as high as possible. Furthermore, unlike with other industrial robots, a robot used for a semiconductor manufacturing apparatus has to be kept extremely clean at all times. Frequent maintenance is therefore necessary, and disassembly and reassembly must be carried out repeatedly.

In view of this, a multiple-shaft power transmission apparatus that makes use of a magnetic coupler constituted by an inner magnetic ring and an outer magnetic ring as described above is used to constitute an arm shaft from a plurality of shafts with a coaxial construction. The use of this arm shaft as a vacuum partition yields sufficient rigidity for the shaft diameter to be increased. The resulting arm shaft therefore has a high-precision and simple construction.

The vacuum partition must be made thinner in order to strengthen the magnetic coupling generated by the magnetic coupler, but this ends up diminishing the shaft rigidity. The rigidity of a shaft is generally proportional to the cube of the shaft diameter, so this problem is solved by slightly increasing the shaft diameter of the vacuum partition. Furthermore, if this vacuum partition is thin, there is the danger that internal pressure will cause the walls to bulge out like a Japanese drum. However, if the walls are made thinner as mentioned above, the distance between opposing magnets is shorter, and the coupling force between the magnets increases in proportion to the inverse of the square of the distance between the magnets. Therefore, sufficiently strong magnetic coupling will be obtained even if the magnets that make up the magnetic coupler are reduced in height, so the height of the vacuum partition can be lowered. Thus, sufficient rigidity is maintained, and deformation due to internal pressure can be prevented.

In this way the outer magnetic ring on the vacuum side and the inner magnetic ring on the atmospheric side to which the arm link is coupled can be incorporated into a single shaft. Thus, once assembled, the shaft can be treated as a single unit. Therefore, even when the arm shaft is taken out of and reattached to the processing apparatus during maintenance or the like, the positional reproducibility of the arm link is high, and there is no need for adjustment.

One means for preventing dust from being generated in an arm link is to use a magnetic coupler, as proposed in the above-mentioned Publication 6. A magnetic coupler transmits arm drive force through the partition separating the atmosphere from a vacuum space. With an arm link that makes use of a magnetic coupler, the arm shaft has to be made lighter and the distance between the opposing magnets that make up the magnetic coupler has to be shortened in order to achieve high-speed operation and high positional precision of the wafer placement position.

As discussed above, it is good for the inner magnetic ring and outer magnetic ring that make up the magnetic coupler to be as close together as possible with a partition interposed therebetween. With this structure, the magnetic coupling is stronger between the inner magnetic ring and the outer magnetic ring. Strengthening the magnetic coupling further requires that the second yoke member and the magnets that make up the outer magnetic ring, and the first yoke member and the magnets that make up the inner magnetic ring be in close contact with each other, with as little gap as possible in between. The various magnets are also attached to their respective yokes in a state in which the adjacent magnets are in close contact with one another. As a result, it is possible to reduce the magnetic circuit resistance between the magnets and the yoke and between adjacent magnets. The more this magnetic circuit resistance is reduced, the less leakage of magnetic force there is to the magnets on either side on the same yoke, and the stronger is the magnetic coupling force between the opposing magnets which is required for the transmission of rotational force.

Accordingly, as mentioned above, either or both of the first and second yoke members can be disassembled so that the magnets that make up the various magnetic rings are allotted to a plurality of groups. For instance, the second yoke member can be disassembled so that the magnets that make up the outer magnetic ring are allotted to three groups. Specifically, the second yoke member consists of a combination of three parts: a first yoke piece, second yoke piece, and third yoke piece.

With this structure, the outer magnetic ring is incorporated in a state in which the pole faces of the magnets are extremely close to the above-mentioned partition surface. The parts are assembled such that the ring diameter constituted by the disposition of the pole faces of the various magnets is smaller than the inside diameter of the bearing provided in order to incorporate the outer magnetic ring rotatably into the partition. In other words, they are assembled such that the pole faces of the various magnets are located to the inside (that is, to the rotational axis side) of the bearing. As a result, the distance between the pole faces of the magnets that make up the outer magnetic ring and the pole faces of the magnets that make up the inner magnetic ring is just a few millimeters or less. Therefore, there is less magnetic force leakage than in the past, and the magnetic coupling is stronger between the inner magnetic ring and the outer magnetic ring.

In the implementation of this invention, it is preferable for the difference between the number of magnets of the inner magnetic rings and the number of magnets of the outer magnetic rings to be two.

In the implementation of this invention, it is preferable for the inner magnetic ring to be supported by the partition via a bearing such that it is rotatable in relation to the rotational axis of the outer magnetic ring.

Because of this structure, when the inner magnetic ring is rotationally moved by a drive source, the outer magnetic ring will also rotate in response to this rotational motion as a result of magnetic coupling. Thus, rotational force can be transmitted from the atmospheric side to the vacuum side.

In the implementation of this invention, it is preferable for the magnets that make up the inner magnetic ring to be electromagnets.

With this structure, when the magnetic force generated by the electromagnets is controlled as described in Publication 10 (PC (WO) 8-506771), rotational force is imparted to the outer magnetic ring.

Also, in the implementation of this invention, it is preferable for a magnetic material to be used for the first and second yoke members.

In a preferred embodiment of this invention, the centers of the pole faces of the magnets attached to the second yoke member, which are opposite the magnets attached to the first yoke member, are made concave.

Thus, the centers of the inner pole faces of the magnets disposed around the inner peripheral edge of the second yoke member are made slightly concave. This results in the magnetic force lines being reduced in the centers of these pole faces and being concentrated in the vicinity of the ends around the centers, which yields stronger coupling.

In another preferred embodiment of this invention, the surfaces of said magnets are coated with nickel.

Corrosion resistance is improved when the magnet surfaces are coated with nickel as disclosed in Publication 11 (Japanese Unexamined Patent Publication No. 9-213512). Therefore, with the above-mentioned structure, magnetic materials that need to be treated to prevent corrosion by out gas or process gas (such as iron, ferrite, samarium cobalt, and boron-neodymium magnets) can be used as the magnets.

In yet another preferred embodiment of this invention, the total number of magnets that make up the inner magnetic rings or outer magnetic rings is a common multiple of the number of magnetic poles and the number of groups.

From a cost standpoint, it is best for all the magnets to share the same shape, and for the pieces of the divided yoke to the same as one another. Let us assume, for example, that the total number of magnets that make up the outer magnetic rings is 30, and that the second yoke member is divided into three pieces, or groups. In this case, 10 magnets are attached to each of the yoke pieces. This use of a common multiple of the number of poles of the magnets (two poles) and the number of yoke divisions for the total of magnets allows the magnets to be allotted uniformly to each of the yoke pieces.

In another preferred embodiment of this invention, the number of groups is three.

Another multiple-shaft power transmission apparatus of this invention comprises a partition that delineates a space with a different environment from an atmospheric environment, a plurality of inner magnetic rings disposed within the atmospheric environment, and a plurality of outer magnetic rings disposed within the space delineated by the partition and magnetically coupled to the inner magnetic rings via the partition. With this invention, the inner magnetic rings comprise a plurality of magnets disposed around the outer peripheral edge of a ring-shaped first yoke member such that the adjacent pole faces are mutually different. Also, with this invention, the outer magnetic rings comprise a plurality of magnets, in a number different from the number of magnets of the inner magnetic rings, disposed around the inner peripheral edge of a ring-shaped second yoke member such that the adjacent pole faces are mutually different. Furthermore, with this invention, the outer magnetic rings are supported via bearings on the partition so as to be rotatable in relation to the partition. Furthermore, with this invention, the various magnets that make up the inner magnetic rings are displaced increasingly closer to the outer magnetic rings or further away from the outer magnetic rings in the order of the arrangement thereof, which imparts a rotational force to the outer magnetic rings.

Thus, the distance between the magnets that make up the inner magnetic rings and the magnets that make up the outer magnetic rings successively varies along the ring circumference. The magnetic coupling force is greater at the portion where the distance between the magnets is shorter, and the magnetic coupling force is reduced at the portion where the distance between the magnets is longer. The magnetic field generated by the inner magnetic rings here varies temporally and spatially. This change in the magnetic field imparts a rotational force to the outer magnetic rings. With this structure, a compact and highly rigid construction is obtained, and furthermore no backlash occurs.

In the implementation of this invention, it is preferable for the second yoke member can be disassembled so that the magnets that make up the outer magnetic rings are allotted to a plurality of groups.

In the implementation of this invention, it is preferable for there to be a rotating member that is rotatable in relation to the rotational axis of the outer magnetic rings and that has a cross section which is elliptical in the direction perpendicular to this rotational axis, wherein the first yoke member is flexible, part thereof is fixed with respect to the partition, and the rotating member is provided slidably along the side face of the first yoke member without causing the rotation of the first yoke member.

Because of this structure, the magnets of the inner magnetic rings are arranged in an elliptical shape along the side face of the rotating member. Also, the rotating member is slidable with respect to the inner magnetic rings. Thus, the inner magnetic rings will not rotate even if the rotating member rotates. When the rotating member rotates, the magnets of the inner magnetic rings move closer to the rotational axis or move away from the rotational axis within the plane perpendicular to this rotational axis. Accordingly, the distance between the inner magnetic rings and the outer magnetic rings varies spatially and temporally, producing rotational force at the outer magnetic rings.

In a preferred embodiment of this invention, the number of magnets that make up the inner magnetic rings is two less than or two greater than the number of magnets that make up the outer magnetic rings.

Because of this structure, the outer magnetic rings make fewer rotations than the rotating member. A speed reducer function is thus achieved.

Another multiple-shaft power transmission apparatus of this invention comprises a plurality of inner magnetic rings and a plurality of outer magnetic rings magnetically coupled to these inner magnetic rings. With this invention, the inner magnetic rings comprise a plurality of magnets disposed around the outer peripheral edge of a ring-shaped first yoke member such that the adjacent pole faces are mutually different. Also, with this invention, the outer magnetic rings comprise a plurality of magnets, in a number different from the number of magnets of the inner magnetic rings, disposed around the inner peripheral edge of a ring-shaped second yoke member such that the adjacent pole faces are mutually different, and are rotatively supported. Furthermore, with this invention, the various magnets that make up the inner magnetic rings are displaced increasingly closer to the outer magnetic rings or further away from the outer magnetic rings in the order of the arrangement thereof, which imparts a rotational force to the outer magnetic rings.

In the implementation of this invention, it is preferable for the second yoke member can be disassembled so that the magnets that make up the outer magnetic rings are allotted to a plurality of groups.

Also, in the implementation of this invention, it is preferable for there to be a rotating member that is rotatable in relation to the rotational axis of the outer magnetic rings and that has a cross section which is elliptical in the direction perpendicular to this rotational axis, wherein the first yoke member is flexible, and the rotating member is provided slidably along the side face of the first yoke member without causing the rotation of the first yoke member.

In a preferred embodiment of this invention, the number of magnets that make up the inner magnetic rings is two less than or two greater thatn the number of magnets that make up the outer magnetic rings.

The wafer transport arm link of this invention comprises a tray joint shaft, first and second distal end arms, a wafer placement tray, a third joint shaft, a fourth joint shaft, a first orientation arm, a second orientation arm, an orientation arm shaft, a rod-shaped guide magnet, and an orientation magnet. With this invention, the first and second distal end arms are rotatable parallel to each other around the tray joint shaft. Also, with this invention, the wafer placement tray is provided on the tray joint shaft. Also, with this invention, the third joint shaft is provided to the first distal end arm, and the fourth joint shaft is provided to the second distal end arm. Also, with this invention, the first orientation arm is coupled to the first distal end arm via the third joint shaft, and the second orientation arm is coupled to the second distal end arm via the fourth joint shaft. Furthermore, with this invention, the orientation arm shaft rotatively couples the first orientation arm and the second orientation arm in a state in which they are parallel to each other. Furthermore, with this invention, the rod-shaped guide magnet is fixed at one end to the wafer placement tray and extends at the other end in a straight line over the orientation arm shaft. Furthermore, with this invention, the orientation magnet is provided at the location of the orientation arm shaft and supports the guide magnet in non-contact fashion.

With this structure, when the first and second distal end arms perform rotational motion, this is accompanied by movement of the first and second orientation arms, and the position of the orientation arm shaft moves. Here, the orientation of the wafer placement tray is invariable with respect to the extension direction of the guide magnet, that is, the direction of extension of the straight line connecting the orientation arm shaft and the tray joint shaft. Therefore, in this link mechanism, the orientation of the wafer placement tray is controlled as desired in the course of the extension and retraction of the link.

Also, because of this structure, there is no need to increase the number of shafts of the arm link in order to control the direction of the wafer placement tray. The rigidity of the arm link can therefore be made higher than in the past. Also, less dust is generated because the directional control of the wafer placement tray is accomplished with a non-contact mechanism utilizing magnetism. Furthermore, because the construction is so simple, assembly precision reproducibility is good and the unit is easier to handle.

In the implementation of this invention, it is preferable for the distance between the tray joint shaft and the third joint shaft to be equal to the distance between the tray joint shaft and the fourth joint shaft, and for the length of the first orientation arm to be equal to the length of the second orientation arm.

Because of this structure, the extension direction of the guide magnet coincides with the extension direction of a straight line that divides in two equal parts the angle between the first distal end arm and the second distal end arm. Thus, the orientation of the wafer placement tray is always controlled to coincide with the extension direction of the above-mentioned straight line.

In a preferred embodiment of this invention, a first inter-axial distance between the orientation arm shaft and the third and fourth joint shafts is greater than a second inter-axial distance between the tray joint shaft and the third and fourth joint shafts, but is within a range of from a substantially equal distance to a distance of the square root of two times the second inter-axial distance.

Because of this structure, the distance is never insufficient when the first distal end arm and the second distal end arm are open all the way.

Another wafer transport arm link of this invention comprises a tray joint shaft, first and second distal end arms, a wafer placement tray, a third joint shaft, a fourth joint shaft, a first orientation arm, a second orientation arm, an orientation arm shaft, a rod-shaped shaft, and a bearing. In this invention, the first and second distal end arms are rotatable parallel to each other around the tray joint shaft. Also, in this invention, the wafer placement tray is provided on the tray joint shaft. Also, in this invention, the third joint shaft is provided to the first distal end arm, and the fourth joint shaft is provided to the second distal end arm. Also, in this invention, the first orientation arm is coupled to the first distal end arm via the third joint shaft, and the second orientation arm is coupled to the second distal end arm via the fourth joint shaft. Furthermore, in this invention, the orientation arm shaft rotatively couples the first orientation arm and the second orientation arm in a state in which they are parallel to each other. Furthermore, in this invention, a rod-shaped shaft is fixed at one end to the wafer placement tray and at the other end extends in a straight line over the orientation arm shaft. Furthermore, in this invention, the bearing is provided at the location of the orientation arm shaft and slidably supports the rod-shaped shaft.

With this structure, when the first and second distal end arms perform rotational motion, this is accompanied by movement of the first and second orientation arms, and the position of the orientation arm shaft moves. Here, the orientation of the wafer placement tray is invariable with respect to the extension direction of the rod-shaped shaft, that is, the direction of extension of the straight line connecting the orientation arm shaft and the tray joint shaft. Therefore, in this link mechanism, the orientation of the wafer placement tray is controlled as desired in the course of the extension and retraction of the link.

In the implementation of this invention, it is preferable for the distance between the tray joint shaft and the third joint shaft to be equal to the distance between the tray joint shaft and the fourth joint shaft, and for the length of the first orientation arm to be equal to the length of the second orientation arm.

Because of this structure, the extension direction of the rod-shaped shaft coincides with the extension direction of a straight line that divides in two equal parts the angle between the first distal end arm and the second distal end arm. Thus, the orientation of the wafer placement tray is always controlled to coincide with the extension direction of the above-mentioned straight line.

In a preferred embodiment of this invention, the bearing is a ball spline type.

Another wafer transport arm link of this invention comprises a tray joint shaft, first and second distal end arms rotatable parallel to each other around the tray joint shaft, a wafer placement tray provided on the tray joint shaft, and first, second, third, and fourth magnetic rings in which a plurality of magnets are arranged in one or a plurality of ring shapes at an approximately equal angle pitch in relation to the respective axes. With this invention, the first and second magnetic rings are each provided rotatably having the tray joint shaft as the rotational axis, and these first and second magnetic rings are coupled to the first and second distal end arms, respectively. Also, with this invention, the third magnetic ring is magnetically coupled to the first magnetic ring and rotates along with the rotational motion of the first magnetic ring. Also, with this invention, the fourth magnetic ring is magnetically coupled to the second magnetic ring and rotates along with the rotational motion of the second magnetic ring. Furthermore, with this invention, the rotational motion of the first and second magnetic rings is controlled by magnetic coupling produced between these third and fourth magnetic rings, the relative positions of the respective rotational axes of the third and fourth magnetic rings are kept constant with respect to a straight line that divides in two equal parts the angle between the first distal end arm and the second distal end arm, and the distance between the various rotational axes is equal.

Thus, the rotational motion of the first distal end arm is accompanied by rotation of the first magnetic ring, and the rotational motion of the second distal end arm is accompanied by rotation of the second magnetic ring. Also, the third magnetic ring rotates along with the first magnetic ring, and the fourth magnetic ring rotates along with the second magnetic ring. Magnetic coupling is produced between the third and fourth magnetic rings, and the rotational motion of one is linked to that of the other. As a result, the rotational motion of the first and second magnetic rings is controlled, and the relative positions of the respective rotational axes of the third and fourth magnetic rings are kept constant with respect to a straight line that divides in two equal parts the angle between the first distal end arm and the second distal end arm. Therefore, the wafer placement tray is always controlled to the specified orientation with respect to the above-mentioned straight line.

Thus, since the directional control of the wafer placement tray is accomplished by magnetic coupling that acts in non-contact fashion, less dust is generated. Furthermore, since the construction is so simple, fewer parts are needed, assembly precision reproducibility is better, and handling is easier.

Another wafer transport arm link of this invention comprises a multiple-shaft power transmission apparatus, a first arm coupled to this multiple-shaft power transmission apparatus, a second arm coupled to this multiple-shaft power transmission apparatus, a tray joint shaft, first and second distal end arms rotatable parallel to each other around the tray joint shaft, a wafer placement tray provided on the tray joint shaft, a first joint shaft that rotatably couples the distal end of the first arm to the distal end of the first distal end arm, a second joint shaft that rotatably couples the distal end of the second arm to the distal end of the second distal end arm, and direction maintenance means for guiding the tray joint shaft toward the multiple-shaft power transmission apparatus in a state in which the wafer placement tray is facing in the direction determined from the positional relationship between the tray joint shaft and the multiple-shaft power transmission apparatus. With this invention, magnets with mutually different poles are provided to the first arm and the first distal end arm, and magnets with mutually different poles are provided to the second arm and the second distal end arm. Also, this invention further comprises a jackknife extricator that generates a repulsion force between the first arm and the first distal end arm and between the second arm and the second distal end arm as the tray joint shaft approaches the multiple-shaft power transmission apparatus.

Thus, a repulsion force is generated when the arm retracts, so the static frictional force produced at the arm can be canceled out. Therefore, the arm will operate with a very slight moment during operation.

BRIEF DESCRIPTION OF THE DRAWINGS

The foregoing and other objects, features and advantages of the present invention will be better understood from the foregoing description taken in connection with the accompanying drawings, in which:

FIG. 23 is a cross section illustrating the structure of a wafer transport apparatus with a double arm link construction.

DESCRIPTION OF THE PREFERRED EMBODIMENTS

Embodiments of the multiple-shaft power transmission apparatus and wafer transport arm link of the present invention will now be described through reference to the figures. These figures merely serve to schematically illustrate the various constituent elements to facilitate an understanding of the present invention. Also, the numerical values and other such conditions and materials given below are nothing more than examples.

Figure 3:
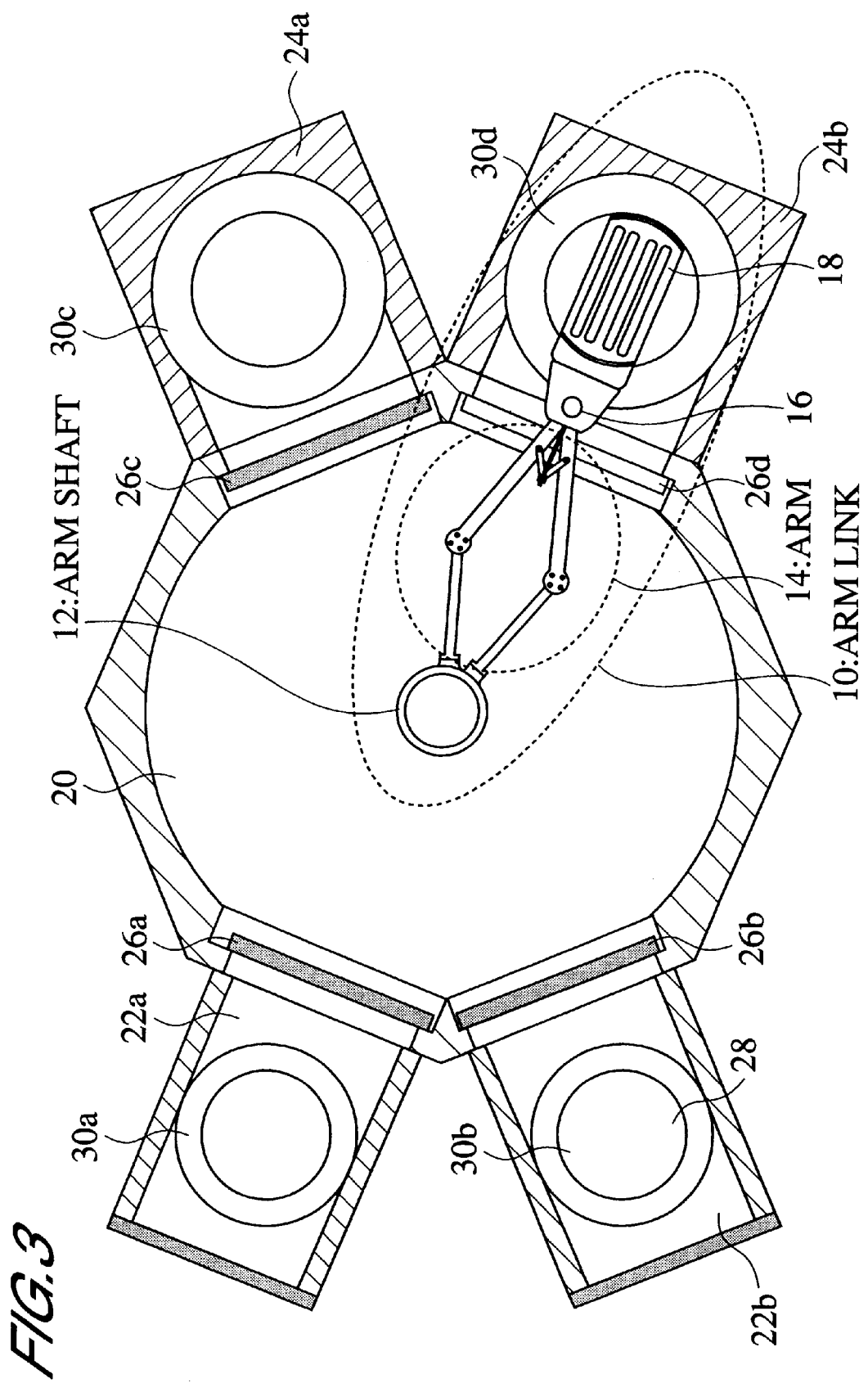
FIG. 3 is a plan view illustrating an example of the arrangement of the arm link.

In this embodiment, a structural example will be described in which the wafer transport arm link is used in a processing apparatus with a multi-chamber construction. First, referring to FIG. 3, let us describe the positional relationship between the wafer transport arm links (hereinafter abbreviated as arm links), arm chamber, load-lock chamber, and processing chamber. FIG. 3 is a plan view illustrating an example of the arrangement of the arm link. [Arrangement of the arm link]

As shown in FIG. 3, an arm link 10 comprises an arm 14 rotatable around an arm shaft 12 of a multiple-shaft power transmission apparatus, a tray joint shaft 16 provided to the distal end of the arm 14, and a wafer placement tray 18 provided on the tray joint shaft 16. The arm 14 is able to extend and retract in the direction of extension of the straight line connecting the arm shaft 12 and the tray joint shaft 16. The arm link 10 is provided inside an arm chamber 20. The arm shaft 12, which rotatably supports the arm 14, is fixed in the center of the arm chamber 20.

The arm chamber 20 is divided by a specific partition so that the plan shape of the space in the chamber is octagonal. Load-lock chambers 22a and 22b are respectively coupled to two partition faces located on the left side of the arm chamber 20 in the figure. Processing chambers 24a and 24b are respectively coupled to two partition faces located on the right side of the arm chamber 20 in the figure. The load-lock chambers 22a and 22b and the processing chambers 24a and 24b are each divided by a specific partition so that the plan shape of the space inside the chamber is quadrangular. Openable gate valves 26a and 26b are respectively provided to the coupled portion of the load-lock chamber 22a and the arm chamber 20 and to the coupled portion of the load-lock chamber 22b and the arm chamber 20. Similarly, openable gate valves 26c and 26d are respectively provided to the coupled portion of the processing chamber 24a and the arm chamber 20 and to the coupled portion of the processing chamber 24b and the arm chamber 20. Circular spaces that allow the placement of wafers 28 are provided as wafer holders 30a, 30b, 30c, and 30d inside the load-lock chamber 22a, the load-lock chamber 22b, the processing chamber 24a, and the 24b, respectively.

The above-mentioned arm 14 is able to extend and retract only when the straight line connecting the arm shaft 12 and the tray joint shaft 16 coincides with the straight line connecting the arm shaft 12 with the center of the wafer holders 30a to 30d of the various chambers. Meanwhile, the arm 14 can only rotate around the arm shaft 12 when it is in its fully retracted state and when the wafer placement tray 18 and the arm 14 are inside the arm chamber 20. The above-mentioned gate valves 26a to 26d are usually only open when the arm 14 is inside the load-lock chambers 22a and 22b or the processing chambers 24a and 24b, and are closed the rest of the time.

During the transport of a wafer, gas is introduced into the load-lock chamber 22a (22b), and when the pressure inside the chamber reaches atmospheric pressure, the gate valve provided to the side which is not the arm chamber 20 side opens. A wafer 28 is then brought in from the outside cassette and placed on the wafer holder 30a (30b). The gate valve then closes and the gas is exhausted to obtain the negative pressure inside the load-lock chamber 22a (22b).

Next, the gate valve 26a (26b) provided to the arm chamber 20 side of the load-lock chamber 22a (22b) opens. Thereupon, the arm 14 of the arm link 10 extends toward the gate valve 26a (26b), and the wafer 28 is placed on the wafer placement tray 18. This wafer placement tray 18 is kept in the extension and retraction direction of the arm 14 by a means discussed below.

After the arm 14 retracts while holding the wafer 28, it is rotated and faced in the direction of the processing chamber 24a (24b) where it is to be sent. After this, the gate valve 26c (26d) of the processing chamber 24a (24b) opens, the arm 14 extends, and the wafer 28 is placed on the wafer holder 30c (30d) inside the processing chamber 24a (24b). The arm 14 then retracts, the gate valve 26c (26d) closes, and the processed wafer 28 is carried out. Upon completion of this processing, the wafer 28 is carried to the load-lock chamber 22a (22b) in the reversed sequence from when it was brought in, and is taken to the outside through a gate valve.

FIRST EMBODIMENT

The structure of the arm link 10 will now be described, touching on each of the constituent components in order.

Figure 1:
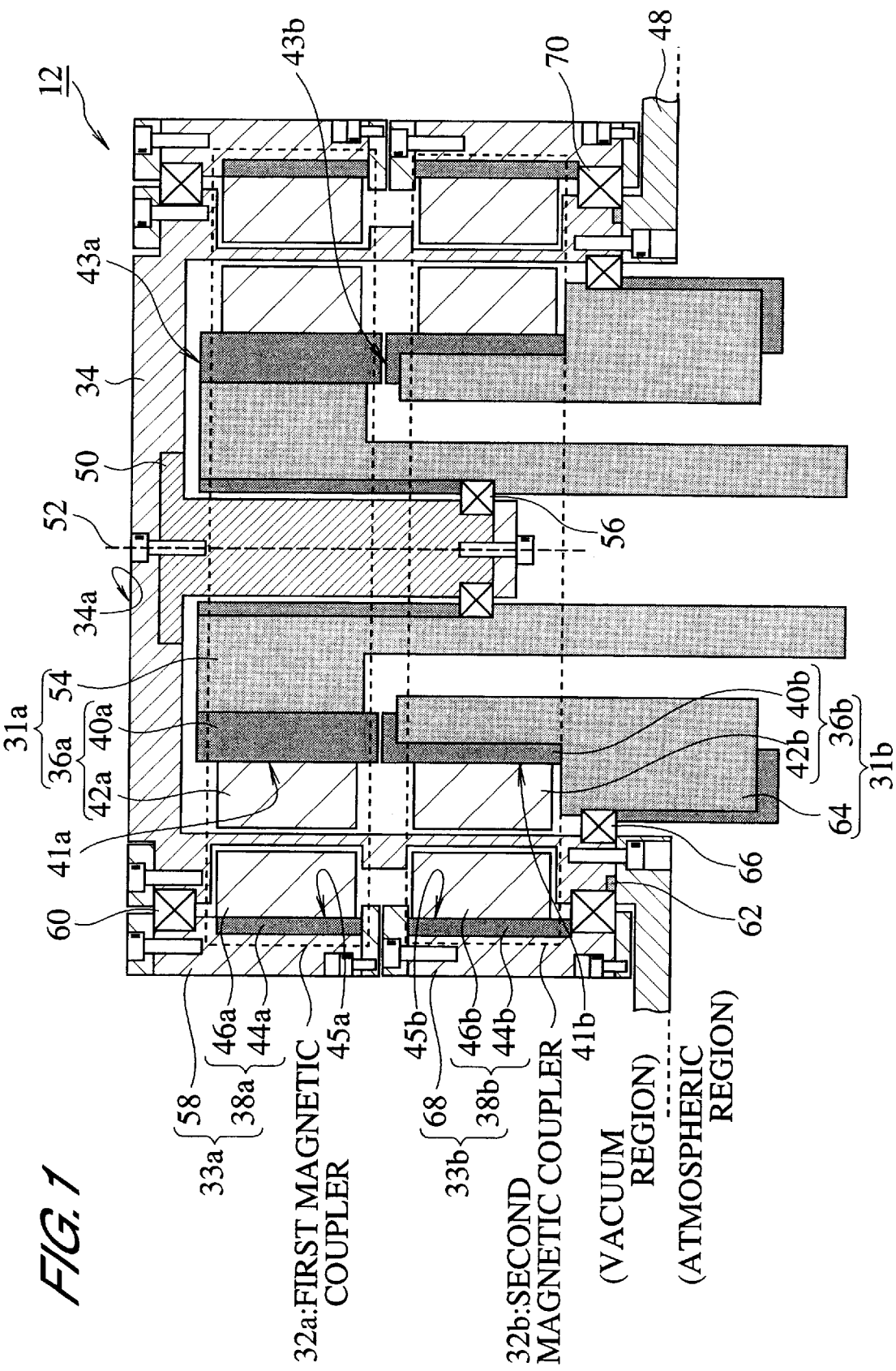
FIG. 1 is a cross section illustrating the structure of the arm shaft in a first embodiment.
Figure 2:
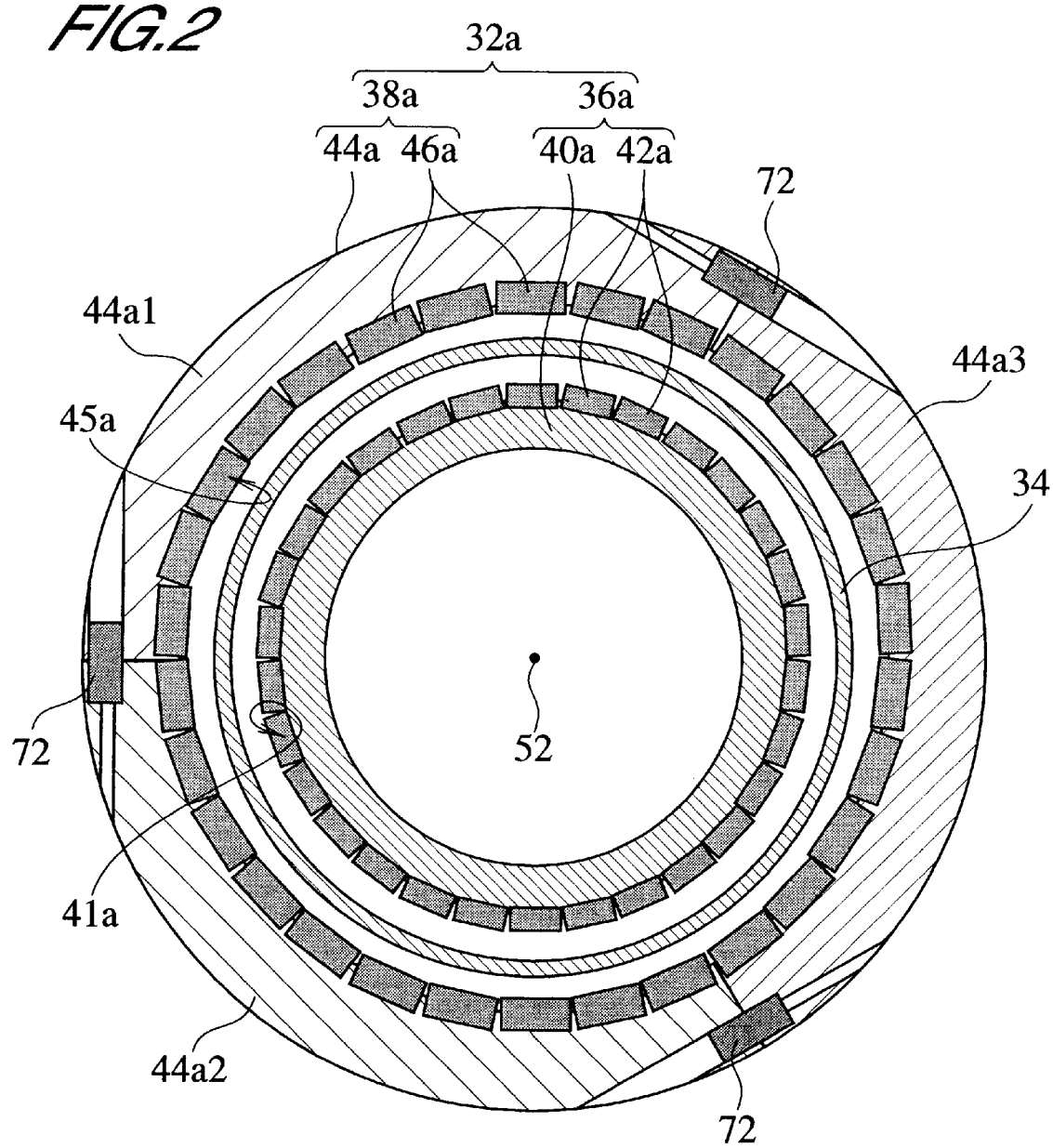
FIG. 2 is a cross section illustrating the structure of the magnetic coupler in the first embodiment.

First, the structure of the above-mentioned arm shaft 12 in the first embodiment will be described through reference to FIGS. 1 and 2. FIG. 1 is a cross section illustrating the structure of the arm shaft in the first embodiment. FIG. 2 is a cross section illustrating the structure of the magnetic coupler in the first embodiment. In this embodiment, the magnetic coupler shown in FIG. 2 is used to constitute the arm shaft 12 as the multiple-shaft power transmission apparatus. Drive force imparted from the outside is transmitted via this arm shaft 12 to the arm link 10 inside the arm chamber 20.

As shown in FIG. 1, the arm shaft 12 comprises first rotors 31a and 31b and second rotors 33a and 33b. The first rotors 31a and 31b are disposed in a state in which a plurality of magnets are held in an atmospheric environment. The first rotor 31a is constituted by an inner magnetic ring 36a and a first inner rotating shaft 54. The first rotor 31b is constituted by an inner magnetic ring 36b and a second inner rotating shaft 64.

The second rotors 33a and 33b are disposed in a state in which a plurality of magnets magnetically coupled with the first rotors 31a and 31b are held in a lower pressure environment different from the atmospheric environment. The second rotor 33a is constituted by an outer magnetic ring 38a and a first outer shaft 58. The second rotor 33b is constituted by an outer magnetic ring 38b and a second outer shaft 68.

The arm shaft 12 comprises a second inner fixed shaft 34 that serves as a partition which isolates the atmospheric environment from the lower pressure environment. The second inner fixed shaft 34 is an approximately cylindrical member, and the upper end of the cylinder structure is blocked off with a cover. The uncovered lower end of the cylinder structure is fixed via a vacuum sealing ring 62 to an arm shaft attachment base 48 provided in the center of the lower inner surface of the arm chamber 20. Therefore, the cylindrical space delineated by the second inner fixed shaft 34 is an atmospheric region, that is, a higher pressure environment. On the other hand, the outer part of the cylinder structure is a vacuum region, that is, a lower pressure environment. The first rotors 31a and 31b and the second rotors 33a and 33b are disposed with respect to the second inner fixed shaft 34 serving as a partition such that they are coaxial with one another.

A first inner fixed shaft 50 is fixed in the center of the cover at the upper end of the second inner fixed shaft 34. The first inner fixed shaft 50 is a cylindrical member, and the direction in which this cylinder extends is perpendicular to the main surface 34a of the covered portion of the second inner fixed shaft 34. The coupled portion of the first inner fixed shaft 50 and the second inner fixed shaft 34 is on the inside of the second inner fixed shaft 34 serving as the partition, so the first inner fixed shaft 50 is attached such that it protrudes downward into the higher pressure environment.

The reason for not using an integrated construction for the first inner fixed shaft 50 and the second inner fixed shaft 34 is to facilitate the machining of the second inner fixed shaft 34. Therefore, if this machining is not difficult, the first inner fixed shaft 50 and the second inner fixed shaft 34 may have an integrated construction. In other words, in this structural example, the partition that is used to isolate the atmospheric environment from the reduced pressure environment is constituted by the first inner fixed shaft 50 and the second inner fixed shaft 34 which have a substantially integrated construction.

A first magnetic coupler 32a comprises the inner magnetic ring 36a and the outer magnetic ring 38a, and a second magnetic coupler 32b comprises the inner magnetic ring 36b and the outer magnetic ring 38b. The inner magnetic ring 36a comprises a plurality of inner magnets 42a attached to the outer peripheral edge 41a of a ring-shaped first inner yoke 40a. The outer magnetic ring 38a comprises a plurality of outer magnets 46a attached to the inner peripheral edge 45a of a ring-shaped first outer yoke 44a. Similarly, the inner magnetic ring 36b comprises a plurality of inner magnets 42b attached to the outer peripheral edge 41b of a ring-shaped second inner yoke 40b. The outer magnetic ring 38b comprises a plurality of outer magnets 46b attached to the inner peripheral edge 45b of a ring-shaped second outer yoke 44b.

The above-mentioned first inner yoke 40a, second inner yoke 40b, first outer yoke 44a, and second outer yoke 44b are plates formed from iron, nickel, or another such magnetic material. The inner magnets 42a and 42b and the outer magnets 46a and 46b are permanent magnets approximately rectangular parallelepiped in form.

If these yokes and magnets are made of magnetic materials that need to be treated to prevent corrosion by the out gas or process gas (such as iron, ferrite, samarium cobalt, and boron-neodymium magnets), then the entire surface should be covered with a thin anti-corrosive film such as an electroless nickel plating. Corrosion resistance can also be enhanced by the use of a ceramic such as silicon nitride, and this also allows the amount of out gas to be reduced. This material is also favorable from the standpoint of raising the rigidity of the arm link.

The above-mentioned inner magnetic ring 36a is provided within the higher pressure environment rotatably in relation to a rotational axis 52 that is perpendicular to the main surface 43a of the first inner yoke 40a and passes through the ring center. In this example, the rotational axis 52 is an axis that passes through the center of the main surface 34a of the covered portion of the second inner fixed shaft 34 and that extends in a direction perpendicular to this main surface 34a. Therefore, the inner magnets 42a that make up the inner magnetic ring 36a are arranged in a ring shape within the same plane perpendicular to this rotational axis 52 and having this rotational axis 52 as their center. Accordingly, the first inner yoke 40a is attached to the first inner rotating shaft 54, which is able to rotate with the first inner fixed shaft 50 as its axis. The first inner rotating shaft 54 is a flanged shaft, and is attached to the outside of the first inner fixed shaft 50 via a first inner shaft bearing 56. The first inner yoke 40a is attached to the outer surface of the flange portion.

The above-mentioned outer magnetic ring 38a is provided within the lower pressure environment rotatably in relation to the same rotational axis 52 as the inner magnetic ring 36a. Therefore, the inner magnets 42a that make up the inner magnetic ring 36a are arranged in a ring shape within the same plane perpendicular to the rotational axis 52 and having this rotational axis 52 as their center. Accordingly, the first outer yoke 44a is attached to the first outer shaft 58, which is able to rotate with the second inner fixed shaft 34 as its axis. The first outer shaft 58 is a cylindrical member, and is attached to the second inner fixed shaft 34 via a first outer shaft bearing 60. The first outer yoke 44a is attached on the inner cylindrical surface of the first outer shaft 58.

As described above, the inner magnets 42a that make up the inner magnetic ring 36a and the outer magnets 46a that make up the outer magnetic ring 38a are disposed such that they are approximately opposite each other via the wall surface of the second inner fixed shaft 34.

Similarly, the above-mentioned inner magnetic ring 36b is provided within the higher pressure environment rotatably in relation to the rotational axis 52 that is perpendicular to the main surface 43b of the second inner yoke 40b and that passes through the ring center. Therefore, the inner magnets 42b that make up the inner magnetic ring 36b are arranged in a ring shape within the same plane perpendicular to the rotational axis 52 and having this rotational axis 52 as their center. Accordingly, the second inner yoke 40b is attached to the second inner rotating shaft 64, which is able to rotate with the first inner fixed shaft 50 as its axis. The second inner rotating shaft 64 is a cylindrical member, and is attached to the inside of the second inner fixed shaft 34 via a second inner bearing 66. The second inner yoke 40b is attached on the cylindrical surface of the second inner rotating shaft 64.

The above-mentioned outer magnetic ring 38b is provided within the lower pressure environment rotatably in relation to the same rotational axis 52 as the inner magnetic ring 36b. Therefore, the inner magnets 42b that make up the inner magnetic ring 36b are arranged in a ring shape within the same plane perpendicular to the rotational axis 52 and having this rotational axis 52 as their center. Accordingly, the second outer yoke 44b is attached to the second outer shaft 68, which is able to rotate with the second inner fixed shaft 34 as its axis. The second outer shaft 68 is a cylindrical member, and is attached to the outside of the second inner fixed shaft 34 via a second outer shaft bearing 70. The second outer yoke 44b is attached on the inner cylindrical surface of the second outer shaft 68.

Therefore, the inner magnets 42b that make up the inner magnetic ring 36b and the outer magnets 46b that make up the outer magnetic ring 38b are disposed such that they are opposite each other via the wall surface of the second inner fixed shaft 34.

Thus, all of the rotating shafts that make up the arm shaft 12 are incorporated into the precisely machined first inner fixed shaft 50 and the second inner fixed shaft 34. Specifically, the first rotors 31a and 31b and the second rotors 33a and 33b are supported by partitions (the second inner fixed shaft 34 and the first inner fixed shaft 50) via the bearings 56, 60, 66, and 70 such that these rotors are rotatable in relation to the same axis 52. Therefore, the inner magnetic rings and outer magnetic rings that make up the first magnetic coupler 32a and the second magnetic coupler 32b, respectively, are supported such that they are rotatable parallel to each other around the same rotational axis 52.

The second magnetic coupler 32b is structured such that it is located on the lower side of the first magnetic coupler 32a. Specifically, the first magnetic coupler 32a is provided at a location relatively closer to the covered portion of the second inner fixed shaft 34. Meanwhile, the second magnetic coupler 32b is provided at a location relatively farther away from the above-mentioned covered portion. Thus, the first magnetic coupler 32a and the second magnetic coupler 32b are disposed in the vertical direction along the rotational axis 52, and the arm shaft 12 therefore has a two-layer coaxial construction.

The bearings 56, 60, 66, and 70 used for the arm shaft 12 are cross roller bearings, which are commonly used in industrial robot arms. These bearings are designed such that a single bearing can bear loads in all directions, such as a radial load, an axial load, and a moment load. They therefore help to simplify the structure of the arm shaft 12.

The arm shaft 12 structured in this way is used as described below. Here, an example will be given of the first magnetic coupler 32a that constitutes the arm shaft 12. First, a rotational force is imparted by a motor or other drive means to the inner magnetic ring 36a installed in the higher pressure environment. Since the inner magnetic ring 36a and the outer magnetic ring 38a are coupled by magnetic coupling, the outer magnetic ring 38a rotates along with the rotational motion of the inner magnetic ring 36a. Therefore, if a specific arm is attached to the outer magnetic ring 38a, the arm link installed in the lower pressure environment will be actuated.

Thus, it is good for the inner magnetic ring 36a and the outer magnetic ring 38a that constitute the first magnetic coupler 32a to be as close together as possible, with a partition (the second inner fixed shaft 34) in between. This structure allows for stronger magnetic coupling between the inner magnetic ring 36a and the outer magnetic ring 38a. Also, to achieve a strong magnetic coupling, the outer magnets 46a and the first outer yoke 44a that constitute the outer magnetic ring 38a, and the inner magnets 42a and the first inner yoke 40a that constitute the inner magnetic ring 36a must be in close contact with each other, with as little gap as possible in between. Furthermore, the outer magnets 46a and the inner magnets 42a are attached to their respective yokes in a state in which the magnets are in close contact with each other. As a result, magnetic circuit resistance is reduced between the permanent magnets and the yokes, and between adjacent permanent magnets. The more this magnetic circuit resistance is reduced, the less magnetic force leakage there is to the magnets to either side on the same yoke, and the higher is the magnetic coupling force between opposing magnets, which is required for the transmission of the rotational force.

Accordingly, in this embodiment, either or both of the first inner yoke 40a and the first outer yoke 44a can be disassembled so that the magnets that make up the various magnetic rings are allotted to a plurality of groups. FIG. 2 is a cross section illustrating the structure of the magnetic coupler. The cross section in FIG. 2 is parallel to the ring plane, that is, it is perpendicular to the rotational axis 52. The first inner fixed shaft 50, the first inner rotating shaft 54, and the first outer shaft 58 are not illustrated in FIG. 2. The first magnetic coupler 32a is given as an example in FIG. 2, but the second magnetic coupler 32b also has the same structure.

As shown in FIG. 2, the inner magnetic ring 36a comprises the ring-shaped first inner yoke 40a and a plurality of inner magnets 42a attached along the outer peripheral edge 41a of this first inner yoke 40a. The outer magnetic ring 38a comprises the ring-shaped first outer yoke 44a and a plurality of outer magnets 46a attached along the inner peripheral edge 45a of this first outer yoke 44a. The outer magnetic ring 38a is disposed to the outside of the inner magnetic ring 36a. The outer magnetic ring 38a and inner magnetic ring 36a are able to rotate, having as their center axis the rotational axis 52 which extends perpendicular to the plane of the page of FIG. 2.

The first outer yoke 44a can be disassembled so that the magnets that make up the outer magnetic ring 38a are allotted to three groups. Specifically, the first outer yoke 44a consists of three parts: a first yoke piece 44a1, a second yoke piece 44a2, and a third yoke piece 44a3. These yoke pieces 44a1, 44a2, and 44a3 combine to form a plate. As shown in FIG. 2, when the ring center of the first outer yoke 44a is aligned with the rotational axis 52, the straight lines connecting the rotational axis 52 with the boundary locations between the yoke pieces 44a1, 44a2, and 44a3 form angles of 120° to each other. Thus, an equal number of the outer magnets 46a are attached of each of the yoke pieces 44a1, 44a2, and 44a3. In this structural example, the total number of outer magnets 46a that make up the outer magnetic ring 38a is 30, so 10 of the outer magnets 46a are attached to each of the yoke pieces 44a1, 44a2, and 44a3. This use of a common multiple of the number of poles of the magnets (two poles) and the number of yoke divisions for the total of outer magnets 46a allows magnets to be allotted uniformly to each of the yoke pieces.

Because it is structured in this way, the outer magnetic ring 38a is incorporated in a state in which the pole faces of the various outer magnets 46a are extremely close to the outer wall surface of the second inner fixed shaft 34. This incorporation is such that, as shown in FIG. 1, the pole faces of the various outer magnets 46a form a ring diameter smaller than the inside diameter of the first outer shaft bearing 60, or in other words, such that the pole faces of the various outer magnets 46a are located to the inside (that is, to the rotational axis 52 side) of the first outer shaft bearing 60. In this example, the distance between the pole faces of the outer magnets 46a and the pole faces of the inner magnets 42a can be set at 2 mm or less. Therefore, there is less magnetic force leakage than in the past, and the magnetic coupling is stronger between the inner magnetic ring 36a and the outer magnetic ring 38a.

If cost is a concern, it is better for the magnets used for the couplers all to be of the same shape. In principle, the more magnets there are, the higher is the magnetic coupling performance, but the use of more magnets also increases the amount of leakage of magnetic lines of force and complicates coupler assembly. It is therefore preferable for the number of magnets that make up each ring to be 30, as mentioned above. Because the vacuum partition in this embodiment (the second inner fixed shaft 34) is a cylindrical surface with a diameter of approximately 150 mm, it is extremely effective from a cost standpoint to arrange these 30 magnets around this surface so that the pole faces have a spacing of no more than 0.5 mm between them.

The outer magnetic ring 38a was divided into three parts in this structural example, but it may instead be divided into four or more parts. With only two divisions, however, it is difficult to achieve precision machining so that the permanent magnet attachment faces on the yokes are arranged with no gaps. A more practical number of divisions is therefore three. If there are four divisions, for example, it is best for the outer magnetic ring 38a to consist of 32 permanent magnets.

Also, the first outer yoke 44a that constitutes the outer magnetic ring 38a was divided in this example, but the first inner yoke 40a that constitutes the inner magnetic ring 36a may be divided instead. The above structure is applicable not only to the first magnetic coupler 32a, but similarly to the second magnetic coupler 32b.

Since the distance between the outer magnetic ring 38a and the inner magnetic ring 36a is set to 2 mm or less in this structural example, reproducibility of the magnetic coupler performance will be difficult to achieve unless the positional precision of the yoke pieces 44a1, 44a2, and 44a3 is set to 0.1 mm or less. Consequently, better precision is ensured in assembly reproducibility by providing positioning pins (parallel pins) 72 to the boundary portions between the yoke pieces 44a1, 44a2, and 44a3.

Figure 4:
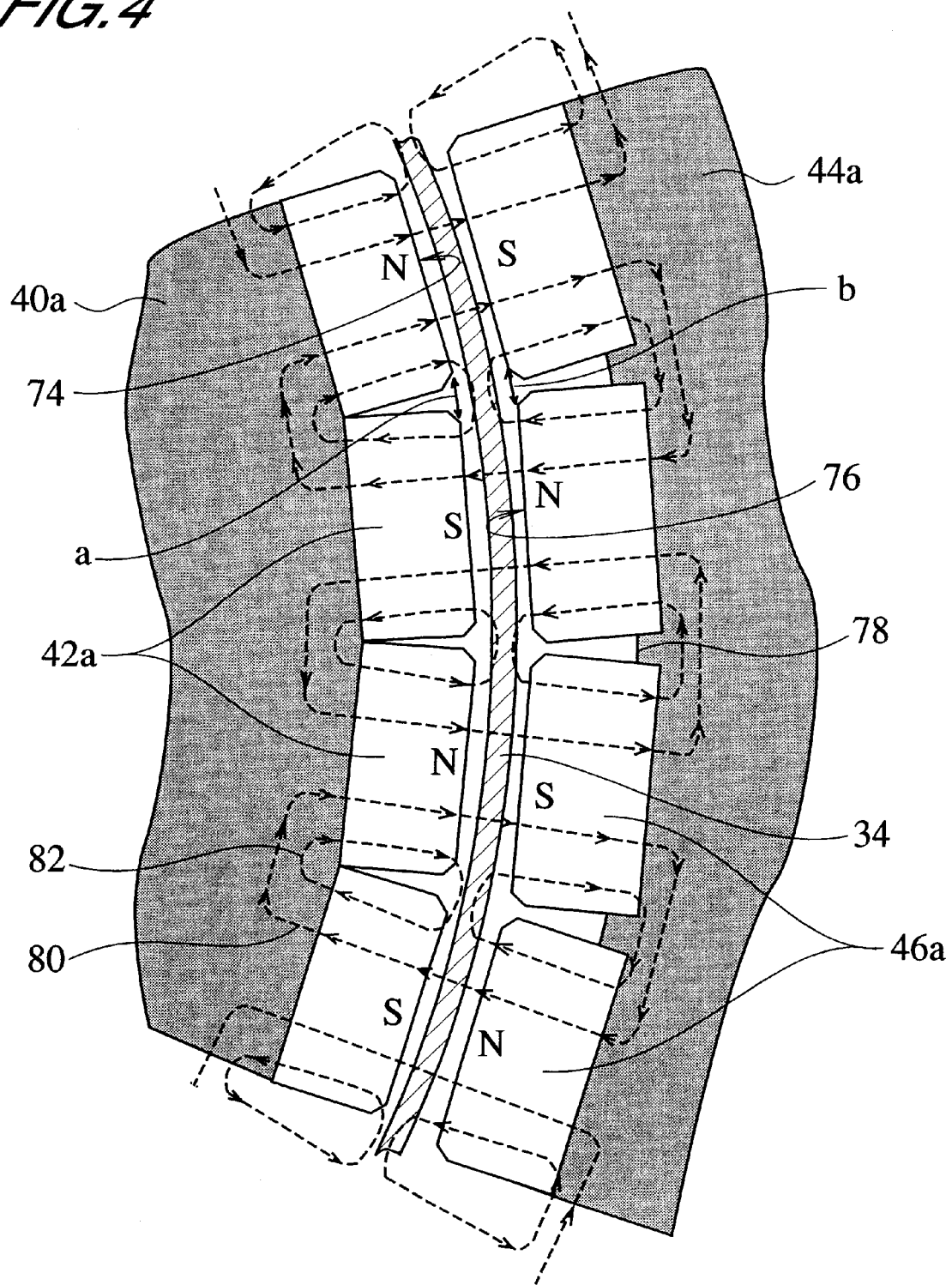
FIG. 4 is a cross section illustrating the lines of magnetic force.

FIG. 4 is a cross section illustrating how the lines of magnetic force are formed by the outer magnets 46a and the inner magnets 42a, and shows an enlarged view of part of the region including the inner magnetic ring 36a and the outer magnetic ring 38a shown in FIG. 2.

As shown in FIG. 4, the various inner magnets 42a that make up the inner magnetic ring 36a have an approximately rectangular parallelepiped shape for the sake of magnetic force leakage and the intensity of repulsion force. The long side of the pole face 74 along the ring circumference (the outer peripheral edge 41a) is set to be from three to five times longer than the distance a between the pole faces, and the short side thereof is set to be ⅓ to ½ as long as the long side. The pole face of each inner magnet 42a is positioned to the inside (that is, to the rotational axis 52 side) of and 0.2 to 0.5 mm away from the inner wall surface of the second inner fixed shaft 34. The inner magnets 42a are arranged such that the corners thereof where the inner magnets 42a are attached to the first inner yoke 40a are more or less in contact with each other. The surfaces of the inner magnets 42a in contact with the first inner yoke 40a are all parallel with the rotational axis 52.

The outer magnets 46a that make up the outer magnetic ring 38a have an approximately rectangular parallelepiped shape for the sake of magnetic force leakage and the intensity of repulsion force. The long side of the pole face 76 along the ring circumference (the inner peripheral edge 45a) is set to be from three to five times longer than the distance between b the pole faces, and the short side thereof is set to be ⅓ to ½ as long as the long side. The pole face of each outer magnet 46a is positioned to the outside of and 0.2 to 0.5 mm away from the outer wall surface of the second inner fixed shaft 34. To this end, magnet guide protrusions 78 are provided to the inner peripheral edge 45a of the first outer yoke 44a so that the distance between adjacent outer magnets 46a on the yoke will be from 0.5 to 1 mm. The surfaces of the outer magnets 46a in contact with the first outer yoke 44a are all parallel with the rotational axis 52. It is preferable for the structure to be such that the distance b between the pole faces of the outer magnets 46a to be equal to the distance a between the pole faces of the inner magnets 42a.

The inner magnets 42a are arranged such that the pole faces 74 arranged with alternately different magnetic poles appear on the second inner fixed shaft 34 side. The same applies with the outer magnets 46a, and the pole faces 76 arranged with alternately different magnetic poles appear on the second inner fixed shaft 34 side. Specifically, as indicated by the letters N and S in FIG. 4, north and south poles are alternately disposed. The number of inner magnets 42a that make up the inner magnetic ring 36a is 30, which is the same as the number of outer magnets 46a that make up the outer magnetic ring 38a. As a result, the magnetic rings 36a and 38a are stable in positions where the north poles of the inner magnets 42a and the south poles of the outer magnets 46a attract each other, and where the south poles of the inner magnets 42a and the north poles of the outer magnets 46a attract each other. Specifically, they are stable at positions where the pole faces 74 of the inner magnets 42a and the pole faces 76 of the outer magnets 46a, which face each other via the second inner fixed shaft 34, are parallel to one another. The number of inner magnets 42a does not necessarily have to be the same, and may be less than or greater than 30. In this case, there will be a shift in the balance point with respect to the rotational direction of the inner magnetic ring 36a, and the coupling force will be greater. Therefore, there is actually an increase in the positioning precision of the transport arm. This point will be described through reference to FIG. 5.

In general, the smaller is the distance between the respective pole faces of the opposing inner magnets 42a and outer magnets 46a, the greater is the magnetic attraction therebetween and the stronger is the magnetic coupling between the inner magnetic ring 36a and the outer magnetic ring 38a. On the other hand, if we examine an individual inner magnet 42a, the magnetic repulsion between this inner magnet 42a and the outer magnet 46a adjacent to the outer magnet 46a opposite this inner magnet 42a via the second inner fixed shaft 34 increases in strength the smaller is the distance between the respective pole faces of the inner magnets 42a and the outer magnets 46a. Similarly, if we examine an individual outer magnet 46a, the magnetic repulsion between this outer magnet 46a and the inner magnet 42a adjacent to the inner magnet 42a opposite this outer magnet 46a via the second inner fixed shaft 34 increases in strength the smaller is the distance between the respective pole faces of the inner magnets 42a and the outer magnets 46a. The strength of this magnetic repulsion is proportional to the inverse of the square of the distance, so it can be seen how important it is to reduce the distance between the rings. Consequently, the outer magnetic ring 38a and the inner magnetic ring 36a will come to stable rest at the position where the combined force of magnetic attraction and magnetic repulsion balances out.

Therefore, the amount of change in the intensity of the force generated when there is a shift from this balance point indicates the stability of the coupling force between the magnetic rings, and also affects the vibration of the arm. In other words, if the inner magnetic ring 36a and the outer magnetic ring 38a deviate from the above-mentioned balance point, the above-mentioned combined force acts as a righting force, with the components attempting to return to their original balance point, and this results in vibration.

Figure 5:
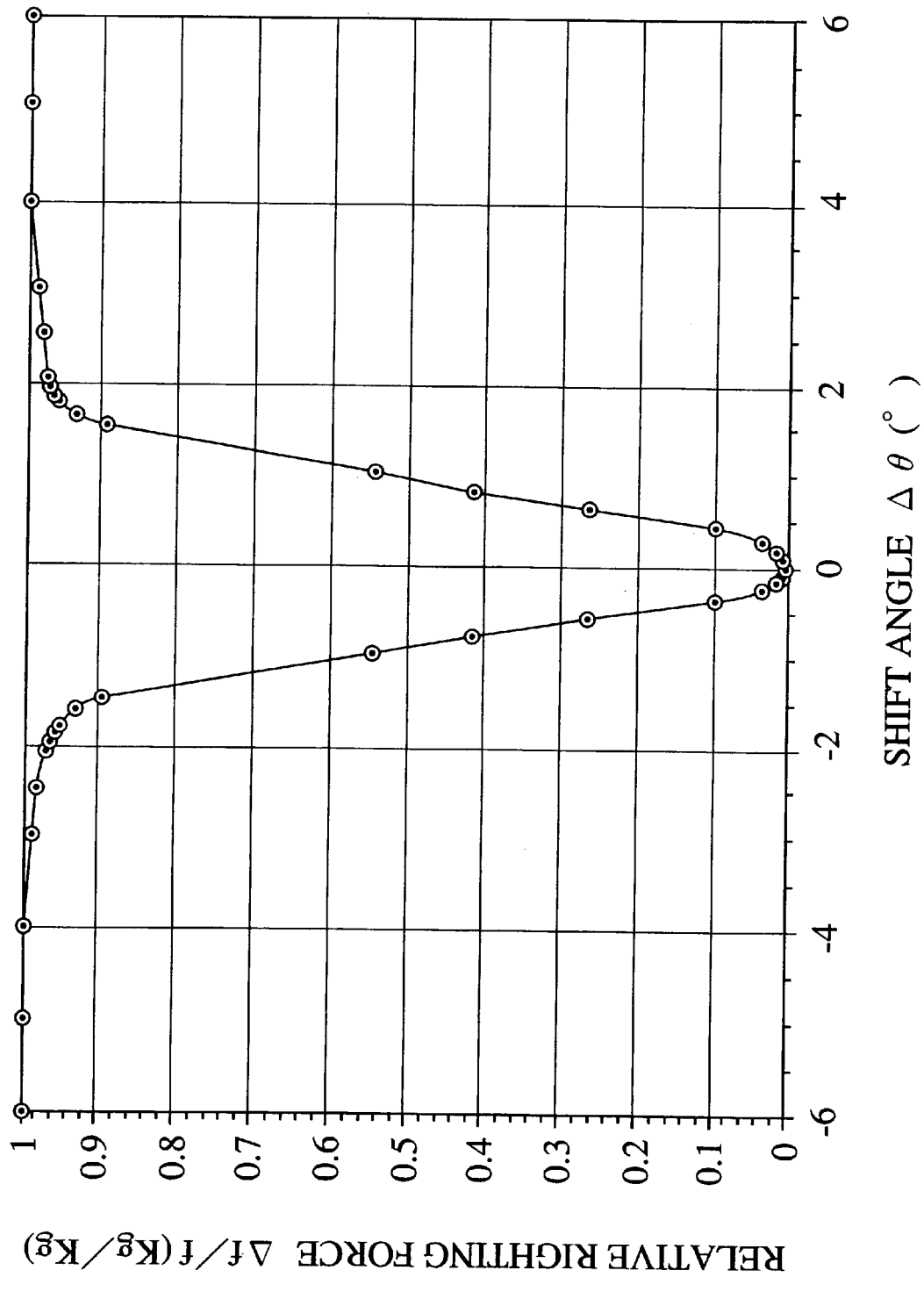
FIG. 5 is a graph illustrating the relative righting force with respect to shifting from the balance point of the magnetic coupler.

FIG. 5 is a graph illustrating the relative righting force with respect to shifting from the balance point of the magnetic coupler. The horizontal axis is the shift angle $\Delta\theta$, and is graduated from −60 to 6° in units of two degrees. The vertical axis is the relative righting force $\Delta f/f$, and is graduated from 0 kg/kg to 1 kg/kg in units of 0.1 kg/kg.

As shown in FIG. 5, when the shift angle $\Delta\theta$ is 0°, the relative righting force $\Delta f/f$ is 0 kg/kg, but as the absolute value of the shift angle $\Delta\theta$ increases, the relative righting force $\Delta f/f$ rises sharply. For instance, if the absolute value of the shift angle $\Delta\theta$ is 4°, the relative righting force $\Delta f/f$ rises all the way to 1 kg/kg. Thus, the relative righting force $\Delta f/f$, which originates in the attraction and repulsion of the 60 magnets, increases sharply as the shift angle $\Delta\theta$ increases. Since the proportional increase in the relative righting force $\Delta f/f$ determines the magnitude of the shift angle $\Delta\theta$, it is better for the proportional increase in the relative righting force $\Delta f/f$ to become larger as the shift angle $\Delta\theta$ from the balance point increases as shown in FIG. 5. To this end, as mentioned above, it is effective to reduce the distance not only between the opposing magnets but also between the adjacent magnets while increasing the magnetic force leakage (discussed below) as little as possible, and to concentrate the lines of magnetic force in the vicinity of the ends around the center of the opposing pole faces.

Furthermore, when the shift angle $\Delta\theta$ is close to 0°, there is a range in which $\Delta f$ does not vary all with respect to changes in $\Delta\theta$, so a dead coupling region is formed between the inner and outer magnetic rings, although it is very slight. In view of this, the inner and outer magnetic rings are given different numbers of magnets so that there will be a balance at the location where the shift angle $\Delta\theta$ is shifted from close to 0°. As a result, balance is achieved in a state in which attraction and repulsion are always at work between the inner magnetic rings and the outer magnetic rings, affording further reduction in relative displacement with respect to the rotational direction of the inner and outer magnetic rings. For practical purposes, since the magnets have two poles, a north pole and a south pole, it is better for the difference in the number of magnets of the inner and outer magnetic rings to be two.

As described above, the stability of the balance point can be improved by reducing the distance between mutually opposing magnets and adjacent magnets. This allows vibration during arm drive to be kept to a minimum. Since a sharp change in magnetic force is obtained with the magnet disposition in this embodiment, magnetic coupling that is extremely stable can be achieved.

Next, the lines of magnetic force formed between the inner magnetic ring 36a and the outer magnetic ring 38a will be described through reference to FIG. 4. The closed magnetic force line paths shown in FIG. 4 are formed by opposing magnet magnetic force lines 80 formed between opposing permanent magnets, and leakage magnetic force lines 82 formed between adjacent magnets on the same yoke. The difference between these is that the former forms a closed magnetic path between yokes and between a pair of permanent magnets opposing each other via the second inner fixed shaft 34, whereas the latter forms a closed magnetic path between a yoke and adjacent permanent magnets on the same yoke. In general, when the opposing permanent magnets are relatively far apart, as in the structural example disclosed in Publication 6, the magnetic path resistance is higher with respect to the leakage magnetic force lines 82, and the amount thereof is larger. However, if the magnets of a yoke are moved closer together, as disclosed in Publication 12 (Japanese Unexamined Patent Publication No. 6-241237), the amount of the leakage magnetic force lines 82 is smaller, and as a result the magnetic coupling is stronger between the magnetic rings. With the structural example in this embodiment, the magnets are even closer together than in the structure disclosed in this Publication 12, so even stronger magnetic coupling is obtained.

Furthermore, if the centers of the inner pole faces of the outer magnets 46a disposed around the inner peripheral edge 45a of the yoke 44a are made slightly concave, the magnetic force lines can be reduced in the centers of these pole faces and can be concentrated in the vicinity of the ends of the pole faces, which yields stronger coupling.

SECOND EMBODIMENT

Figure 6:
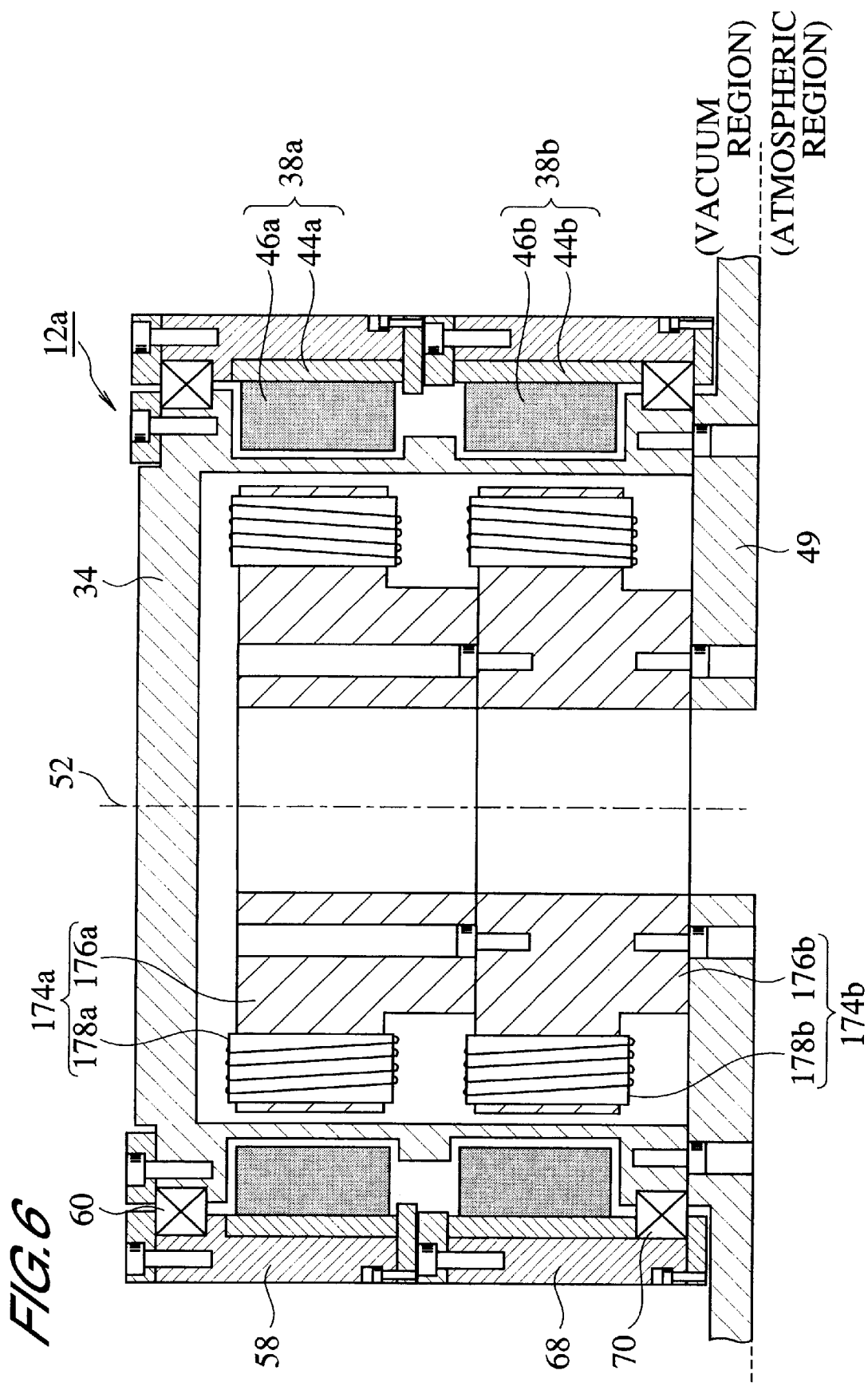
FIG. 6 is a cross section illustrating the structure of the arm shaft in a second embodiment.

The structure of the arm shaft 12a in a second embodiment will now be described through reference to FIGS. 6 and 7. FIG. 6 is a cross section illustrating the structure of the arm shaft 12a in the second embodiment, and FIG. 7 is a cross section illustrating the structure of the magnetic coupler in the second embodiment.

As shown in FIG. 6, the arm shaft 12a is equipped with the second inner fixed shaft 34 as a partition that isolates the atmospheric environment from the lower pressure environment. The structure provided to the lower pressure environment, namely, the outer magnetic rings 38a and 38b, the first outer shaft 58, and the second outer shaft 68, is the same as the structure of the arm shaft 12 in the first embodiment shown in FIG. 1. Meanwhile, electromagnets are used for the structure of inner magnetic rings 174a and 174b provided to the atmospheric environment.

The above-mentioned inner magnetic ring 174a comprises a first electromagnetic yoke 176a and a first electromagnetic coil 178a. The other inner magnetic ring 174b comprises a second electromagnetic yoke 176b and a second electromagnetic coil 178b. The second electromagnetic yoke 176b is fixed to an arm shaft attachment base 49, and the first electromagnetic yoke 176a is superposed over and fixed to the second electromagnetic yoke 176b.

Figure 7:
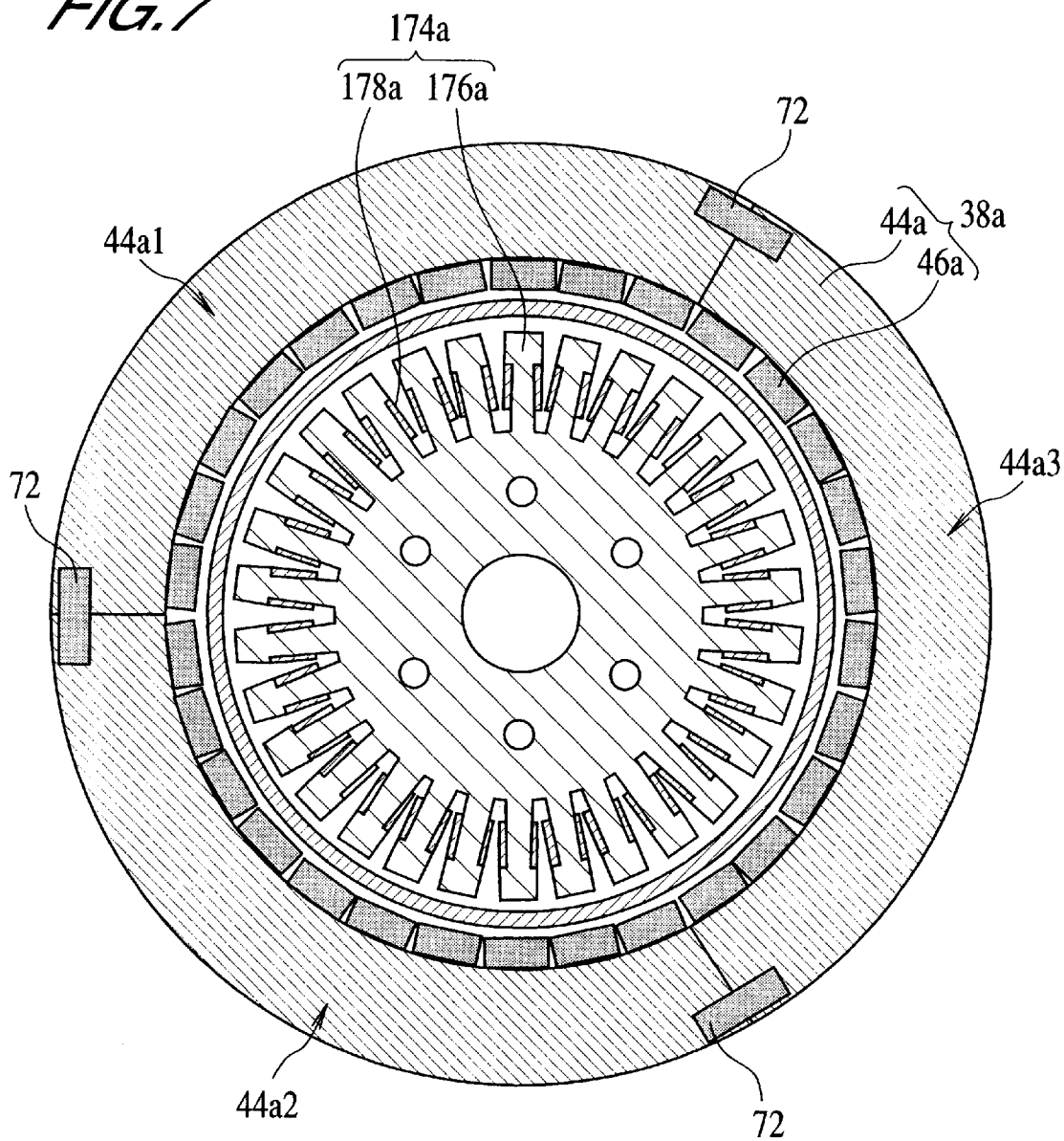
FIG. 7 is a cross section illustrating the structure of the magnetic coupler in the second embodiment.

As shown in FIG. 7, the electromagnetic yokes 176a and 176b each comprise a cylindrical portion whose center axis is the rotational axis 52 of the outer magnetic rings 38a and 38b, and a portion that protrudes radially from this rotational axis 52. The electromagnetic coils 178a and 178b are wound around these protruding portions, and the electromagnetic coils 178a and 178b each function as an electromagnet when a current is passed therethrough. The portions wound with the electromagnetic coils 178a and 178b are opposite the magnets that make up the outer magnetic rings 38a and 38b, and these are magnetically coupled via the partition 34. In this example, the inner magnetic ring 174a provided on top in the figure is magnetically coupled with one of the outer magnetic rings 38a. The inner magnetic ring 174b provided on the bottom in the figure is magnetically coupled with the other outer magnetic ring 38b.

In the inner magnetic rings 174a and 174b, it is preferable for adjacent electromagnetic coils 178a and 178b to have opposite windings. Specifically, the winding directions of adjacent coils are opposite with respect to the radial direction. If this is done, successively different magnetic poles will be arranged around the ring periphery, which facilitates control. The number of coils is not related to the number of magnets of the outer magnetic ring 38a, and the more coils there are, the higher is the angular precision of the outer magnetic ring 38a.

In the operation of the electromagnetic coils 178a and 178b as electromagnets by passing a current therethrough, it is good to vary the size of the current according to the arrangement position of the various electromagnets, for example. For instance, it is favorable to set the various current values such that the size will vary sinusoidally along the ring periphery. Control in this manner results in a different magnetic force being generated from the electromagnets depending on the ring position, so the outer magnetic rings 38a and 38b begin to rotate in the specified direction.

Because electromagnets are thus used in the inner magnetic rings 174a and 174b, there is no need to rotate the inner magnetic rings 174a and 174b with a motor or the like.

The yoke members that make up the outer magnetic rings 38a and 38b can be disassembled so that the magnets that make up the various magnetic rings are allotted to a plurality of groups, just as with the arm shaft 12 in the first embodiment shown in FIG. 1. Therefore, the distance between the outer magnetic rings and the inner magnetic rings is shorter than usual, and the magnetic coupling is stronger.

THIRD EMBODIMENT

Figure 8:
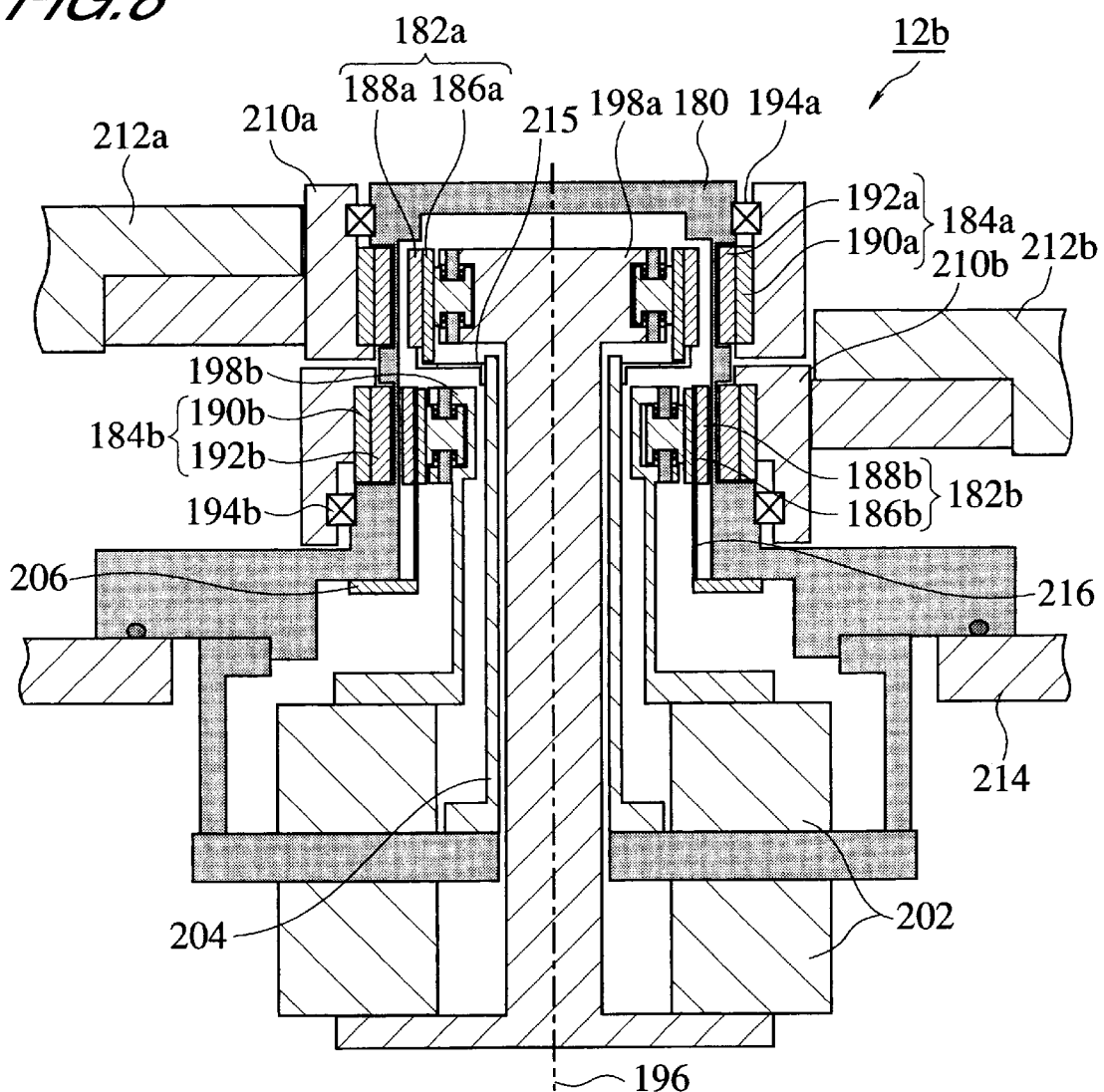
FIG. 8 is a cross section illustrating the structure of the arm shaft in a third embodiment.
Figure 9:
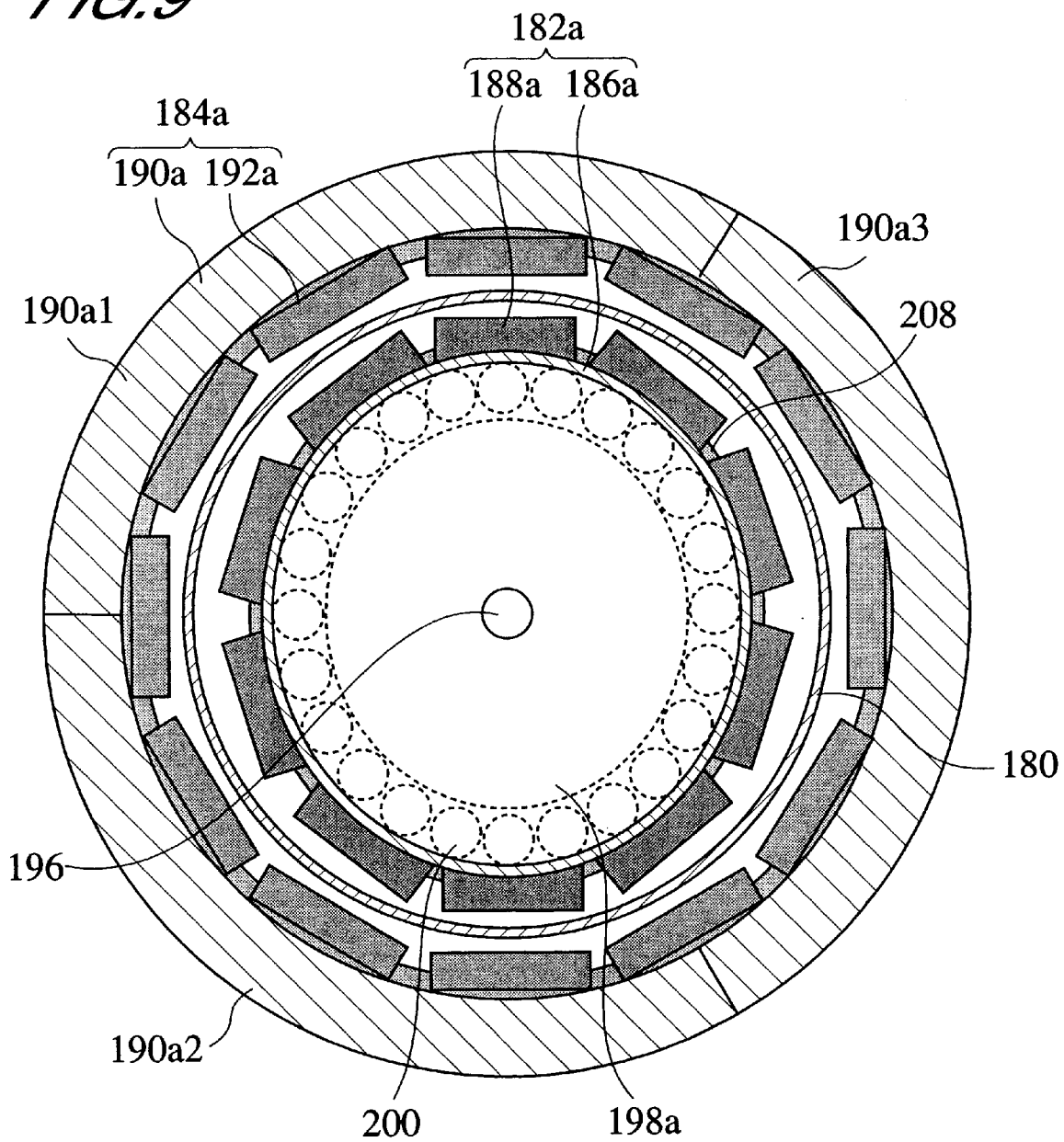
FIG. 9 is a cross section illustrating the structure of the magnetic coupler in the third embodiment.

The structure of the arm shaft 12b in a third embodiment will now be described through reference to FIGS. 8 and 9. FIG. 8 is a cross section illustrating the structure of the arm shaft 12b in the third embodiment, and FIG. 9 is a cross section illustrating the structure of the magnetic coupler in the third embodiment that constitutes the arm shaft 12b.

As shown in FIG. 8, the arm shaft 12b is equipped with a partition 180 delineates a space with a different environment from the atmospheric environment. The partition 180 is an approximately cylindrical member. The space on the inside of the cylinder structure is an atmospheric region, that is, a higher pressure environment. Meanwhile, the space on the outside of the cylinder structure is a vacuum region, that is, a lower pressure environment. This partition 180 is fixed to an arm shaft attachment base 214.

The arm shaft 12b comprises inner magnetic rings 182a and 182b and outer magnetic rings 184a and 184b. These inner magnetic rings 182a and 182b are each installed within an atmospheric environment. Meanwhile, the outer magnetic rings 184a and 184b are each installed in a space delineated by the partition 180. The outer magnetic rings 184a and 184b are magnetically coupled to the inner magnetic rings 182a and 182b, respectively, via the partition 180.

The inner magnetic ring 182a comprises a plurality of magnets 188a arranged around the outer peripheral edge of a ring-shaped first yoke member 186a. Similarly, the inner magnetic ring 182b comprises a plurality of magnets 188b attached to the outer peripheral edge of a ring-shaped first yoke member 186b.

The outer magnetic ring 184a comprises a plurality of magnets 192a arranged around the inner peripheral edge of a ring-shaped second yoke member 190a. This outer magnetic ring 184a is supported by the partition 180 via a bearing 194a so that it can rotate in relation to the partition 180. In specific terms, the second yoke member 190a and the magnets 192a are provided to the inner surface of an outer rotating shaft 210a, and this outer rotating shaft 210a is supported by the partition 180 via the bearing 194a. An arm 212a that constitutes a link is coupled to this outer rotating shaft 210a.

Similarly, the outer magnetic ring 184b comprises a plurality of magnets 192b arranged around the inner peripheral edge of a ring-shaped second yoke member 190b. This outer magnetic ring 184b is supported by the partition 180 via a bearing 194b so that it can rotate in relation to the partition 180. In specific terms, the second yoke member 190b and the magnets 192b are provided to the inner surface of an outer rotating shaft 210b, and this outer rotating shaft 210b is supported by the partition 180 via the bearing 194b. An arm 212b that constitutes a link is coupled to this outer rotating shaft 210b.

Because they are structured in this manner, the outer magnetic rings 184a and 184b are rotatable in relation to the same rotational axis 196. This rotational axis 196 coincides with the center axis of the partition 180.

As described above, this structural example involves the structure of a magnetic coupler in which the inner magnetic ring 182a and the outer magnetic ring 184a are magnetically coupled via the partition 180. It also involves the structure of a magnetic coupler in which the inner magnetic ring 182b and the outer magnetic ring 184b are magnetically coupled via the partition 180. These magnetic couplers are disposed along the partition 180 in the vertical direction in FIG. 8.

The second yoke member 190a can be disassembled so that the magnets 192a that make up the outer magnetic ring 184a are allotted to a plurality of groups, just as with the structure in the first embodiment described through reference to FIGS. 1 and 2. Similarly, the second yoke member 190b can be disassembled so that the magnets 192b that make up the outer magnetic ring 184b are allotted to a plurality of groups. Thus, the distance between the inner magnetic rings and the outer magnetic rings is shorter than usual, and the magnetic coupling is stronger.

With the arm shaft 12b in this example, the magnets 188a that make up the inner magnetic ring 182a are displaced in the arrangement order thereof to be closer to the outer magnetic ring 184a or to be farther away from the outer magnetic ring 184a, which imparts a rotational force to the outer magnetic ring 184a. Similarly, the magnets 188b that make up the inner magnetic ring 182b are displaced in the arrangement order thereof to be closer to the outer magnetic ring 184b or to be farther away from the outer magnetic ring 184b, which imparts a rotational force to the outer magnetic ring 184b.

A rotating member 198*a* is provided to the arm shaft 12*b* for this purpose. The rotating member 198*a* is rotatable in relation to the rotational axis 196 of the outer magnetic ring 184*a*, and is a part having an elliptical cross section in the direction perpendicular to this rotational axis 196. Also, the first yoke member 186*a* is flexible, and part thereof is fixed with respect to the partition 180. In this example, the lower end of this first yoke member 186*a* is fixed to the partition 180 via a fixing base 204. The rotating member 198*a* is provided slidably along the side face of the first yoke member 186*a* without causing the rotation of the first yoke member 186*a*. Since the lower end of the first yoke member 186*a* is fixed, the first yoke member 186*a* will not rotate even if the rotating member 198*a* does rotate. Therefore, the first yoke member 186*a* deforms when the rotating member 198*a* rotates. Accordingly, the magnets 188*a* provided to the first yoke member 186*a* are displaced.

Similarly, a rotating member 198*b* is provided to the arm shaft 12*b*. The rotating member 198*b* is rotatable in relation to the rotational axis 196 of the outer magnetic ring 184*b*, and has an elliptical cross section in the direction perpendicular to this rotational axis 196. Also, the first yoke member 186*b* is flexible, and part thereof is fixed with respect to the partition 180. In this example, the lower end of this first yoke member 186*b* is fixed to the partition 180 via a fixing base 206. The rotating member 198*b* is provided slidably along the side face of the first yoke member 186*b* without causing the rotation of the first yoke member 186*b*. Since the lower end of the first yoke member 186*b* is fixed, the first yoke member 186*b* will not rotate even if the rotating member 198*b* does rotate. Therefore, the first yoke member 186*b* deforms when the rotating member 198*b* rotates, and the magnets 188*b* on the first yoke member 186*b* are displaced.

The structure of the magnetic couplers in this embodiment will now be described in further detail through reference to FIG. 9. FIG. 9 is a cross section in the direction parallel to the ring plane, that is, perpendicular to the rotational axis 196. FIG. 9 illustrates the magnetic coupler constituted by the inner magnetic ring 182*a* and the outer magnetic ring 184*a*, but the other magnetic coupler constituted by the inner magnetic ring 182*b* and the outer magnetic ring 184*b* has substantially the same structure.

As discussed above, the second yoke member 190*a* that constitutes the outer magnetic ring 184*a* can be disassembled into three yoke pieces 190*a*1, 190*a*2, and 190*a*3. The magnets 192*a* that make up the outer magnetic ring 184*a* are therefore uniformly allotted to three groups. Because of this structure, the various magnets 192*a* can be disposed extremely close to the partition 180. Therefore, the magnetic coupling with the inner magnetic ring 182*a* is can be raised higher than usual.

Also, as shown in FIG. 9, the rotating member 198*a* is a member having an elliptical cross section, and this rotating member 198*a* functions as a so-called cam. A ball bearing 200 is fitted around the outer periphery of the side face of this rotating member 198*a*. The inner ring of this ball bearing 200 is fixed to the rotating member 198*a*, but the outer ring elastically deforms via the balls. This rotating member 198*a* is rotatable in relation to the rotational axis 196, which is approximately the same as the outer magnetic ring 184*a*. In the example shown in FIG. 8, this rotating member 198*a* and the other rotating member 198*b* are rotated and driven by a hollow motor 202 capable of mutually independent drive. However, the motor used here does not have to be a hollow type, as long as it is a mechanism with which the rotation of the rotating members 198*a* and 198*b* can be controlled independently.

A part formed from a metal elastic body is used for the first yoke member 186*a*. This part is in contact via the bearing 200 along the side face of the rotating member 198*a*. Since the lower end of this first yoke member 186*a* is fixed to the fixing base 204, the first yoke member 186*a* will not rotate even if the rotating member 198*a* does rotate. When the rotating member 198*a* rotates, the bearing 200 around the outer periphery thereof rolls around in contact with the inner surface of the first yoke member 186*a*, and the first yoke member 186*a* deforms to conform to the shape of the rotating member 198*a*. Accordingly, the magnets 188*a* attached to the first yoke member 186*a* do not rotate, moving closer to the outer magnetic ring 184*a* side or away from the outer magnetic ring 184*a*.

A roller may be used instead of the bearing 200. It is also favorable to use a needle roller bearing. A gear may also be used in place of these, and a timing belt on which teeth have been formed in a whole number multiple of the number of teeth of the gear may be provided to the inner surface of a rubber material 208 (discussed below).

The part that constitutes the rotating member 198*a* may be a magnetic body, which would be beneficial in terms of the efficient utilization of magnetic force. From the standpoint of eliminating rotational unevenness, however, a nonmagnetic body is preferred.

The elliptical shape of the rotating member 198*a*, that is, the difference between the major and minor axes of the ellipse, should be designed as follows. Specifically, this value is determined so that the magnetic force which comes from the magnets 192*a* constituting the outer magnetic ring 184*a* and acts on the magnets 188*a* located near the minor axis of the first yoke member 186*a* will be approximately 70% or less of the force that acts on the magnets 188*a* located near the major axis. For practical purposes, this difference in axial length is kept at 1 mm or less.

The magnets 188*a* are attached to the first yoke member 186*a* in a state in which they are partially molded into the elastically deforming rubber material 208 (an industrial-use power transmission belt is generally used). When the first yoke member 186*a* deforms, the orientation of the magnets 188*a* changes ever so slightly, but this directional change is absorbed by this rubber material 208. This rubber material 208 is a tough, cylindrical belt composed of roughly the same material and construction as an ordinary timing belt for transmitting the drive force of a motor. This rubber material 208 will not stretch more than 0.1% when subjected to a tensile force of 20 to 30 kg. The magnets 188*a* do not undergo a little directional change because they are embedded in this rubber material 208. The rubber material 208 is about 2 mm thick.

Also, as shown in FIG. 8, a cylindrical leaf spring material 215 is embedded in the connected portion of the rubber material 208 and the first yoke member 186*a*. This leaf spring material 215 has slender slits made in it corresponding to the width of the magnets 188*a*. The magnets 188*a* are fitted into these slits. The lower end of this leaf spring material 215 is fixed to the fixing base 204. Therefore, the first yoke member 186*a* is actually fixed to the fixing base 204 via this leaf spring material 215. It is good to use SUP-7 or another such spring material for this leaf spring material 215, for example. This leaf spring material readily deforms in the radial direction, and has high rigidity in the circumferential direction. Therefore, the magnets 188*a* on the first yoke member 186*a* move smoothly in the radial direction of the magnetic rings, without causing rotation.

Similarly, a leaf spring material 216 is also bonded to the other first yoke member 186*b*, and the lower end of this leaf spring material 216 is fixed to the fixing base 206.

With the structure described above, the magnets 188a are disposed in an elliptical shape. Also, the magnets 188a are disposed such that the adjacent magnetic poles are opposite from one another. In other words, they are disposed such that the magnetic poles are alternately opposite along the side face of the rotating member 198a. The magnets 192a that make up the outer magnetic ring 184a are also disposed such that the adjacent magnetic poles are opposite from one another.

With the arm shaft 12b in this structural example, the number of magnets 188a that make up the inner magnetic ring 182a is less than the number of magnets 192a that make up the outer magnetic ring 184a. Similarly, the number of magnets 188b that make up the inner magnetic ring 182b is less than the number of magnets 192b that make up the outer magnetic ring 184b. In the example shown in FIG. 9, the number of magnets 188a of the inner magnetic ring 182a is 10, and the number of magnets 192a of the outer magnetic ring 184a is 12.

Figure 10:
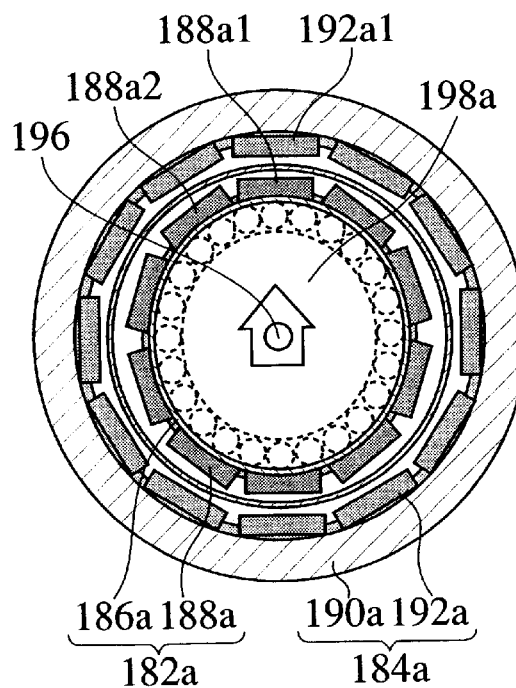
FIG. 10 (including FIGS. 10A, 10B, 10C and 10D) is a cross section used to describe the operation of the arm shaft in the third embodiment.
Figure 10:
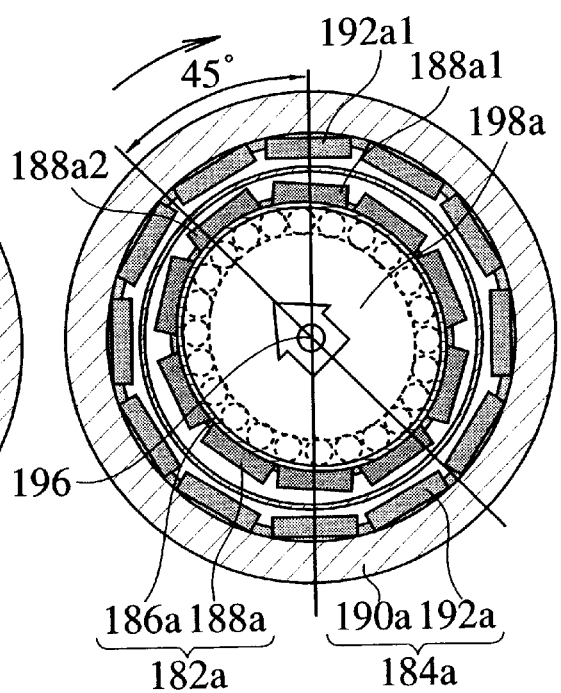
Figure 10:
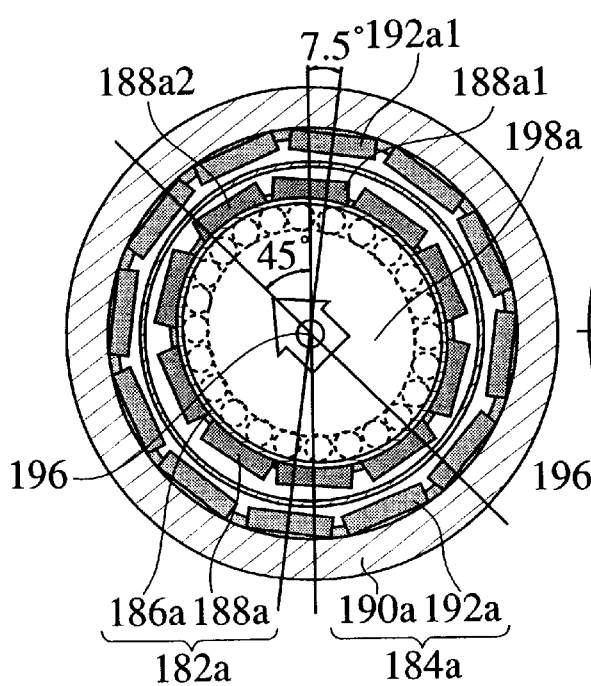
Figure 10:
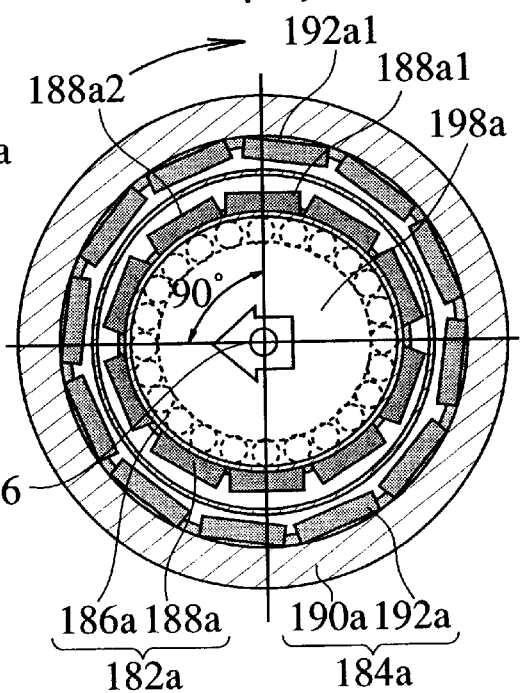
Figure 11:
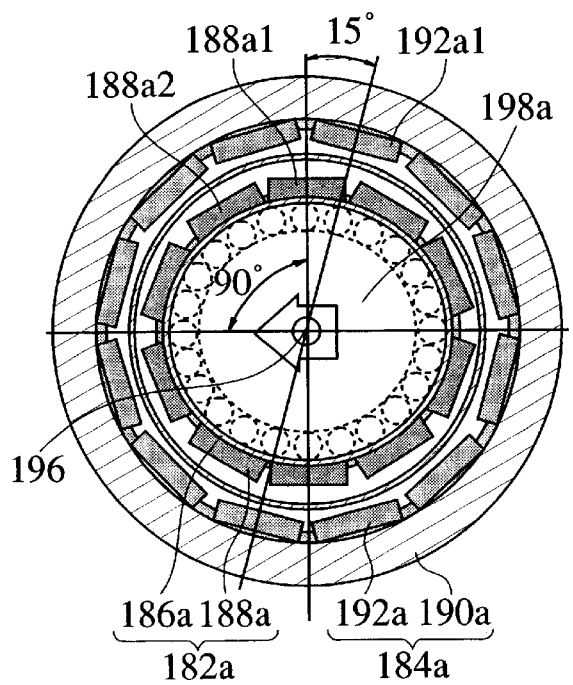
FIG. 11 (including FIGS. 11A, 11B, 11C and 11D) is a cross section used to describe the operation of the arm shaft in the third embodiment.
Figure 11:
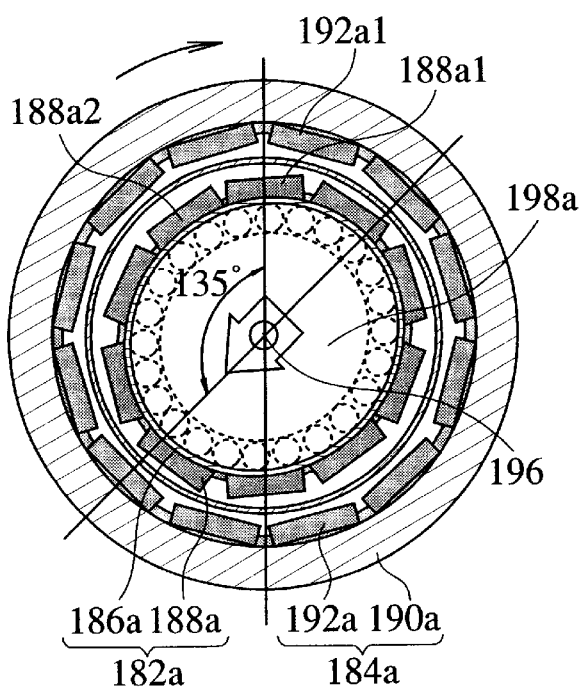
Figure 11:
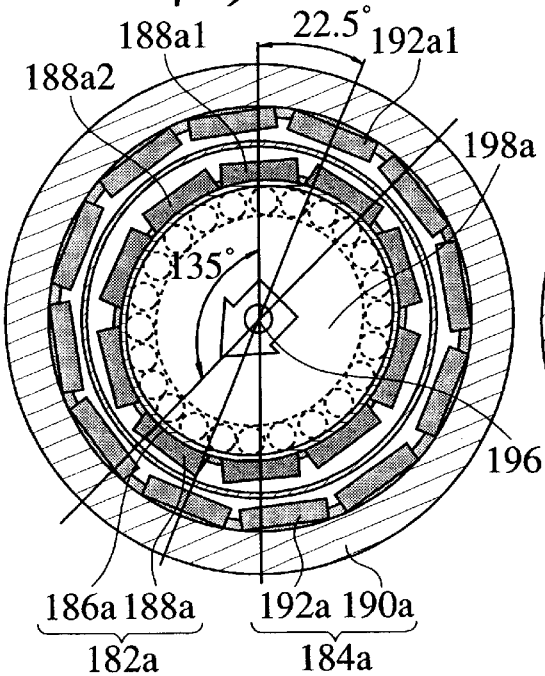
Figure 11:
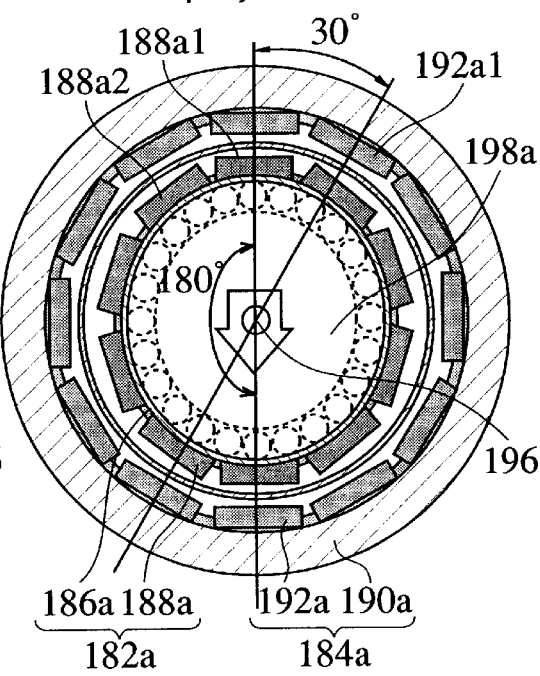

The operation of this arm shaft 12b will now be described through reference to FIGS. 10 and 11. FIGS. 10 and 11 are cross sections provided for the description of the operation of the arm shaft 12b in the third embodiment. FIGS. 10 and 11 illustrate the structure of another magnetic coupler.

FIG. 10A illustrates a state in which the major axis of the rotating member 198a coincides with the vertical direction in the figure. In this state, the magnet 188a1 located on an extension of the major axis of the rotating member 198a is the closest to the outer magnetic ring 184a. This magnet 188a1 is located opposite the magnet 192a1 of the outer magnetic ring 184a. The rotating member 198a begins to rotate from this state (counterclockwise in the figure).

FIG. 10B illustrates a state in which the rotating member 198a has rotated 450 counterclockwise. Here, the above-mentioned magnet 188a1 moves away from the outer magnetic ring 184a. Simultaneously, the adjacent magnet (the magnet located to the left side of the magnet 188a1 in FIG. 10B) 188a2 moves closer to the outer magnetic ring 184a. Thereupon, the outer magnetic ring 184a senses a change in the magnetic field produced from the inner magnetic ring 182a and rotates clockwise.

Here, we will let θ be the rotational angle of the rotating member 198a, n1 be the number of magnets 188a of the inner magnetic ring 182a, and n2 be the number of magnets 192a of the outer magnetic ring 184a. We can then express the rotational angle ω of the outer magnetic ring 184a by the following formula (1).

$$\omega = \theta \times (n2 - n1) \div n2 \quad (1)$$

In this example, n1=10 and n2=12. Therefore, when the rotating member 198a rotates 45°, the outer magnetic ring 184a rotates 7.5° (FIG. 10C).

FIG. 10D illustrates a state in which the rotating member 198a has rotated 90° counterclockwise. Here, the outer magnetic ring 184a rotates 15° clockwise (FIG. 11A).

FIG. 11B illustrates a state in which the rotating member 198a has rotated 135° counterclockwise. Here, the outer magnetic ring 184a rotates 22.50 clockwise (FIG. 11C).

Thus, when the rotating member 198a rotates 180° counterclockwise, the outer magnetic ring 184a rotates 30° clockwise. Therefore, the rotating member 198a makes six rotations for every one rotation of the outer magnetic ring 184a. This arm shaft 12b thus also functions as a speed reducer. In the case of this example, when the rotating member 198a rotates 360°, the outer magnetic ring 184a comes to a position that is shifted from its original position by two of the magnets 192a.

Obviously, if the rotating member 198a rotates clockwise, the movement of the outer magnetic ring 184a will be reversed, and it will instead rotate counterclockwise.

In this example, the number of magnets 188a was kept small in order to facilitate an understanding of the operation, but it is good for there to be about 20 to 30 of the magnets 188a so that the inner magnetic ring 182a will operate more smoothly.

Also, the various magnets all had about the same rectangular parallelepiped shape in this example. The specific size is 5 mm thick, 9 mm wide, and 30 mm high. Neodymium magnets or samarium-cobalt magnets, for example, can be used favorably as the magnets.

Furthermore, in this example, the distance between the surface of the magnet 188a located on an extension of the major axis of the rotating member 198a and the surface of the magnet 192a of the outer magnetic ring 184a opposite this magnet 188a is set at approximately 2 mm. The distance between the surface of the magnet 188a located on an extension of the minor axis of the rotating member 198a and the surface of the magnet 192a of the outer magnetic ring 184a opposite this magnet 188a is set at approximately 3 mm. This structure affords enough rigidity for approximately 5 kg-m of torque to be transmitted. This powerful rigid torque is generated because of the different numbers of magnets on the inner and outer magnetic rings, as described for FIG. 5.

With the arm shaft 12b structured as described above, a shaft that is compact, simple, and highly rigid is realized. Another advantage of this arm shaft 12b is a relatively long service life. Furthermore, because there is no backlash, positioning precision is outstanding. The arm shaft 12b with this structure can not only be applied to a semiconductor manufacturing apparatus, but can also be used favorably as a power transmission mechanism in other industrial fields.

FOURTH EMBODIMENT

Figure 12:
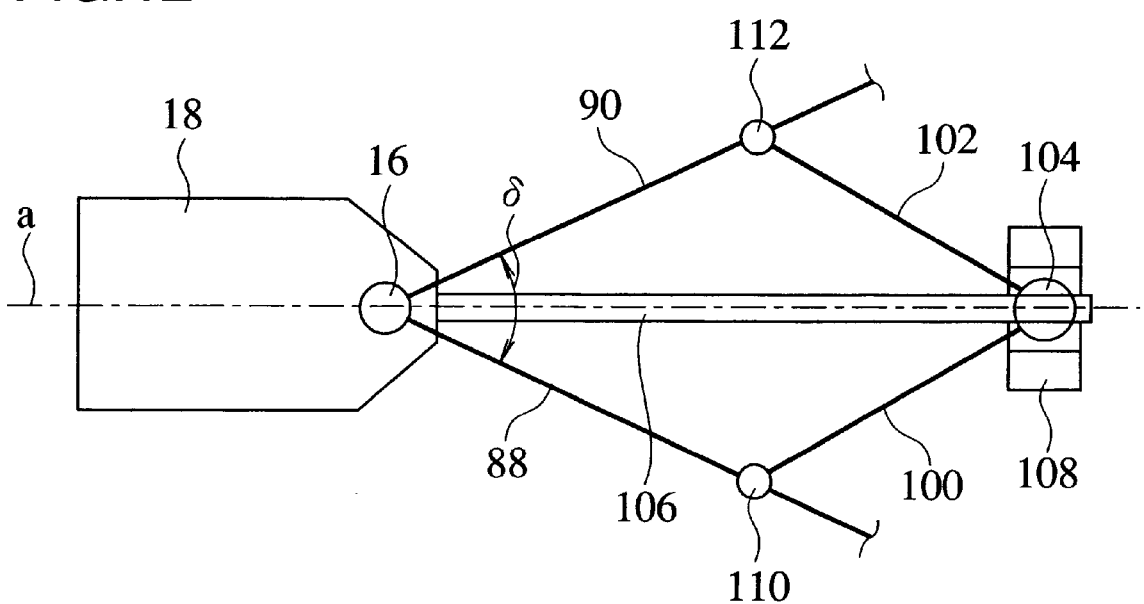
FIG. 12 is a plan view illustrating the structure of the wafer transport arm link in a fourth embodiment.

The main structure of a wafer transport arm link in the fourth embodiment will now be described. FIG. 12 is a plan view illustrating the structure of the wafer transport arm link in the fourth embodiment. In FIG. 12, the various arms are indicated by solid lines, and the various shafts are indicated by circles.

The wafer transport arm link in this embodiment comprises the tray joint shaft 16, a first distal end arm 88, a second distal end arm 90, the wafer placement tray 18, a third joint shaft 110, a fourth joint shaft 112, a first orientation arm 100, a second orientation arm 102, an orientation arm shaft 104, a guide magnet 106, and an orientation magnet 108.

The first and second distal end arms 88 and 90 are rotatable parallel to each other around the tray joint shaft 16. One end of these first and second distal end arms 88 and 90 is rotatably coupled to the tray joint shaft 16. The other ends of these first and second distal end arms 88 and 90 are each coupled to an independent drive source, so the arms can rotate independently of each other and parallel to the plane of the page of FIG. 12.

The above-mentioned wafer placement tray 18 transports wafers placed thereon, and is provided on the tray joint shaft 16.

The third joint shaft 110 is provided to the first distal end arm 88, and the fourth joint shaft 112 is provided to the second distal end arm 90. The first orientation arm 100 is coupled to the first distal end arm 88 via the third joint shaft 110, and the second orientation arm 102 is coupled to the second distal end arm 90 via the fourth joint shaft 112. These first and second orientation arms 100 and 102 are coupled by the orientation arm shaft 104 so that they are rotatable parallel to each other.

The guide magnet 106 is a rod-shaped magnet that is fixed at one end to the wafer placement tray 18 and that extends at the other end in a straight line over the orientation arm shaft 104. The orientation magnet 108 is provided at the location of the orientation arm shaft 104, and the other end of the guide magnet 106 is supported in non-contact fashion by this orientation magnet 108.

Because of this structure, when the first distal end arm 88 and the second distal end arm 90 are driven, this is accompanied by movement of the first orientation arm 100 and the second orientation arm 102, and the position of the orientation arm shaft 104 moves. Here, the orientation of the wafer placement tray 18 is invariable with respect to the direction of extension of the guide magnet 106, that is, to the direction of extension of the straight line connecting the orientation arm shaft 104 and the tray joint shaft 16. Therefore, in this link mechanism, the orientation of the wafer placement tray 18 can be controlled as desired in the course of the extension and retraction of the link.

For instance, with the arm link illustrated in FIG. 12, the distance between the tray joint shaft 16 and the third joint shaft 110 is equal to the distance between the tray joint shaft 16 and the fourth joint shaft 112. Also, the length of the first orientation arm 100 is equal to the length of the second orientation arm 102. Therefore, the extension direction of the guide magnet 106 coincides with the extension direction of a straight line a that divides in two equal parts the angle δ between the first distal end arm 88 and the second distal end arm 90. Thus, the orientation of the wafer placement tray 18 is controlled so that it always coincides with the extension direction of the straight line a.

[Structural Example of Arm Link]

Figure 13:
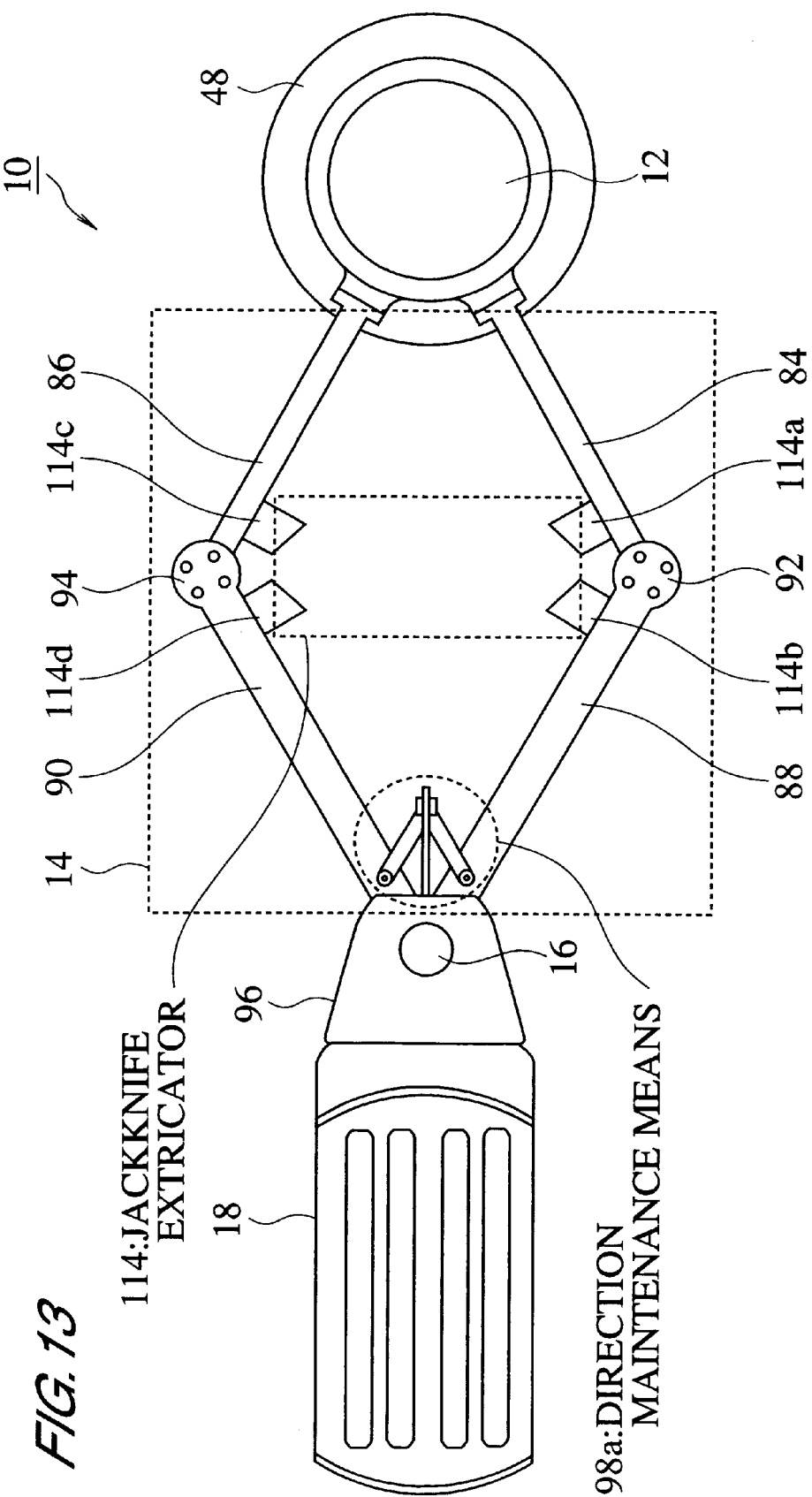
FIG. 13 is a plan view illustrating an example of the structure of the arm link.

Next, a structural example in which the arm link of the fourth embodiment has been applied will be described through reference to FIG. 13. FIG. 13 is a plan view illustrating an example of the structure of the arm link. As described above, the arm link 10 comprises the arm 14 which is rotatable around the arm shaft 12, the tray joint shaft 16 which is provided to the distal end of the arm 14, and the wafer placement tray 18 which is provided on the tray joint shaft 16. The arm 14 comprises a first arm 84 coupled to the first magnetic coupler 32a that constitutes the arm shaft 12, a second arm 86 coupled to the second magnetic coupler 32b that constitutes the arm shaft 12, and the first distal end arm 88 and second distal end arm 90 which are rotatable parallel to each other around the tray joint shaft 16. The arm 14 further comprises a first joint shaft 92 and a second joint shaft 94. The first joint shaft 92 rotatably couples the distal end of the first arm 84 to the distal end of the first distal end arm 88, while the second joint shaft 94 rotatably couples the distal end of the second arm 86 to the distal end of the second distal end arm 90. These shafts 92 and 94 are configured such that they are in the same direction as the arm shaft 12.

The above-mentioned first arm 84 and second arm 86 are formed from rod-shaped materials such that the inter-axial distance between the second joint shaft 94 and the arm shaft 12 (the rotational axis 52) is equal to the inter-axial distance between the first joint shaft 92 and the arm shaft 12 (the rotational axis 52). These are respectively fixed at one end to the first outer shaft 58 and second outer shaft 68 that constitute the arm shaft 12. Therefore, when the rotational motion of the first magnetic coupler 32a is transmitted to the first arm 84, this rotational motion centers around the above-mentioned ends within a plane perpendicular to the rotational axis 52 of the arm shaft 12. Similarly, when the rotational motion of the second magnetic coupler 32b is transmitted to the second arm 86, this rotational motion centers around the above-mentioned ends within a plane perpendicular to the rotational axis 52 of the arm shaft 12. In other words, the first arm 84 and second arm 86 rotate parallel to each other.

The first distal end arm 88 and the second distal end arm 90 are formed from rod-shaped materials such that the inter-axial distance between the tray joint shaft 16 and the first joint shaft 92 is equal to the inter-axial distance between the tray joint shaft 16 and the second joint shaft 94. A bearing is provided to the tray joint shaft 16, and the first distal end arm 88 and the second distal end arm 90 are capable of rotational motion within mutually parallel planes centering around this tray joint shaft 16. The components are disposed such that the axial direction of the tray joint shaft 16 is the same as the axial direction of the arm shaft 12 so that the planes in which this rotational motion is performed will be parallel to the rotational motion planes of the first arm 84 and second arm 86.

As mentioned above, the first joint shaft 92 and the second joint shaft 94 are provided to the distal ends on the opposite side of the first arm 84 and the second arm 86. The first joint shaft 92 and the second joint shaft 94 are provided at locations such that the distances between them and the arm shaft 12 are mutually equal. One end of the first distal end arm 88 on the opposite side from the tray joint shaft 16 is coupled via a bearing to the first joint shaft 92. Similarly, one end of the second distal end arm 90 on the opposite side from the tray joint shaft 16 is coupled via a bearing to the second joint shaft 94. The distances between the tray joint shaft 16 and the first joint shaft 92 and second joint shaft 94 do not necessarily have to be equal to the distances between the arm shaft 12 and the first joint shaft 92 and second joint shaft 94.

The link mechanism of the arm 14 that constitutes the arm link 10 therefore primarily consists of one arm shaft 12, two arm joint shafts (the first joint shaft 92 and the second joint shaft 94), one tray joint shaft 16, and four arms (the first arm 84, second arm 86, first distal end arm 88, and second distal end arm 90). Thus, a link with an approximate diamond shape is formed, resulting in an arm link that extends and retracts straight ahead and rotates, with the arm shaft 12 as its base point. Furthermore, the operating planes of the various arms are parallel to one another, and the arms are assembled in a state in which these planes are accurately perpendicular to the arm shaft 12. Thus, the link has a simple construction and high rigidity, allowing wafers to be transported quickly and with high precision.

Figure 14:
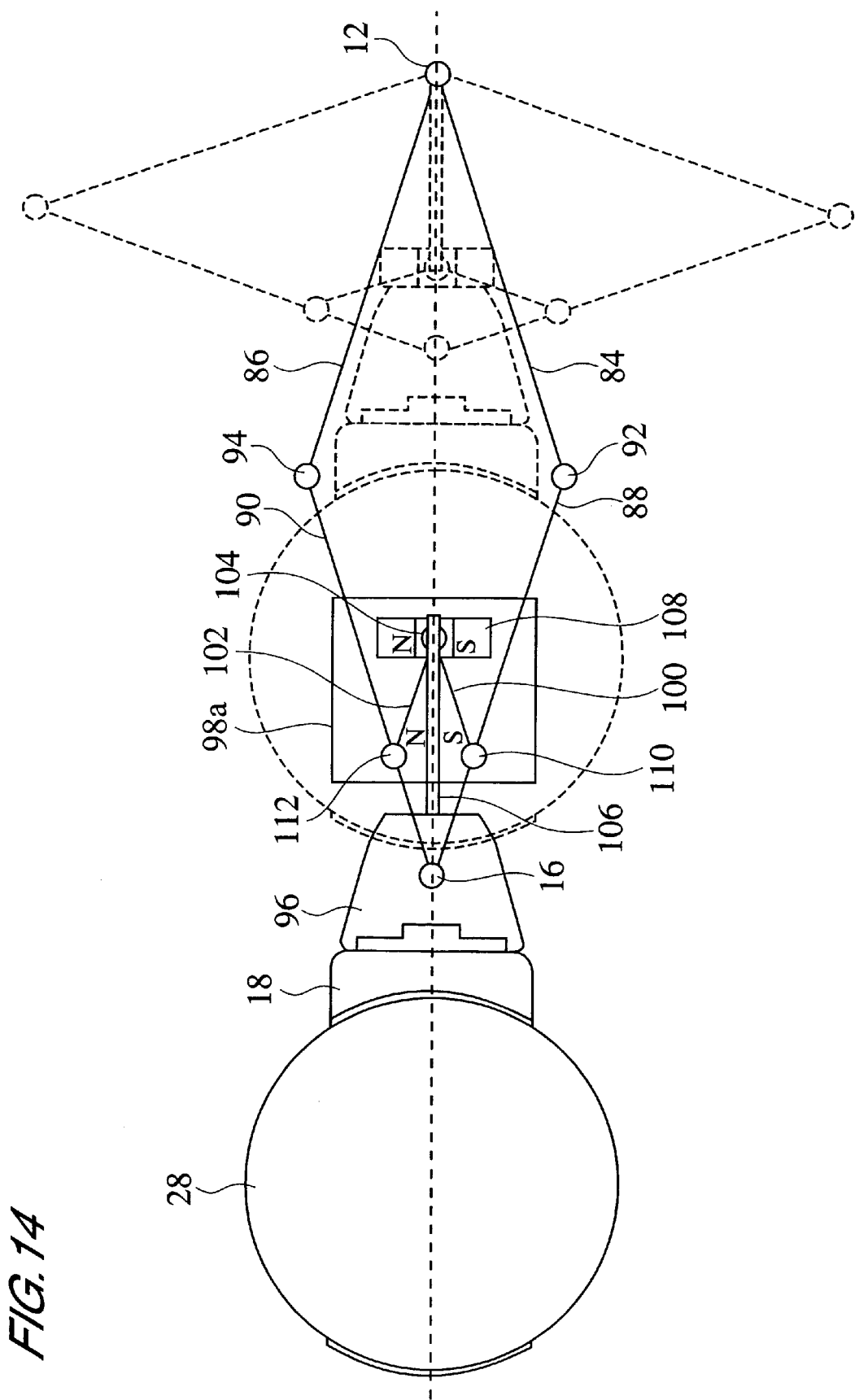
FIG. 14 is a plan view illustrating the structure of the arm link and the movement locus of the arm.

FIG. 14 is a plan view illustrating the structure of the arm link and the movement locus of the arm. In FIG. 14, the arm 14 is depicted in its extended state by solid lines, and in its retracted state by broken lines. The various arms are shown in simplified form by single lines, and the shafts are depicted by circles.

As shown in FIG. 14, the arm 14 extends and retracts when the first magnetic coupler 32a and second magnetic coupler 32b that constitute the arm shaft 12 rotate backward at mutually equal angular velocities. For example, in FIG. 14, when the arm 14 is in its extended state, the first magnetic coupler 32a is rotated to the left. This rotational force is transmitted to the first arm 84, causing the first arm 84 to rotate to the left. At the same time, the second magnetic coupler 32b is rotated to the right, and the rotational force thereof is transmitted to the second arm 86, causing the second arm 86 to rotate to the right. In this case, since the first arm 84 and the second arm 86 move away from one another, the first joint shaft 92 and the second joint shaft 94 also move away from one another and are pulled toward the arm shaft 12. This motion is transmitted to the first distal end arm 88 and the second distal end arm 90 as well, causing them to move, and the tray joint shaft 16 is pulled toward the arm shaft 12. Thus, the arm 14 retracts.

Conversely, when the arm 14 is in its retracted state, the first magnetic coupler 32a is rotated to the right. This rotational force is transmitted to the first arm 84, causing the first arm 84 to rotate to the right. At the same time, the second magnetic coupler 32b is rotated to the left, and the rotational force thereof is transmitted to the second arm 86, causing the second arm 86 to rotate to the left. In this case, since the first arm 84 and the second arm 86 move toward one another, the first joint shaft 92 and the second joint shaft 94 also move toward another and move away from the arm shaft 12. This motion is transmitted to the first distal end arm 88 and the second distal end arm 90 as well, causing them to move, and the tray joint shaft 16 moves farther away from the arm shaft 12. Thus, the arm 14 extends.

When the orientation of the arm 14 is changed, the first magnetic coupler 32a and the second magnetic coupler 32b are rotated in the same direction at equal angular velocities. For example, when the arm 14 is to be rotated to the right, the first magnetic coupler 32a and the second magnetic coupler 32b are rotated to the right. Conversely, when the arm 14 is to be rotated to the left, the first magnetic coupler 32a and the second magnetic coupler 32b should be rotated to the left.

[Structure of Direction Maintenance Means]

Next, the direction maintenance mechanism of the wafer placement tray 18 will be described. This direction maintenance mechanism is achieved by the structure described through reference to FIG. 12. As shown in FIGS. 13 and 14, a tray stopper 96 is attached to the tray joint shaft 16 in a state in which the former can rotate in the same axial direction as the arm shaft 12. The wafer placement tray 18 is fixed to this tray stopper 96. The arm link 10 in this structural example is equipped with a direction maintenance means 98a of the wafer placement tray 18. This direction maintenance means 98a comprises the third joint shaft 110, the fourth joint shaft 112, the first orientation arm 100, the second orientation arm 102, the orientation arm shaft 104, the guide magnet 106, and the orientation magnet 108.

The above-mentioned third joint shaft 110 is provided to the first distal end arm 88, and the fourth joint shaft 112 is provided to the second distal end arm 90. One end of the first orientation arm 100 is coupled to the first distal end arm 88 via the third joint shaft 110. One end of the second orientation arm 102 is coupled to the second distal end arm 90 via the fourth joint shaft 112. The other ends of the first orientation arm 100 and second orientation arm 102 are coupled to the above-mentioned orientation arm shaft 104 in a state in which they overlap. This orientation arm shaft 104 results in the first orientation arm 100 and the second orientation arm 102 being coupled rotatably parallel to each other.

In order for the orientation arm shaft 104 to be located on the straight line connecting the tray joint shaft 16 and the arm shaft 12, both the first orientation arm 100 and the second orientation arm 102 are of a length such that the inter-axial distance between the third joint shaft 110 and the orientation arm shaft 104 is equal to the inter-axial distance between the fourth joint shaft 112 and the orientation arm shaft 104. The third joint shaft 110 and the fourth joint shaft 112 are provided at symmetrical positions in relation to the straight line connecting the arm shaft 12 and the tray joint shaft 16. In order for the entire arm 14 to fit in the arm chamber 20 without running out of room when the arm 14 has retracted to its shortest position, the interaxial distance between the orientation arm shaft 104 and the third joint shaft 110 and the inter-axial distance between the orientation arm shaft 104 and the fourth joint shaft 112 are within a range of from a distance substantially equal to the inter-axial distance between the tray joint shaft 16 and the third joint shaft 110 and the inter-axial distance between tray joint shaft 16 and the fourth joint shaft 112, to a distance of the square root of two times this inter-axial distance. Because of this structure, the first orientation arm 100 and the second orientation arm 102 operate in the same way as the first arm 84 and the second arm 86, respectively.

The above-mentioned guide magnet 106 serves to guide the wafer placement tray 18 toward the arm shaft 12 so that the orientation of the wafer placement tray 18 will stay the same. This guide magnet 106 is a rod-shaped permanent magnet with good parellelism, and one end thereof is fixed to the tray stopper 96. The coupled portion of the guide magnet 106 and the tray stopper 96 is located on the straight line connecting the arm shaft 12 and the tray joint shaft 16. The rod-shaped guide magnet 106 is parallel to the various arms that make up the direction maintenance means 98a and the arm 14. The other end of this guide magnet 106 extends in a straight line over the orientation arm shaft 104. The direction of this extension coincides with the direction of the straight line connecting the arm shaft 12 and the tray joint shaft 16 in a stationary state.

The above-mentioned orientation magnet 108 is provided so as to surround the guide magnet 106 at the location of the orientation arm shaft 104. This orientation magnet 108 is provided so as to be rotatable in the same axial direction as the arm shaft 12. In this example, two magnets with approximately equal magnetic force disposed in a holder are used as the orientation magnet 108. These magnets are apart from one another with a specific gap in between, and are disposed in the holder such that their respective north and south poles face each other. If the surface of this holder is coated with nickel or another such magnetic material, a closed magnetic path will be formed between the disposed magnets, and a strong, stable magnetic field that does not affect the surrounding magnetic conditions will be obtained. This holder is provided at the location of the orientation arm shaft 104 via a bearing. Here, the orientation magnet 108 is attached such that the center position of the gap between the magnets is located on the straight line connecting the tray joint shaft 16 and the arm shaft 12.

The above-mentioned guide magnet 106 is structured so as to pass between the two magnets that make up the orientation magnet 108. The magnetic poles of the guide magnet 106 are made the same as the poles of the magnets of the opposing orientation magnet 108. Therefore, the guide magnet 106 is repelled from both opposing sides at approximately the same magnitude of force by the two magnets that make up the orientation magnet 108, and therefore stops at the point where these forces balance out. In other words, the center of the rod magnet (the guide magnet 106) is supported in non-contact fashion by repelling magnetic forces so as to be located in the approximate center of the gap between the magnets of the orientation magnet 108. Thus, the extension or retraction of the arm 14 causes the orientation arm shaft 104 to move along the straight line connecting the tray joint shaft 16 and the arm shaft 12. As a result, the wafer placement tray 18 can always be kept in a state in which it faces a specific direction, namely, the direction determined by the positional relationship of the tray joint shaft 16 and the arm shaft 12, regardless of the extension or retraction of the arm 14.

From the standpoint of the precision of the wafer placement position, it is preferable for the distance between the pole faces of the guide magnet 106 and the pole faces of the orientation magnet 108 to be set at about 0.1 to 0.5 mm. Furthermore, because of the need for wafer placement position precision, it is preferable for the degree of parallelism of the pole faces of the guide magnet 106 to be 0.02 mm or less. If so, then even if there is a certain amount of disparity in the magnetic force of the rod magnet, since the pole faces of the rod magnet are parallel, the stable point of the rod magnet will still pass through the center of the above-mentioned gap.

[Variation Example of the Direction Maintenance Means (1)]

Figure 15:
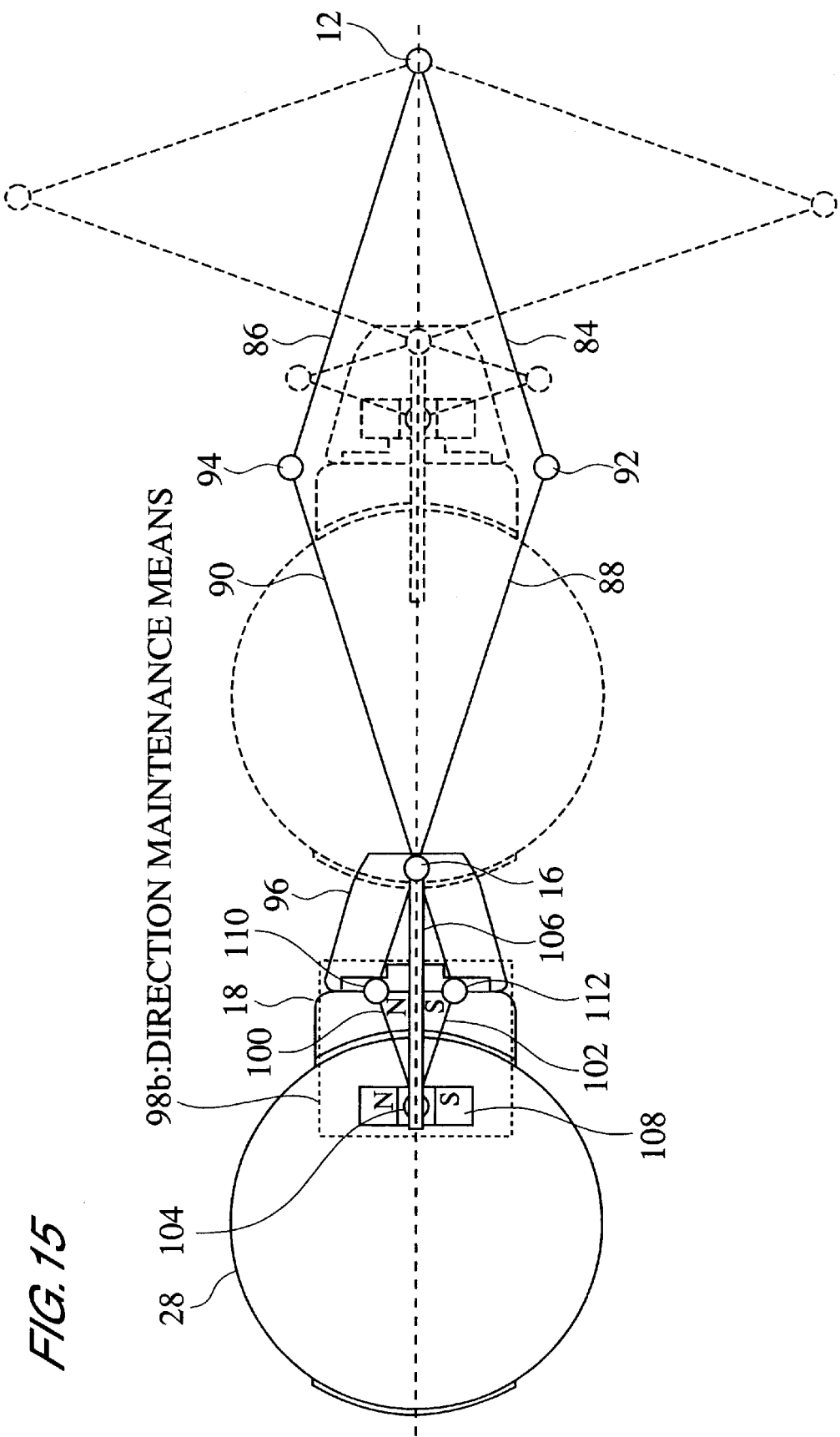
FIG. 15 is a plan view illustrating a first variation example of the arm link and the movement locus of the arm.

Next, a first variation example of the direction maintenance means will be described through reference to FIG. 15. FIG. 15 is a plan view illustrating a first variation example of the direction maintenance means (first variation example of the arm link) and the movement locus of the arm. The direction maintenance means 98*b* in this example also comprises the first orientation arm 100, the second orientation arm 102, the orientation arm shaft 104, the guide magnet 106, and the orientation magnet 108.

In this structural example, the position where the first distal end arm 88 and the second distal end arm 90 are coupled to the tray joint shaft 16 is moved closer to the arm shaft 12, and the distal end portions of the first distal end arm 88 and the second distal end arm 90 are extended further so that they go beyond the tray joint shaft 16 and reach the wafer placement tray 18. The distal end of the extended portion of the first distal end arm 88 is coupled to one end of the first orientation arm 100 via the third joint shaft 110. The distal end of the extended portion of the second distal end arm 90 is coupled to one end of the second orientation arm 102 via the fourth joint shaft 112. The orientation arm shaft 104 is on the wafer placement tray 18 and located on the straight line connecting the tray joint shaft 16 and the arm shaft 12. Thus, the first orientation arm 100 and the second orientation arm 102 are coupled at the location of the orientation arm shaft 104 on the wafer placement tray 18. Therefore, the orientation magnet 108 is also located on the wafer placement tray 18. The guide magnet 106 is fixed to the tray stopper 96 so as to extend between the orientation arm shaft 104 and the tray joint shaft 16.

Because of this structure, the first orientation arm 100 and the second orientation arm 102 operate in the same way as the second distal end arm 90 and the first distal end arm 88, respectively. Thus, the extension or retraction of the arm 14 causes the orientation arm shaft 104 to move along the straight line connecting the tray joint shaft 16 and the arm shaft 12. As a result, the wafer placement tray 18 can always be kept in a state in which it faces a specific direction, namely, the direction determined by the positional relationship of the tray joint shaft 16 and the arm shaft 12, regardless of the extension or retraction of the arm 14.

[Variation Example of the Direction Maintenance Means (2)]

Figure 16:
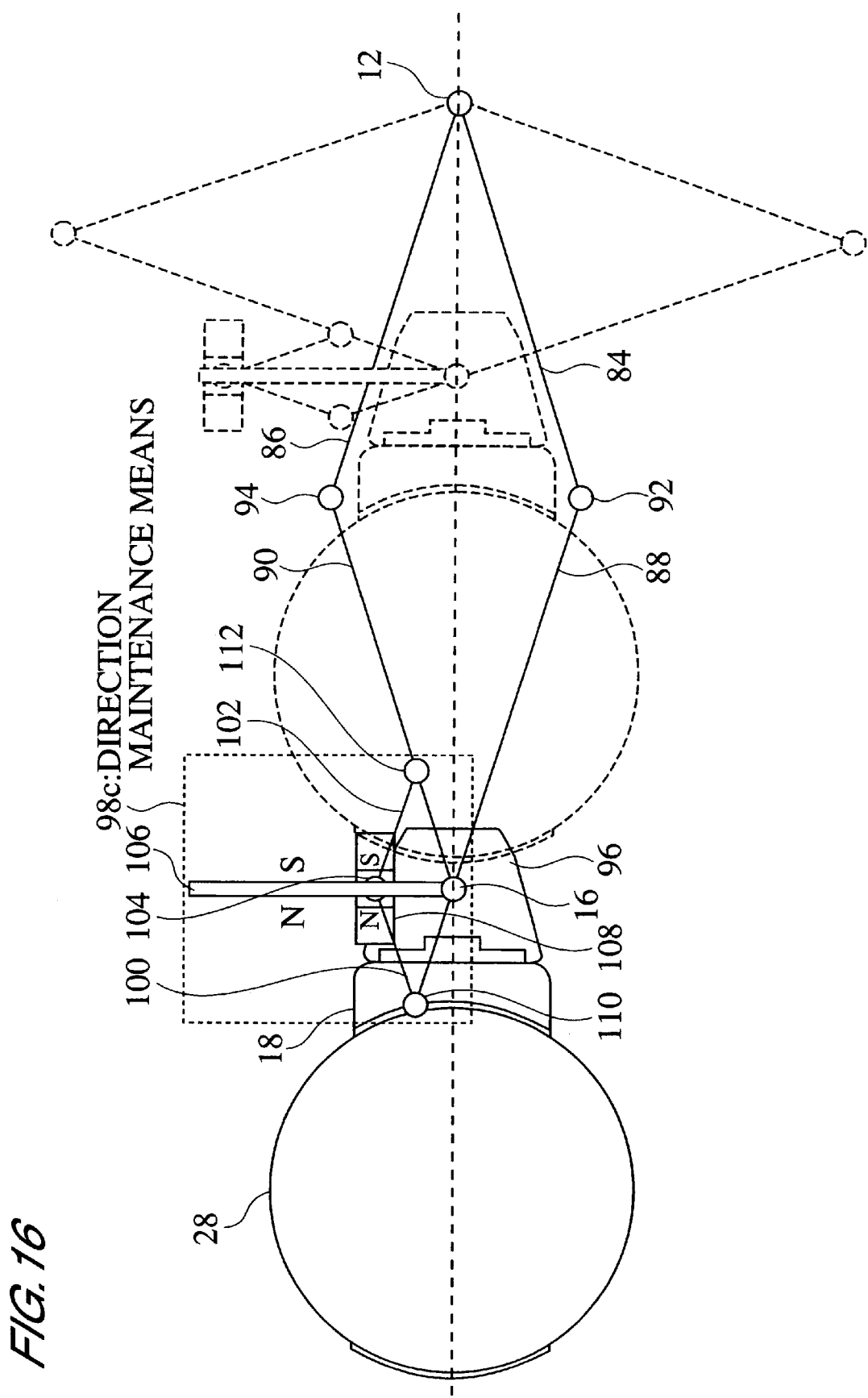
FIG. 16 is a plan view illustrating a second variation example of the arm link and the movement locus of the arm.

Next, a second variation example of the direction maintenance means will be described through reference to FIG. 16. FIG. 16 is a plan view illustrating a second variation example of the direction maintenance means (second variation example of the arm link) and the movement locus of the arm. The direction maintenance means 98*c* in this example also comprises the first orientation arm 100, the second orientation arm 102, the orientation arm shaft 104, the guide magnet 106, and the orientation magnet 108.

In this structural example, the first distal end arm 88 is made longer than the second distal end arm 90. Also, the middle of the first distal end arm 88 and the distal end of the second distal end arm 90 are coupled at the tray joint shaft 16. Accordingly, the distal end portion of the first distal end arm 88 goes beyond the tray joint shaft 16 and reaches the wafer placement tray 18. The distal end of the extended portion of the first distal end arm 88 is coupled to one end of the first orientation arm 100 via the third joint shaft 110. The middle portion of the second distal end arm 90 is coupled to one end of the second orientation arm 102 via the fourth joint shaft 112. Here, the straight line connecting the third joint shaft 110 and the fourth joint shaft 112 is parallel to the straight line connecting the arm shaft 12 and the tray joint shaft 16.

The orientation arm shaft 104 is on the tray stopper 96 and is disposed at a location in the figure higher than the straight line connecting the arm shaft 12 and the tray joint shaft 16. The orientation magnet 108 is also disposed at the location. The straight line connecting the orientation arm shaft 104 and the tray joint shaft 16 is perpendicular to the straight line connecting the arm shaft 12 and the tray joint shaft 16. Thus, the guide magnet 106 is fixed to the tray stopper 96 so as to extend in a direction perpendicular to the straight line connecting the arm shaft 12 and the tray joint shaft 16.

Because of this structure, the extension or retraction of the arm 14 causes the orientation arm shaft 104 to move along a straight line perpendicular to the straight line connecting the tray joint shaft 16 and the arm shaft 12. As a result, the wafer placement tray 18 can always be kept in a state in which it faces a specific direction, namely, the direction determined by the positional relationship of the tray joint shaft 16 and the arm shaft 12, regardless of the extension or retraction of the arm 14.

[Variation Example of the Direction Maintenance Means (3)]

Figure 17:
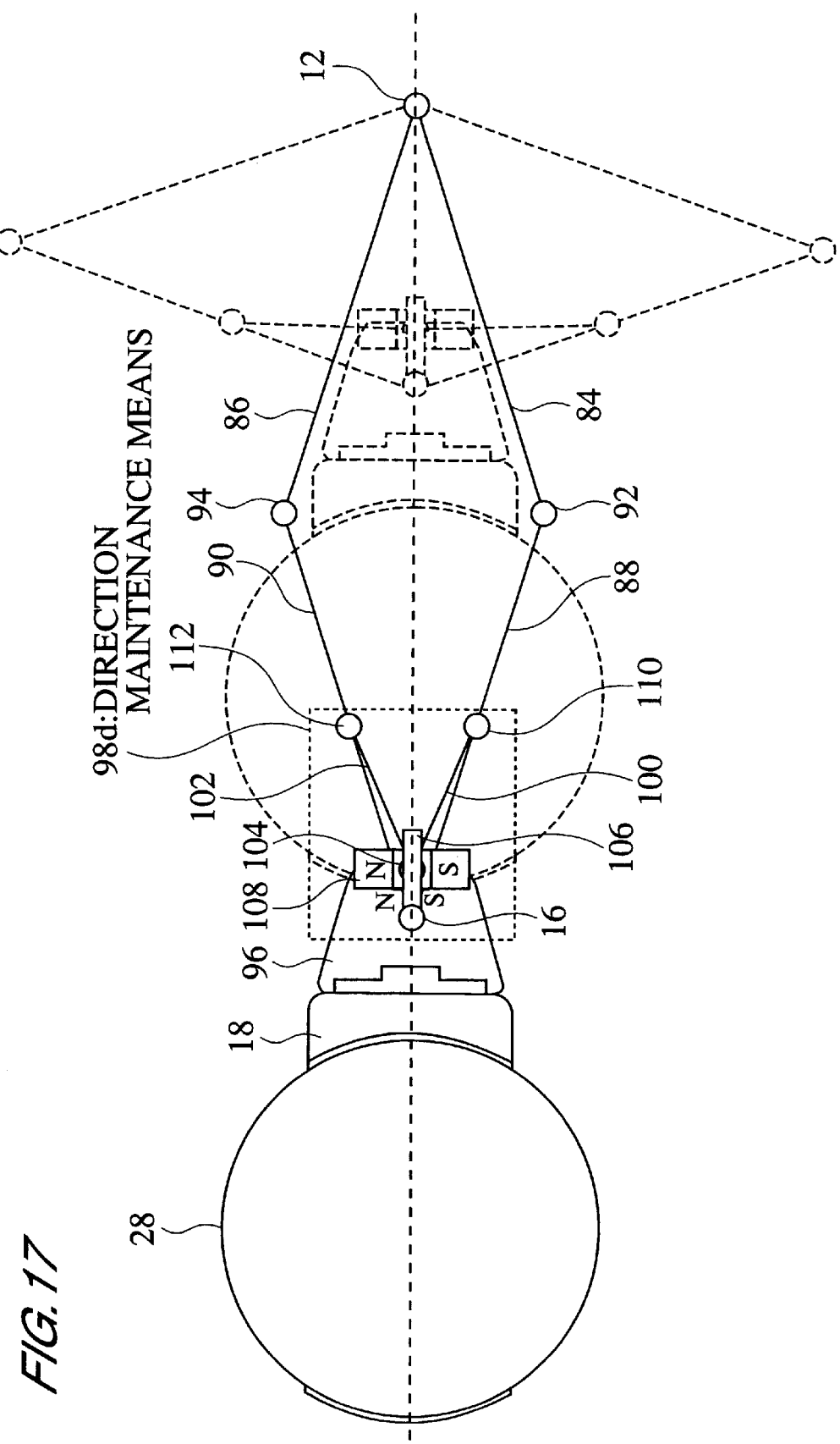
FIG. 17 is a plan view illustrating a third variation example of the arm link and the movement locus of the arm.

Next, a third variation example of the direction maintenance means will be described through reference to FIG. 17. FIG. 17 is a plan view illustrating a third variation example of the direction maintenance means (third variation example of the arm link) and the movement locus of the arm. The direction maintenance means 98*d* in this example also comprises the first orientation arm 100, the second orientation arm 102, the orientation arm shaft 104, the guide magnet 106, and the orientation magnet 108.

In this structural example, the orientation arm shaft 104 is located on the tray stopper 96. The first orientation arm 100 and the second orientation arm 102 are each coupled at one end by this orientation arm shaft 104. The first orientation arm 100 and the second orientation arm 102 are each coupled at the other end to the first distal end arm 88 and the second distal end arm 90 via the third joint shaft 110 and the fourth joint shaft 112, respectively.

The orientation magnet 108 is provided at the same location as the orientation arm shaft 104. The guide magnet 106 is configured such that the extension direction thereof is parallel to the straight line connecting the arm shaft 12 and the tray joint shaft 16, and the center of the guide magnet 106 is located on this straight line.

Because of this structure, the extension or retraction of the arm 14 causes the orientation arm shaft 104 to move along the straight line connecting the tray joint shaft 16 and the arm shaft 12. As a result, the wafer placement tray 18 can always be kept in a state in which it faces a specific direction, namely, the direction determined by the positional relationship of the tray joint shaft 16 and the arm shaft 12, regardless of the extension or retraction of the arm 14.

The wafer transport arm link described above makes use of magnets for the direction maintenance mechanism of the wafer placement tray 18, but the direction maintenance mechanism does not have to use magnets.

FIFTH EMBODIMENT

Figure 18:
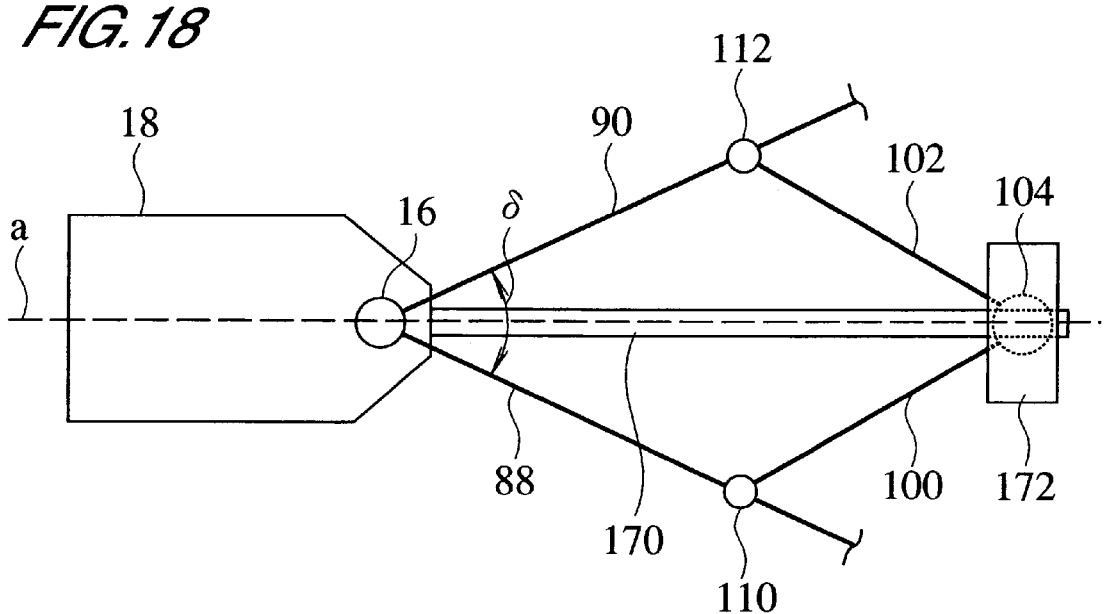
FIG. 18 is a plan view illustrating the structure of the wafer transport arm link in a fifth embodiment.

Next, another example of a wafer transport arm link will be described for the fifth embodiment. FIG. 18 is a plan view illustrating the main components of the wafer transport arm link of the fifth embodiment. In FIG. 18, the various arms are indicated by solid lines, and the various shafts are indicated by circles. The wafer transport arm link in this embodiment comprises the tray joint shaft 16, the first distal end arm 88, the second distal end arm 90, the wafer placement tray 18, the third joint shaft 110, the fourth joint shaft 112, the first orientation arm 100, the second orientation arm 102, the orientation arm shaft 104, a shaft 170, and a bearing 172. Specifically, the arm link in this embodiment comprises the shaft 170 and the bearing 172 in place of the guide magnet 106 and the orientation magnet 108 described in the fourth embodiment. The rest of the structure is the same as that of the fourth embodiment, and so will not be described.

The shaft 170 is a rod-shaped member, one end of which is fixed to the wafer placement tray 18, and the other of which extends in a straight line over the orientation arm shaft 104. The above-mentioned bearing 172 is provided at the location of the orientation arm shaft 104, and serves to slidably support the shaft 170. It is favorable for the bearing 172 to be a ball spline type.

Because of this structure, when the first distal end arm 88 and the second distal end arm 90 are driven, this is accompanied by movement of the first orientation arm 100 and the second orientation arm 102, and the position of the orientation arm shaft 104 moves. Here, the orientation of the wafer placement tray 18 is invariable with respect to the direction of extension of the shaft 170, that is, to the direction of extension of the straight line connecting the orientation arm shaft 104 and the tray joint shaft 16. Therefore, in this link mechanism, the orientation of the wafer placement tray 18 can be controlled as desired in the course of the extension and retraction of the link.

With the arm link shown in FIG. 18, the distance between the tray joint shaft 16 and the third joint shaft 110 is equal to the distance between the tray joint shaft 16 and the fourth joint shaft 112. Also, the length of the first orientation arm 100 is equal to the length of the second orientation arm 102. Therefore, the extension direction of the shaft 170 coincides with the extension direction of a straight line a that divides in two equal parts the angle δ between the first distal end arm 88 and the second distal end arm 90. Thus, the orientation of the wafer placement tray 18 is controlled so that it always coincides with the extension direction of the straight line a.

As described through reference to FIGS. 15, 16, and 17, the way the direction maintenance mechanism is provided is not limited to the example illustrated in FIG. 18.

SIXTH EMBODIMEMT

Figure 19:
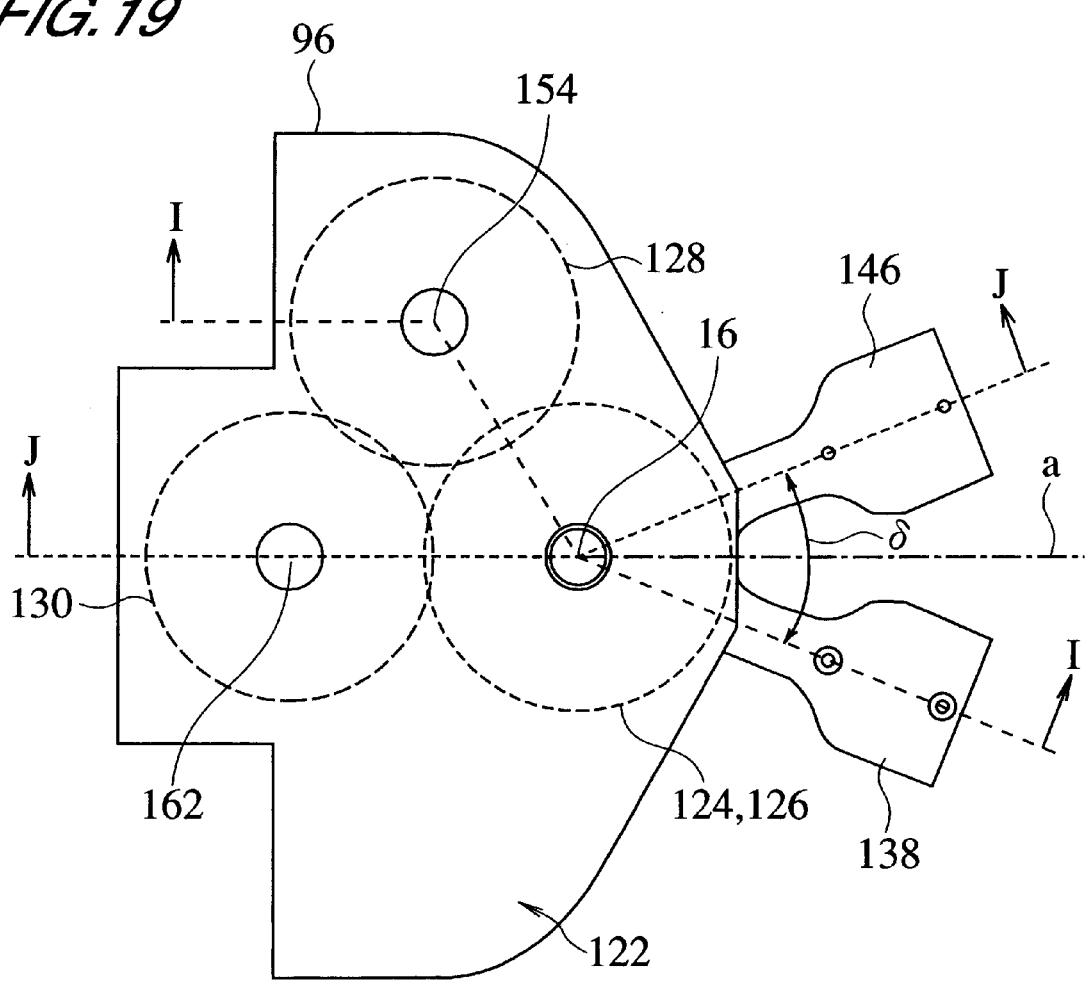
FIG. 19 is a plan view of the main components of the wafer transport arm link in a sixth embodiment.
Figure 20:
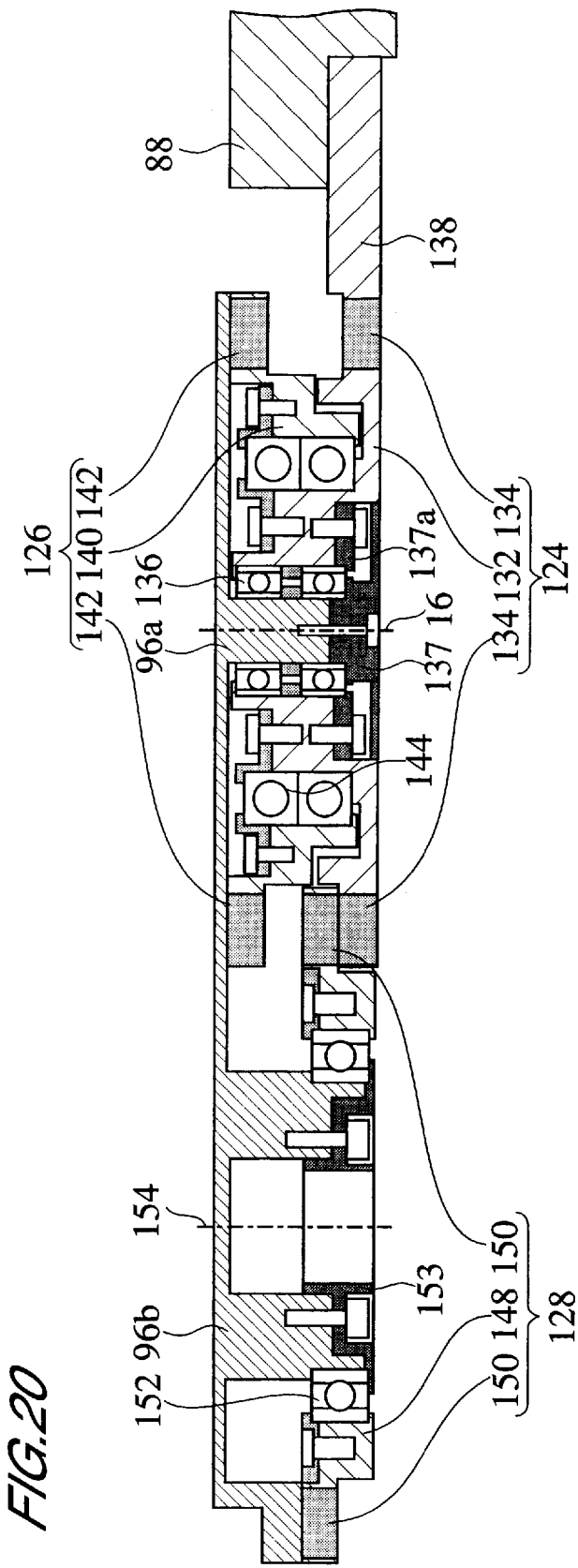
FIG. 20 is a cross section illustrating the main components (along the I—I line) of the wafer transport arm link in the sixth embodiment.
Figure 21:
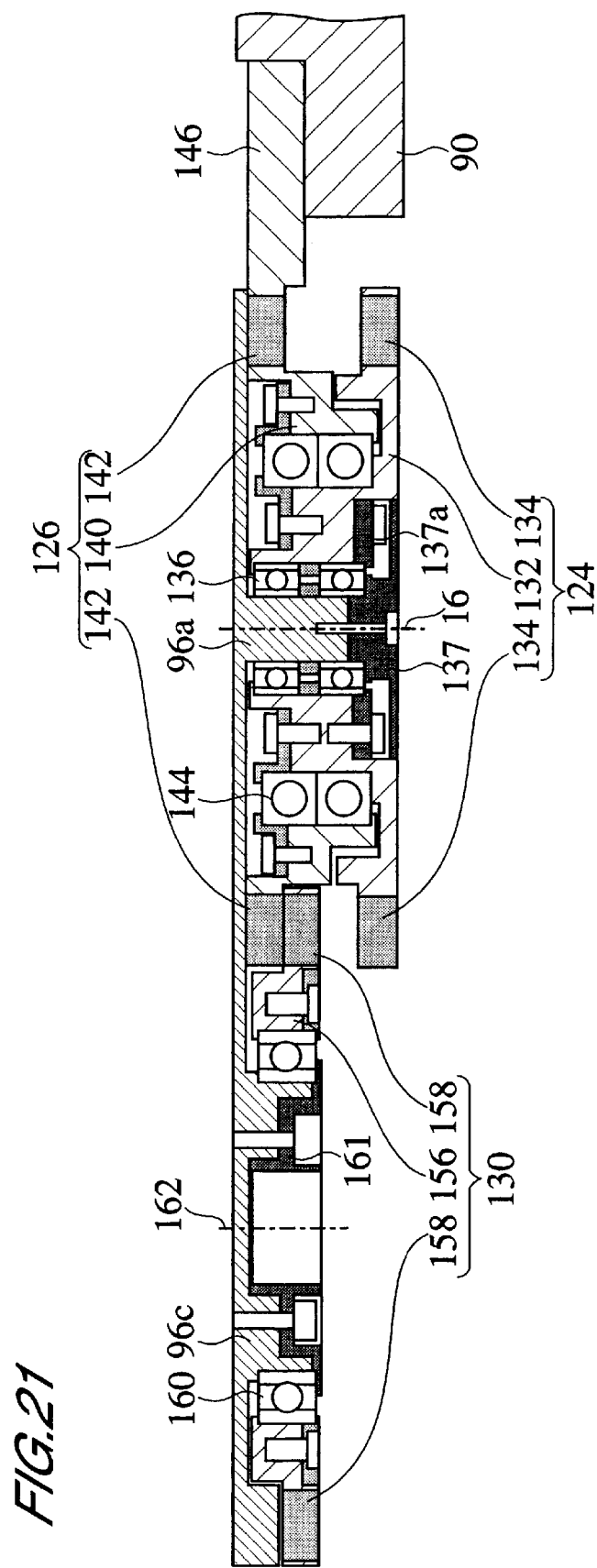
FIG. 21 is a cross section illustrating the main components (along the J—J line) of the wafer transport arm link in the sixth embodiment.

The structure of another wafer transport arm link will now be described for the sixth embodiment through reference to FIGS. 19, 20 and 21. FIG. 19 is a plan view illustrating the main components of the wafer transport arm link in the sixth embodiment. In FIG. 19, the portion of the direction maintenance means 122 provided in the vicinity of the tray joint shaft 16 is shown enlarged. FIG. 20 is a cross section illustrating the main components (along the I—I line) of the wafer transport arm link in the sixth embodiment. FIG. 20 illustrates a cross section along the I—I line in FIG. 19. FIG. 21 is a cross section illustrating the main components (along the J—J line) of the wafer transport arm link in the sixth embodiment. FIG. 21 illustrates a cross section along the J—J line in FIG. 19.

The direction maintenance means 122 in this example comprises a first magnetic ring 124, a second magnetic ring 126, a third magnetic ring 128, and a fourth magnetic ring 130 in which a plurality of magnets are arranged and maintained in a ring shape. These magnetic rings 124 to 130 each primarily consist of a ring-shaped member and a plurality of magnets. The magnets are attached to the surface of the ring-shaped member in the form of a ring, and in this example, in a circular shape. However, the radii thereof do not necessarily have to be the same since, as shown in FIGS. 20 and 21, the disposition is such that the inter-axial distances are kept equal and the pole faces of the magnets in each magnetic ring overlap somewhat. The magnets that make up these magnetic rings are disposed in the region covering the rotational ranges of arm joining members 138 and 146. The pole faces of the magnets should be aligned in the same direction as the tray joint shaft 16, and for practical purposes the arrangement of the pole faces should be such that adjacent poles are different. Because of this structure, the location that is equidistant from the magnets is the rotational center axis, providing a function as a magnetic ring. The magnetic rings 124 to 130 are attached to the tray stopper 96 via bearings.

The first magnetic ring 124 and the second magnetic ring 126 are each provided rotatably with the tray joint shaft 16 as the rotational axis. The first distal end arm 88 and the second distal end arm 90 are coupled to the first magnetic ring 124 and the second magnetic ring 126, respectively.

The first magnetic ring 124 comprises a ring-shaped member 132 and a specific number of magnets 134 attached to this ring-shaped member 132. This ring-shaped member 132 is attached to the tray stopper 96 via a bearing 136. This bearing 136 is part of the tray stopper 96, and is fitted into a tray stopper portion 96*a* that is in the form of a cylinder protruding in the direction of extension of the tray joint shaft 16. The bearing 136 is fixed to the tray stopper portion 96*a* by bearing retainers 137 and 137*a*. The magnets 134 are disposed in a plane perpendicular to the tray joint shaft 16 and at a location on the ring-shaped member 132, equidistantly spaced away from the tray joint shaft 16.

The arm joining member 138 serves as one end of the ring-shaped member 132. This arm joining member 138 is a plate that extends perpendicular to the tray joint shaft 16, and the other end thereof is connected to the distal end of the first distal end arm 88. With this structure, the first distal end arm 88 rotates around the tray joint shaft 16, and the first magnetic ring 124 rotates with the tray joint shaft 16 as its rotational axis.

The second magnetic ring 126 comprises a ring-shaped member 140 and a specific number of magnets 142 attached to this ring-shaped member 140. This ring-shaped member 140 is attached to the ring-shaped member 132 that constitutes the first magnetic ring 124 via a bearing 144. This bearing 144 is part of the ring-shaped member 132, and is fitted into a portion in the form of a cylinder extending in the same direction as the tray joint shaft 16. The bearing 144 is fixed by being pressed toward the tray stopper 96 by the ring-shaped member 132. The magnets 142 are disposed in a plane perpendicular to the tray joint shaft 16 and at a location on the ring-shaped member 140, equidistantly spaced away from the tray joint shaft 16.

The arm joining member 146 serves as one end of the ring-shaped member 140. This arm joining member 146 is a plate that extends perpendicular to the tray joint shaft 16, and the other end thereof is connected to the distal end of the second distal end arm 90. With this structure, the second distal end arm 90 rotates around the tray joint shaft 16, and the second magnetic ring 126 rotates with the tray joint shaft 16 as its rotational axis.

As described above, the first magnetic ring 124 and the second magnetic ring 126 are provided around the same shaft (the tray joint shaft 16), forming a two-layer coaxial construction. In FIGS. 20 and 21, because the magnetic rings 124 and 126 have the same diameter (the distance from the tray joint shaft 16 to the magnets 134 or 144), the magnetic rings 124 and 126 are provided in a state in which they are stacked vertically with respect to the axial extension direction of the tray joint shaft 16. This does not necessarily have to be the case. In this structural example, the first magnetic ring 124 is provided at a location comparatively remote from the tray stopper 96 (the lower side in FIGS. 20 and 21), and the second magnetic ring 126 is provided at a location closer to the tray stopper 96 (the upper side in FIGS. 20 and 21). The third magnetic ring 128 and the fourth magnetic ring 130 are sandwiched between the magnets 134 that make up the first magnetic ring 124 and the magnets 142 that make up the second magnetic ring 126, and are separated from each other, so they are far enough apart that the interaction between them is negligible.

Next, the third magnetic ring 128 and the fourth magnetic ring 130 will be described. First, the third magnetic ring 128 is magnetically coupled to the first magnetic ring 124 and rotates along with the rotation of the first magnetic ring 124. The third magnetic ring 128 comprises a ring-shaped member 148 and a specific number of magnets 150 attached to this ring-shaped member 148. This ring-shaped member 148 is attached to the tray stopper 96 via a bearing 152. This bearing 152 is fitted into a tray stopper portion 96b that is part of the tray stopper 96, and is in the form of a cylinder protruding in the direction of extension of the tray joint shaft 16. The bearing 152 is fixed to the tray stopper portion 96b by a bearing retainer 153. The magnets 150 are disposed in a plane perpendicular to the rotational axis 154 extending in the same direction as the tray joint shaft 16, and at a location on the ring-shaped member 148, equidistantly spaced away from this rotational axis 154. The magnets 150 do not necessarily have to be the same size, but it is important that they be disposed in a good balance so that the coupling forces of the magnetic rings will always be canceled out with respect to the rotational direction component. In terms of narrowing the dead region of these forces, it is actually preferable for the magnets to vary alternately in size. This rotational axis 154 is disposed at a location away from the straight line connecting the rotational axis 52 of the arm shaft 12 and the tray joint shaft 16 (line a in FIG. 19; the direction in which this line a extends corresponds to the direction of extension and retraction of the arm link).

The third magnetic ring 128 and the first magnetic ring 124 are in a state of partial overlap, and at this portion of overlap the magnets 150 that make up the third magnetic ring 128 are extremely close to the magnets 134 that make up the first magnetic ring 124, resulting in magnetic coupling. As shown in FIG. 20, the lower surfaces of the magnets 150 of the third magnetic ring 128 are opposite the upper surfaces of the magnets 134 of the first magnetic ring 124. Because this third magnetic ring 128 is provided at a location relatively remote from the tray stopper 96 (downward in FIG. 20), it is not magnetically coupled to the magnets 142 of the second magnetic ring 126.

Meanwhile, the fourth magnetic ring 130 is magnetically coupled to the second magnetic ring 126 and rotates along with the rotation of the second magnetic ring 126. This fourth magnetic ring 130 comprises a ring-shaped member 156 and a specific number of magnets 158 attached to this ring-shaped member 156. This ring-shaped member 156 is attached to the tray stopper 96 via a four-point-contact type of bearing 160. This bearing 160 is fitted into a tray stopper portion 96c that is part of the tray stopper 96, and is in the form of a cylinder protruding in the direction of extension of the tray joint shaft 16. The bearing 160 is fixed to the tray stopper portion 96c by a bearing retainer 161. The magnets 158 are disposed in a plane perpendicular to the rotational axis 162 extending in the same direction as the tray joint shaft 16, and at a location on the ring-shaped member 156, equidistantly spaced away from this rotational axis 162. This rotational axis 162 is disposed on the straight line connecting the rotational axis 52 of the arm shaft 12 and the tray joint shaft 16 (line a in FIG. 19), and on the side closer to the wafer placement tray 18 with respect to the tray joint shaft 16.

The fourth magnetic ring 130 and the second magnetic ring 126 are in a state of partial overlap, and at this portion of overlap the magnets 158 that make up the fourth magnetic ring 130 are extremely close to the magnets 142 that make up the second magnetic ring 126, resulting in magnetic coupling. As shown in FIG. 21, the upper surfaces of the magnets 158 of the fourth magnetic ring 130 are opposite the lower surfaces of the magnets 142 of the second magnetic ring 126. Because this fourth magnetic ring 130 is provided at a location relatively close to the tray stopper 96 (upward in FIG. 21), it is not magnetically coupled to the magnets 134 of the first magnetic ring 124.

The various installation locations of the third magnetic ring 128 and the fourth magnetic ring 130 are determined so that magnetic coupling will be produced therebetween. Let us at this point describe the dispositional relationship of the various magnetic rings through reference to FIG. 19. As described above, the rotational axis 162 of the fourth magnetic ring 130 is located on the straight line a connecting the rotational axis 52 of the arm shaft 12 and the tray joint shaft 16. Meanwhile, the rotational axis 154 of the third magnetic ring 128 is disposed at a location away from this line a. The rotational axis 52 is located closer to the wafer placement tray 18 than the tray joint shaft 16, and the rotational axis 154 is located between the rotational axis 162 and the tray joint shaft 16. The rotational axis 162, the tray joint shaft 16, and the rotational axis 154 are disposed such that they are located at the vertices of a regular triangle. In FIG. 19, the first magnetic ring 124 and the second magnetic ring 126 are provided at mutually overlapping locations. Also, the third magnetic ring 128 and the fourth magnetic ring 130 are configured such that they partially overlap, and magnetic coupling is produced between the third magnetic ring 128 and the fourth magnetic ring 130 in this overlap portion. As shown in FIGS. 20 and 21, in this overlap portion, the upper surfaces of the magnets 150 that make up the third magnetic ring 128 are opposite and extremely close to the lower surfaces of the magnets 158 that make up the fourth magnetic ring 130.

The rotational motion of the first magnetic ring 124 and the second magnetic ring 126 is controlled by the magnetic coupling produced between the third magnetic ring 128 and the fourth magnetic ring 130. As described above, the first magnetic ring 124 and the third magnetic ring 128 are linked in their rotational motion by magnetic coupling. The same applies for the second magnetic ring 126 and the fourth magnetic ring 130, with the rotational motion of these being linked by magnetic coupling. In other words, the third magnetic ring 128 rotates along with the first magnetic ring 124, and the fourth magnetic ring 130 rotates along with the second magnetic ring 126.

Also, since magnetic coupling is produced between the third magnetic ring 128 and the fourth magnetic ring 130, these are also linked in their rotational motion. Therefore, the first magnetic ring 124 and the second magnetic ring 126 are linked in their rotational motion.

Thus, the rotational motion of the first magnetic ring 124 and the second magnetic ring 126 is controlled by the magnetic coupling produced between the third magnetic ring 128 and the fourth magnetic ring 130. This control is performed so that the relative positions of the rotational axes of the third magnetic ring 128 and the fourth magnetic ring 130 will be kept constant with respect to the above-mentioned straight line a, that is, the line a that divides in two equal parts the angle δ between the first distal end arm 88 and the second distal end arm 90. Therefore, the orientation of the wafer placement tray 18 is kept constant with respect to the line a. In this structural example, the shift in the orientation of the wafer placement tray 18 caused by the rotation of the first distal end arm 88 and the second distal end arm 90 is compensated so that the rotational axis 162 of the fourth magnetic ring 130 will always be on the line a during the operation of the arm link. In order to obtain a structure such as this, the ring diameter of the various magnetic rings, the number of magnets, and the positions of the rotational axes of the magnetic rings should be suitably designed.

Figure 22A:
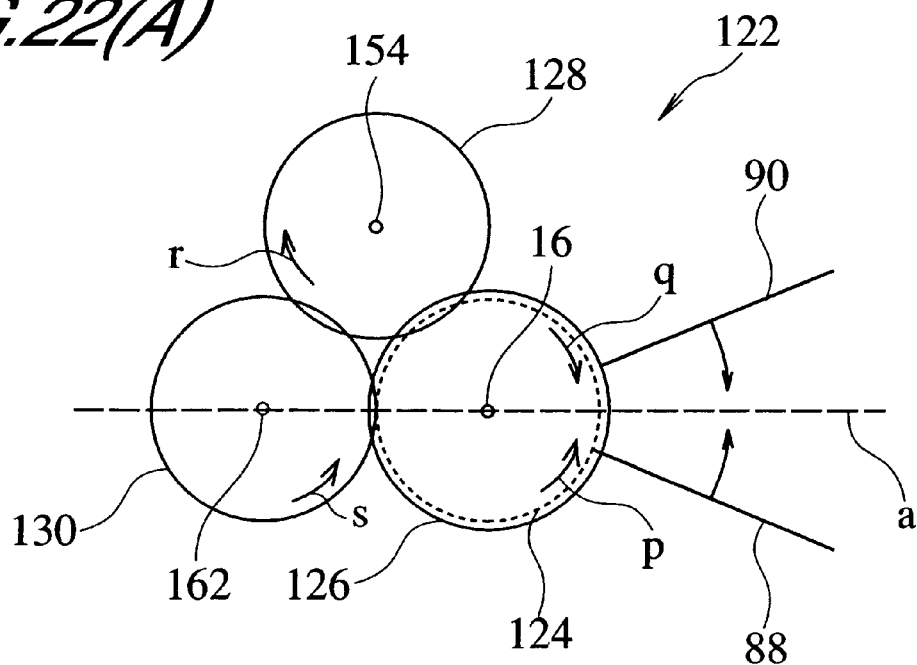
FIG. 22 (including FIGS. 22A and 22B) is a plan view used to describe the operation of the direction maintenance means.
Figure 22B:
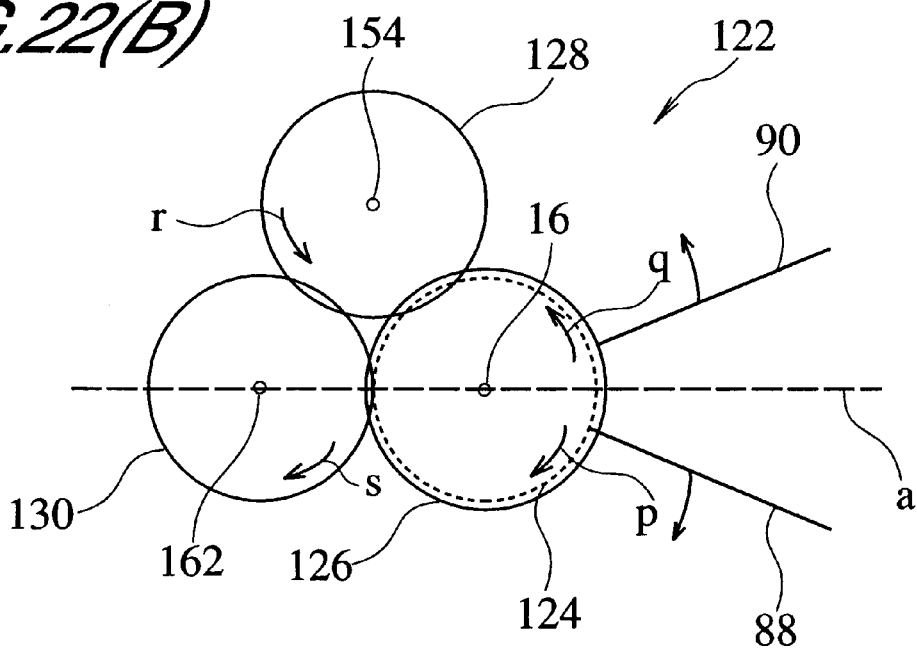

Next, the operation of the direction maintenance means 122 will be described through reference to FIG. 22. FIG. 22 is a plan view used to describe the operation of the direction maintenance means 122. FIG. 22A illustrates the arm link extended, and FIG. 22B illustrates the arm link retracted. In FIG. 22, the first distal end arm 88 and the second distal end arm 90 are indicated by bold lines. The arm joining members 138 and 146 and the tray stopper 96 are not depicted.

First, as shown in FIG. 22A, when the arm link extends, the first distal end arm 88 and the second distal end arm 90 rotate closer together. Therefore, the first distal end arm 88 rotates upward in FIG. 22, while the second distal end arm 90 rotates downward. Here, the first magnetic ring 124 coupled to the first distal end arm 88 rotates to the left in the figure (the direction of the arrow p). As a result, the third magnetic ring 128 coupled to the first magnetic ring 124 follows the rotational motion of the first magnetic ring 124 and rotates to the right in the figure (the direction of the arrow r).

Meanwhile, the second magnetic ring 126 coupled to the second distal end arm 90 rotates to the right in the figure (the direction of the arrow q). The fourth magnetic ring 130 coupled to the second magnetic ring 126 follows the rotational motion of the second magnetic ring 126 and rotates to the left in the figure (the direction of the arrow s).

Thus, the third magnetic ring 128 rotates to the right and the fourth magnetic ring 130 to the left. Since the third magnetic ring 128 and the fourth magnetic ring 130 are magnetically coupled to each other, their respective rotational motions are linked.

The effect of this linking of the rotational motion is easier to comprehend if we look at a case when the first distal end arm 88 and the second distal end arm 90 move independently of the arm shaft 12. Here, when the first distal end arm 88 begins to rotate and approach the straight line a (in this case, this line a is a straight line connecting the tray joint shaft 16 and the rotational axis 162), the first magnetic ring 124 rotates along with this movement. As a result, the third magnetic ring 128 magnetically coupled to the first magnetic ring 124 rotates, and the fourth magnetic ring 130 magnetically coupled to the third magnetic ring 128 also rotates. Since the second magnetic ring 126 is magnetically coupled to the fourth magnetic ring 130, the second magnetic ring 126 rotates along with this fourth magnetic ring 130, causing the second distal end arm 90 to rotate toward the line a. The distance (i.e. the rotating velocity) that the first distal end arm 88 rotates toward the line a and the distance (i.e. the rotating velocity) that the second distal end arm 90 rotates toward the line a are set to be equal by design of the magnetic ring diameter, the number of magnets, and so on. Thus, since the rotational motions of the first distal end arm 88 and the second distal end arm 90 are carried out symmetrically in relation to the line a, there is no change in the orientation of the wafer placement tray 18 with respect to the line a. Because of this structure, if we now look at a case when the first distal end arm 88 and the second distal end arm 90 are driven by the arm shaft 12, the wafer placement tray 18 moves along the line a and away from the arm shaft 12 while maintaining a constant orientation with respect to the line a.

The same applies to the retraction of the arm link. As shown in FIG. 22B, when the arm link retracts, the first distal end arm 88 and the second distal end arm 90 rotate away from each other. Therefore, the first distal end arm 88 rotates downward in FIG. 22, and the second distal end arm 90 rotates upward. Here, the first magnetic ring 124 coupled to the first distal end arm 88 rotates to the right in the figure (the direction of the arrow p). As a result, the third magnetic ring 128 magnetically coupled to the first magnetic ring 124 rotates to the left in the figure (the direction of the arrow r) along with the rotation of the first magnetic ring 124.

Meanwhile, the second magnetic ring 126 coupled to the second distal end arm 90 rotates to the left in the figure (the direction of the arrow q). The fourth magnetic ring 130 magnetically coupled to the second magnetic ring 126 rotates to the right in the figure (the direction of the arrow s) along with the rotation of the second magnetic ring 126.

Thus, the third magnetic ring 128 rotates to the left, while the fourth magnetic ring 130 rotates to the right. Since the third magnetic ring 128 and the fourth magnetic ring 130 are magnetically coupled to each other, their respective rotational motions are linked. As described above, when the arm link retracts, the wafer placement tray 18 moves along the line a and toward the arm shaft 12 while maintaining a constant orientation with respect to the line a.

As described above, the direction maintenance means 122 in this example makes use of magnetic coupling that acts in non-contact fashion, so there is no vibration and less dust is produced. Furthermore, because the construction is so simple, fewer parts are needed, the assembly precision reproducibility is better, and handling is easier.

Favorable examples of the magnets that make up the magnetic rings 124 to 130 include samarium cobalt and neodymium magnets. Also, it is good for the magnets to be arranged with alternately different magnetic poles, as with the magnetic couplers 32a and 32b that make up the arm shaft 12.

It is also favorable for three magnets to fit in the overlap portion where magnetic coupling is generated between the magnetic rings. To achieve this structure, it is favorable, for example, for each magnetic ring to consist of 26 magnets. This is just one example, however, and the material of the magnets, the number and size of the magnets, the ring diameter, and other such factors can be varied according to the design while still obtaining the effect of the present invention.

The direction maintenance means 122 in this structural example can also be used for the conventional arm link disclosed in Publications 2 and 3, and the resulting arm will have superior performance in terms of low dust generation.

The description here was of a single row of magnetic rings, but a plurality of rows of rings may also be used. Also, just as described for FIG. 5, the number of magnets used for the magnetic rings 124 and 128 and for the magnetic rings 126 and 130 can be increased or decreased by the same number so as to raise the rotational precision. For practical purposes, two fewer or two more are preferred.

SEVENTH EMBODIMENT

The structure of the jackknife extricator will now be described for the seventh embodiment through reference to FIG. 13. In order to extend the arm 14 when this arm 14 is stopped in its most retracted state, the first arm 84 and the second arm 86 must be rotated so that they move closer together. In this state, with a diamond-shaped link, the rotational moment is virtually canceled out, and only a very slight moment contributes to opening the arm. The arm 14 will not operate if the frictional force produced by the arm 14 overall is greater than the force produced by this rotational moment. This phenomenon is called jackknifing (see Publication 2, for example).

Therefore, a jackknife extricator 114 structured as shown in FIG. 13 is provided to the arm 14 in this structural example. The jackknife extricator 114 comprises four magnets 114a, 114b, 114c, and 114d. The magnet 114a is attached to the first arm 84. The magnet 114b is attached to the first distal end arm 88. The magnet 114c is attached to the second arm 86. And the magnet 114d is attached to the second distal end arm 90. The magnets 114a and 114b provided to the first arm 84 and the first distal end arm 88 have mutually different magnetic poles. Similarly, the magnets 114c and 114d provided to the second arm 86 and the second distal end arm 90 also have mutually different magnetic poles. These magnets 114a to 114d are provided such that as the tray joint shaft 16 and the arm shaft 12 draw closer, a repulsion force is generated between the first arm 84 and the first distal end arm 88 and between the second arm 86 and the second distal end arm 90.

Thus, when the arm 14 retracts, the first arm 84 and the first distal end arm 88 draw closer together, and a repulsion force is generated between the magnets 114a and 114b provided in the vicinity of the first joint shaft 92, which is the portion where these arms are coupled. Also, when the arm 14 retracts, the second arm 86 and the second distal end arm 90 draw closer together, and a repulsion force is generated between the magnets 114c and 114d provided in the vicinity of the second joint shaft 94, which is the portion where these arms are coupled. Thus, the generation of the repulsion force allows the static frictional force produced at the arm 14 to be canceled out. Therefore, the arm 14 operates with only the slight moment available at start-up. Furthermore, since this repulsion force rapidly becomes smaller as the arm 14 extends, it is ideal for applications such as this.

EIGHTH EMBODIMENT

An example using two of the arm links described above to constitute the wafer transport apparatus with a double arm link construction will now be described. FIG. 23 is a cross section illustrating the structure of a wafer transport apparatus with a double arm link construction. As shown in FIG. 23, arm links 10a and 10b which both have the same structure are installed in the arm chamber 20. Here, the arm shaft 12a that constitutes the arm link 10a is fixed via a vacuum sealed ring to a lower arm attachment base 48a attached to the lower inner surface of the arm chamber 20. The arm shaft 12b that constitutes the arm link 10b is fixed via a vacuum sealed ring to an upper arm attachment base 48b attached to the upper inner surface of the arm chamber 20. The arm shafts 12a and 12b are fixed in a state in which their axes accurately coincide. The cover portions of the second middle fixed shafts that constitute the arm shafts 12a and 12b are made to face each other and fixed with screws so that the operating surface of a lower arm 14a and the operating surface of an upper arm 14b are parallel to one another.

As described through reference to FIGS. 1 and 2, because the arm shafts 12a and 12b have a two-shaft coaxial construction, the double arm link construction shown in FIG. 23 becomes a four-shaft coaxial construction. Since the arms 14a and 14b each comprising four arms and four shafts are operated with the arm shafts 12a and 12b as the base points, the resulting link structure has extremely high rigidity, and wafer placement is carried out accurately at the desired location.

The arm links 10a and 10b are driven by drive units 115a and 115b, respectively. The drive unit 115a comprises two motors 116a and 116b. The drive unit 115b also comprises two motors 116c and 116d. The drive force of the motors 116a to 116d is transmitted to transmission belts 118a to 118d, respectively, via a speed reducer 120. It is good for the motors 116a to 116d to be equipped with a rotation position detection encoder. If so, the arm rotation control, extension and retraction start control, extension and retraction speed control, and stop position control can be carried out by a specific motor driver using signals from the above-mentioned encoder. Transmission belts were used in this example to transmit the drive force of the motors to the arm shafts, but other options are possible as well, and the first middle rotating shaft and second middle rotating shaft that make up the arm shafts may be configured for direct drive.

A brief description of the operation of a wafer transport apparatus with a double arm link construction will now be given. For instance, a wafer is transported from the outside into a load-lock chamber 22 through a gate valve 27. The transported wafer 28a is placed on a wafer holder 30 inside the load-lock chamber 22, whereupon a gate valve 26 on the arm chamber 20 side opens, and the arms 14a and 14b move into the load-lock chamber 22. The upper arm link 10b takes the wafer 28a that had been placed on the wafer holder 30 in the load-lock chamber 22 and puts it on a wafer placement tray 18b, and at the same time the lower arm link 10a takes another wafer 28b that had been placed on the wafer placement tray 18a and places it on the wafer holder 30 in the load-lock chamber 22. Since the upper and lower arm links 10a and 10b can thus move independently, the transfer of a wafer can be carried out instantaneously, which shortens the transport time and yields a marked improvement in throughput.

Also, the arm chamber 20 is sealed and rendered airtight by an arm chamber wall 20a, an arm chamber upper cover 20b, the lower arm shaft attachment base 48a, and the upper arm shaft attachment base 48b via a vacuum sealing ring. Therefore, the arm chamber upper cover 20b can be lifted off upward without affecting the arm links 10a and 10b at all. Because of this structure, maintenance of the chamber is easier.

As described above, with the multiple-shaft power transmission apparatus of the present invention, the magnetic coupling force used to transmit the power of the wafer transport arm link is increased by shortening the coupling distance, so a compact and lightweight power transmission shaft can be realized with a single shaft body. It is thus possible to achieve a wafer transport arm link that can be easily handled by human power even in the upcoming era of large-diameter (12 inch) wafers.

Also, with the wafer transport arm link of the present invention, the means for keeping constant the direction of the tray on which the wafers are placed is realized by a noc-contact mechanism that utilizes magnetic force, so a wafer transport arm that produces amazingly little dust can be realized.

Multiple robot arms are essential to improving throughput by reducing wafer transport time, and this can be easily realized by stacking wafer transport arm links of virtually the same construction.

What is claimed is:

1. A wafer transport arm link comprising:

a tray joint shaft;

first and second distal end arms rotatable parallel to each other around said tray joint shaft;

a wafer placement tray provided on said tray joint shaft; and first, second, third, and fourth magnetic rings in which a plurality of magnets are arranged in one or a plurality of ring shapes at an approximately equal angle pitch in relation to the respective axes;

wherein said first and second magnetic rings are each provided rotatably having said tray joint shaft as the rotational axis, and these first and second magnetic rings are coupled to said first and second distal end arms, respectively;

said third magnetic ring is magnetically coupled to said first magnetic ring and rotates along with the rotational motion of said first magnetic ring;

said fourth magnetic ring is magnetically coupled to said second magnetic ring and rotates along with the rotational motion of said second magnetic ring; and the rotational motion of said first and second magnetic rings is controlled by magnetic coupling produced between these third and fourth magnetic rings, the relative positions of the respective rotational axes of said third and fourth magnetic rings are kept constant with respect to a straight line that divides in two equal parts the angle between said first distal end arm and said second distal end arm, and the distance between the various rotational axes is equal.

2. A wafer transport arm link according to claim 1, further comprising:

a multiple-shaft power transmission apparatus;

a first arm coupled to said multiple-shaft power transmission apparatus;

a second arm coupled to said multiple-shaft power transmission apparatus;

a tray joint shaft;

first and second distal end arms rotatable parallel to each other around said tray joint shaft;

a wafer placement tray provided on said tray joint shaft;

a first joint shaft that rotatably couples the distal end of said first arm to the distal end of said first distal end arm; and a second joint shaft that rotatably couples the distal end of said second arm to the distal end of said second distal end arm, wherein magnets with mutually different poles are provided to said first arm and said first distal end arm, and magnets with mutually different poles are provided to said second arm and said second distal end arm;

further comprising a jackknife extricator that generates a repulsion force between said first arm and the first distal end arm and between said second arm and the second distal end arm as said tray joint shaft approaches said multiple-shaft power transmission apparatus.

3. A wafer transport arm link comprising:

a multiple-shaft power transmission apparatus;

a first arm coupled to said multiple-shaft power transmission apparatus;

a second arm coupled to said multiple-shaft power transmission apparatus;

a tray joint shaft;

first and second distal end arms rotatable parallel to each other around said tray joint shaft;

a wafer placement tray provided on said tray joint shaft;

a first joint shaft that rotatably couples the distal end of said first arm to the distal end of said first distal end arm;

a second joint shaft that rotatably couples the distal end of said second arm to the distal end of said second distal end arm; and direction maintenance means for guiding said tray joint shaft toward said multiple-shaft power transmission apparatus in a state in which said wafer placement tray is facing in the direction determined from the positional relationship between said tray joint shaft and said multiple-shaft power transmission apparatus, wherein magnets with mutually different poles are provided to said first arm and said first distal end arm, and magnets with mutually different poles are provided to said second arm and said second distal end arm; and further comprising a jackknife extricator that generates a repulsion force between said first arm and the first distal end arm and between said second arm and the second distal end arm as said tray joint shaft approaches said multiple-shaft power transmission apparatus.

* * * * *